United States Patent
Ha

(10) Patent No.: US 10,553,796 B2
(45) Date of Patent: Feb. 4, 2020

(54) ORGANIC LIGHT EMITTING DEVICE AND METHOD OF MANUFACTURING THE SAME

(71) Applicant: SAMSUNG DISPLAY CO., LTD., Yongin-si, Gyeonggi-do (KR)

(72) Inventor: Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 143 days.

(21) Appl. No.: 15/177,294

(22) Filed: Jun. 8, 2016

(65) Prior Publication Data
US 2017/0125682 A1    May 4, 2017

(30) Foreign Application Priority Data

Nov. 2, 2015 (KR) ................. 10-2015-0153260

(51) Int. Cl.
| | |
|---|---|
| C09K 11/02 | (2006.01) |
| C09K 11/06 | (2006.01) |
| H01L 51/00 | (2006.01) |
| H01L 51/50 | (2006.01) |
| H01L 51/56 | (2006.01) |

(52) U.S. Cl.
CPC ........ *H01L 51/0035* (2013.01); *C09K 11/025* (2013.01); *C09K 11/06* (2013.01); *H01L 51/0039* (2013.01); *H01L 51/0043* (2013.01); *H01L 51/0085* (2013.01); *C09K 2211/185* (2013.01); *H01L 51/001* (2013.01); *H01L 51/0026* (2013.01); *H01L 51/5064* (2013.01); *H01L 51/5072* (2013.01); *H01L 51/5092* (2013.01); *H01L 51/56* (2013.01); *H01L 2251/305* (2013.01)

(58) Field of Classification Search
CPC ............... H01L 51/006; H01L 51/0061; H01L 51/0057; H01L 51/5056
See application file for complete search history.

(56) References Cited

U.S. PATENT DOCUMENTS

| | | | |
|---|---|---|---|
| 5,747,182 A | 5/1998 | Friend et al. | |
| 8,076,009 B2 | 12/2011 | Begley et al. | |
| 9,472,770 B2 * | 10/2016 | Ha | H01L 51/0072 |
| 2008/0061685 A1 | 3/2008 | Chesterfield | |
| 2011/0315964 A1 * | 12/2011 | Eida | C07D 207/452 257/40 |
| 2012/0012790 A1 * | 1/2012 | Nazeeruddin | C09K 11/06 252/301.35 |

(Continued)

FOREIGN PATENT DOCUMENTS

| | | |
|---|---|---|
| CN | 102800816 A | 11/2012 |
| CN | 104860883 A | 8/2015 |

(Continued)

OTHER PUBLICATIONS

English-language abstract for JP-H0790255-A obtained from the European Patent Office Dec. 2018.*

(Continued)

*Primary Examiner* — Melissa A Rioja
(74) *Attorney, Agent, or Firm* — Lewis Roca Rothgerber Christie LLP

(57) ABSTRACT

An organic light-emitting device includes: a first electrode; a second electrode facing the first electrode; an emission layer between the first electrode and the second electrode; a hole transport region between the first electrode and the emission layer; and an electron transport region between the emission layer and the second electrode, the electron transport region including an electron auxiliary layer, wherein the hole transport region includes at least one copolymer selected from i) a first copolymer of a first compound and a second compound and ii) a second copolymer of a third compound and a fourth compound, wherein the first compound and the second compound are each independently selected from compounds represented by Formula 1, and the third compound and the fourth compound are each independently selected from compounds represented by Formula 2, and wherein the electron auxiliary layer includes a metal oxide.

Formula 1

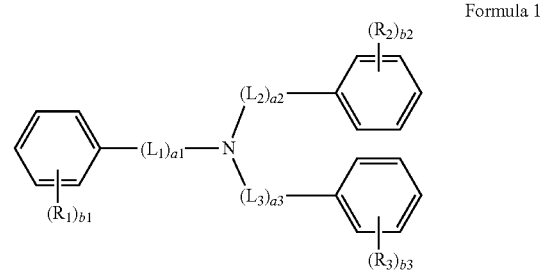

Formula 2

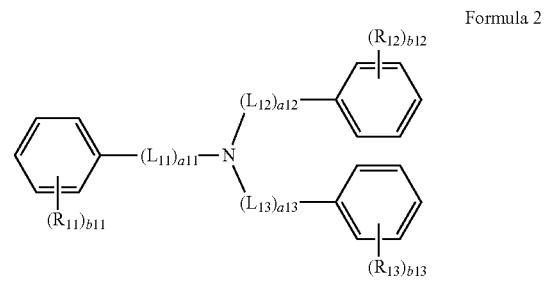

15 Claims, 1 Drawing Sheet

(56) References Cited

U.S. PATENT DOCUMENTS

| | | | | |
|---|---|---|---|---|
| 2012/0049177 A1* | 3/2012 | Chesterfield | ........ | H01L 51/0035 257/40 |
| 2014/0326986 A1 | 11/2014 | Zhou et al. | | |
| 2015/0243895 A1 | 8/2015 | Lim et al. | | |
| 2015/0362855 A1* | 12/2015 | Mizuno | .................. | G03G 15/04 345/156 |

FOREIGN PATENT DOCUMENTS

| | | | |
|---|---|---|---|
| GB | 2334959 A | * | 9/1999 |
| JP | H0790255 A | * | 4/1995 |
| JP | 2005-93135 A | | 4/2005 |
| JP | 2015-502049 A | | 1/2015 |
| KR | 10-0299657 B1 | | 10/2001 |
| KR | 2003-0017095 A | | 3/2003 |
| KR | 10-0721952 B1 | | 5/2007 |
| KR | 10-2008-0018834 A | | 2/2008 |
| KR | 10-2011-0090566 A | | 8/2011 |
| KR | 10-2014-0069568 A | | 6/2014 |

OTHER PUBLICATIONS

Machine translation for JP-H0790255-A obtained from the European Patent Office Dec. 2018.*

* cited by examiner

10

| 190 |
|---|
| 170 |
| 150 |
| 130 |
| 110 |

ORGANIC LIGHT EMITTING DEVICE AND METHOD OF MANUFACTURING THE SAME

CROSS-REFERENCE TO RELATED APPLICATION

This application claims priority to and the benefit of Korean Patent Application No. 10-2015-0153260, filed on Nov. 2, 2015, in the Korean Intellectual Property Office, the entire content of which is incorporated herein by reference.

BACKGROUND

1. Field

One or more aspects of embodiments of the present disclosure relate to an organic light-emitting device and a method of manufacturing the same.

2. Description of the Related Art

Organic light-emitting devices (OLEDs) are self-emission devices that have wide viewing angles, high contrast ratios, and short response times. In addition, the OLEDs exhibit high luminance, low driving voltage, and fast response speed characteristics, and can produce full-color images.

An OLED may include a first electrode disposed (e.g., positioned) on a substrate, and a hole transport region, an emission layer, an electron transport region, and a second electrode, which are sequentially disposed on the first electrode. Holes provided from the first electrode, for example, may move toward the emission layer through the hole transport region, and electrons provided from the second electrode, for example, may move toward the emission layer through the electron transport region. Carriers, such as holes and electrons, may then recombine in the emission layer to produce excitons. These excitons change from an excited state to a ground state to thereby generate light.

SUMMARY

One or more aspects of embodiments of the present disclosure are directed toward an organic light-emitting device having high efficiency and long lifespan.

Additional embodiments will be set forth in part in the description which follows and, in part, will be apparent from the description, or may be learned by practice of the presented embodiments.

According to one or more embodiments, an organic light-emitting device includes:

a first electrode;

a second electrode facing the first electrode;

an emission layer between the first electrode and the second electrode;

a hole transport region between the first electrode and the emission layer; and an electron transport region between the emission layer and the second electrode, the electron transport region including an electron auxiliary layer, wherein the hole transport region includes at least one copolymer selected from a first copolymer of a first compound and a second compound and a second copolymer of a third compound and a fourth compound, the first compound and the second compound are each independently selected from compounds represented by Formula 1, the third compound and the fourth compound are each independently selected from compounds represented by Formula 2, and the electron auxiliary layer includes a metal oxide:

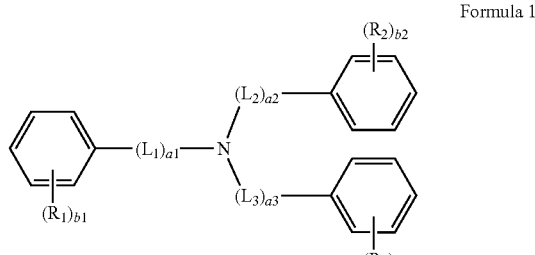

Formula 1

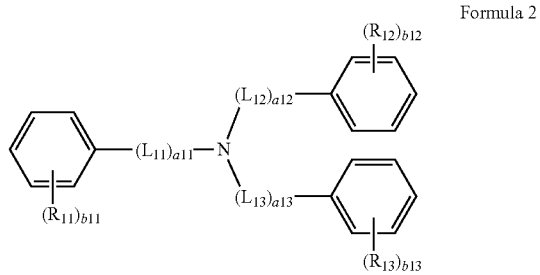

Formula 2

Formula A

Formula B

Formula C

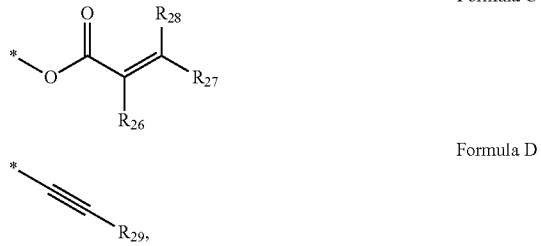

Formula D wherein, in Formulae 1, 2, and A to D, $L_1$ to $L_3$ and $L_{11}$ to $L_{13}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a3 and a11 to a13 are each independently an integer selected from 0 to 3;

$R_1$ to $R_3$, $R_{11}$ to $R_{13}$, and $R_{21}$ to $R_{29}$ are each independently selected from groups represented by any of Formulae A to D, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

b1 to b3 and b11 to b13 are each independently an integer selected from 1 to 5, wherein when b1 is 2 or more, a plurality of $R_1$(s) are optionally linked to form a saturated or unsaturated ring, when b2 is 2 or more, a plurality of $R_2$(s) are optionally linked to form a saturated or unsaturated ring, and when b3 is 2 or more, a plurality of $R_3$(s) are optionally linked to form a saturated or unsaturated ring, and when b11 is 2 or more, a plurality of $R_{11}$(s) are optionally linked to form a saturated or unsaturated ring, when b12 is 2 or more, a plurality of $R_{12}$(s) are optionally linked to form a saturated or unsaturated ring, and when b13 is 2 or more, a plurality of $R_{13}$(s) are optionally linked to form a saturated or unsaturated ring;

at least one selected from $R_1$ to $R_3$ is a group represented by Formula A;

at least one selected from $R_{11}$ to $R_{13}$ is a group represented by one of Formulae B to D; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$), and —Si($Q_{31}$)($Q_{32}$)($Q_{33}$), —N($Q_{34}$)($Q_{35}$) and —B($Q_{36}$)($Q_{37}$), wherein $Q_1$ to $Q_3$, $Q_{11}$ to $Q_{17}$, $Q_{21}$ to $Q_{27}$, and $Q_{31}$ to $Q_{37}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

According to one or more embodiments, a method of manufacturing an organic light-emitting device includes:

preparing a substrate;

forming a first electrode over the substrate;

forming a hole transport region compound over the first electrode, the hole transport region compound including at least one copolymer selected from a first copolymer of a first compound and a second compound and a second copolymer of a third compound and a fourth compound, wherein the first compound and the second compound are each independently selected from compounds represented by Formula 1, and the third compound and the fourth compound are each independently selected from compounds represented by Formula 2;

forming an emission layer over the hole transport region;

forming an electron transport region over the emission layer, the electron transport region including an electron auxiliary layer including a metal oxide; and forming a second electrode over the electron transport region.

BRIEF DESCRIPTION OF THE DRAWING

These and/or other aspects will become apparent and more readily appreciated from the following description of the embodiments, taken in conjunction with the accompanying drawing, which is a schematic view of an organic light-emitting device according to an embodiment of the present disclosure.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

An organic light-emitting device according to an embodiment of the present disclosure may include a first electrode, a second electrode facing the first electrode, an emission layer between the first electrode and the second electrode, a hole transport region between the first electrode and the emission layer, and an electron transport region between the emission layer and the second electrode, wherein the electron transport region may include an electron auxiliary layer.

The first electrode may be an anode. The second electrode may be a cathode. Descriptions of the first electrode and the second electrode may be understood by referring to the descriptions thereof provided herein.

The hole transport region may include at least one copolymer selected from a first copolymer of a first compound and a second compound and a second copolymer of a third compound and a fourth compound, where the first compound and the second compound may be each independently selected from compounds represented by Formula 1, and the third compound and the fourth compound may be each independently selected from compounds represented by Formula 2:

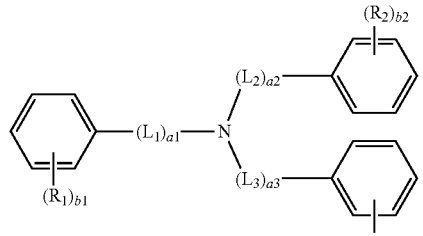

Formula 1

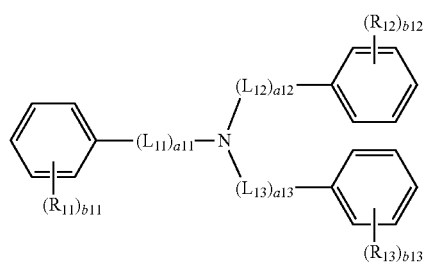

Formula 2

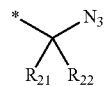

Formula A

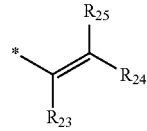

Formula B

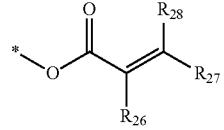

Formula C

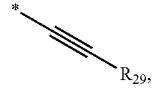

Formula D

In Formulae 1, 2, and A to D, $L_1$ to $L_3$ and $L_{11}$ to $L_{13}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, $L_1$ to $L_3$ and $L_{11}$ to $L_{13}$ may be each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an indolylene group, an isoindolylene group, a benzofuranylene group, a benzothiophenylene group, a benzosilolylene group, a carbazolylene group, a dibenzofuranylene group, a dibenzothiophenylene group, a dibenzosilolylene group, a benzocarbazolylene group, and a dibenzocarbazolylene group, and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an indolylene group, an isoindolylene group, a benzofuranylene group, a benzothiophenylene group, a benzosilolylene group, a carbazolylene group, a dibenzofuranylene group, a dibenzothiophenylene group, a dibenzosilolylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an indolyl group, an isoindolyl group, a benzofuranyl group, a benzothiophenyl group, a benzosilolyl group, a carbazolyl group, a dibenzofuranyl group, a dibenzothiophenyl group, a dibenzosilolyl group, a benzocarbazolyl group, a dibenzocarbazolyl group, a biphenyl group, a terphenyl group, and —Si($Q_{31}$)($Q_{32}$)($Q_{33}$), wherein $Q_{31}$ to $Q_{33}$ may be each independently selected from a $C_1$-$C_{10}$ alkyl group, a $C_1$-$C_{10}$ alkoxy group, a phenyl group, a pentalenyl group, indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an indolyl group, an isoindolyl group, a benzofuranyl group, a benzothiophenyl group, a benzosilolyl group, a carbazolyl group, a dibenzofuranyl group, a dibenzothiophenyl group, a dibenzosilolyl group, a benzocarbazolyl group, a dibenzocarbazolyl group, a biphenyl group, and a terphenyl group.

According to an embodiment, $L_1$ to $L_3$ and $L_{11}$ to $L_{13}$ may be each independently selected from groups represented by Formulae 3-1 to 3-41, but embodiments are not limited thereto:

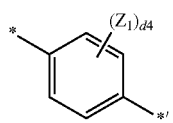

Formula 3-1

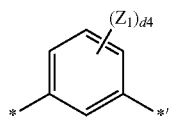

Formula 3-2

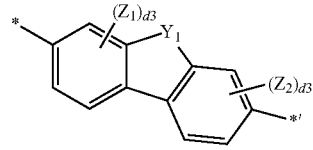

Formula 3-3

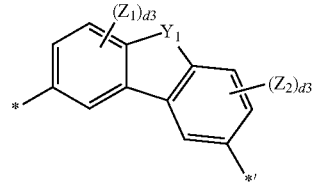

Formula 3-4

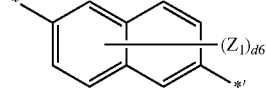

Formula 3-5

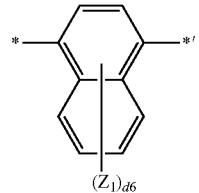

Formula 3-6

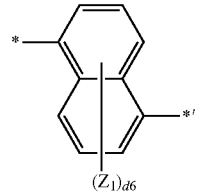

Formula 3-7

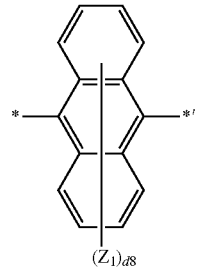

Formula 3-8

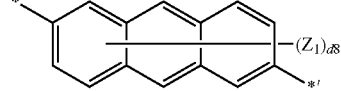

Formula 3-9

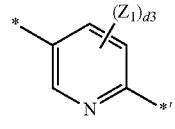

Formula 3-10

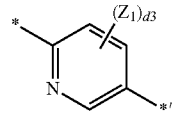

Formula 3-11

-continued
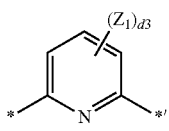
Formula 3-12
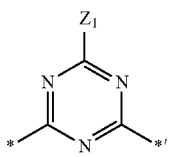
Formula 3-24
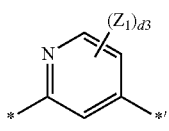
Formula 3-13
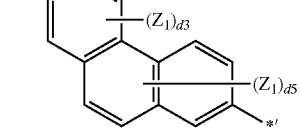
Formula 3-25
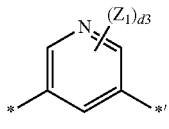
Formula 3-14
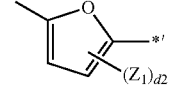
Formula 3-26
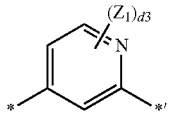
Formula 3-15
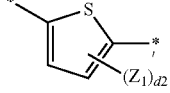
Formula 3-27
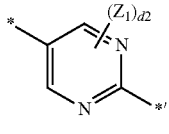
Formula 3-16
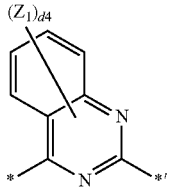
Formula 3-28
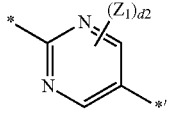
Formula 3-17
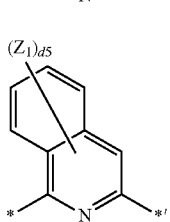
Formula 3-29
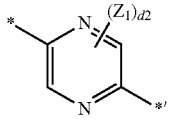
Formula 3-18
Formula 3-19
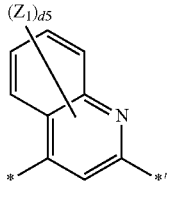
Formula 3-30
Formula 3-20
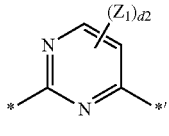
Formula 3-21
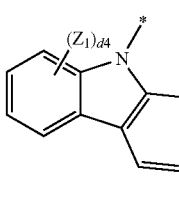
Formula 3-31
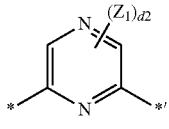
Formula 3-22
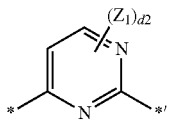
Formula 3-23
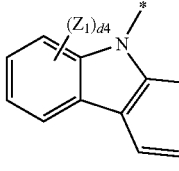
Formula 3-32
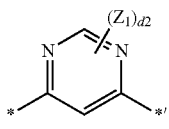

-continued

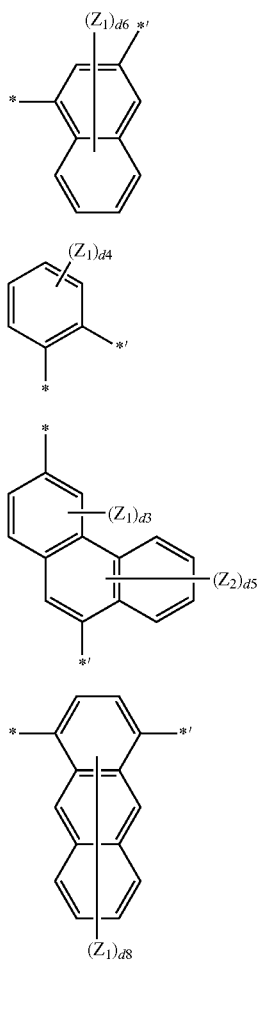

Formula 3-33

Formula 3-34

Formula 3-35

Formula 3-36

Formula 3-37

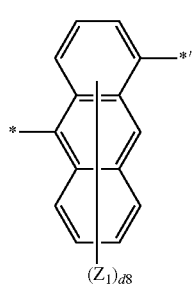

Formula 3-38

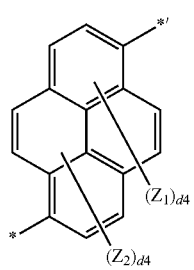

-continued

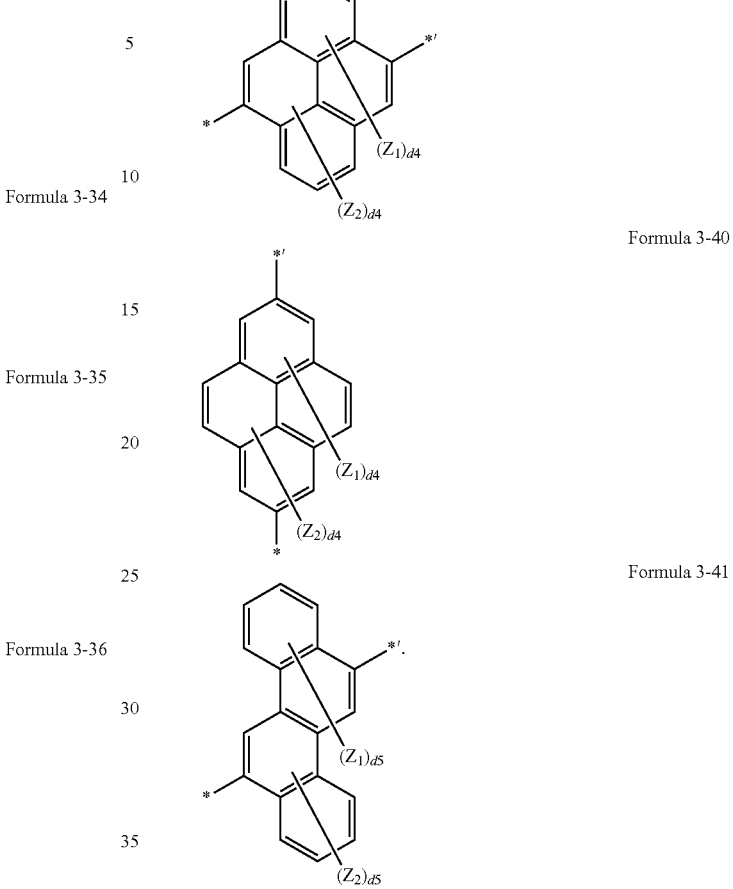

Formula 3-39

Formula 3-40

Formula 3-41

In Formulae 3-1 to 3-41, $Y_1$ may be selected from O, S, $C(Z_3)(Z_4)$, $N(Z_5)$, and $Si(Z_6)(Z_7)$;

$Z_1$ to $Z_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a pyrrolyl group, a furanyl group, a thiophenyl group, an indolyl group, an isoindolyl group, a benzofuranyl group, a benzothiophenyl group, a carbazolyl group, a dibenzofuranyl group, a dibenzothiophenyl group, a benzocarbazolyl group, a dibenzosilolyl group, a biphenyl group, a terphenyl group, and —$Si(Q_{31})(Q_{32})(Q_{33})$, wherein $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a pyrrolyl group, a furanyl group, a thiophenyl group, an indolyl group, an isoindolyl group, a benzofuranyl group, a benzothiophenyl group, a carbazolyl group, a dibenzofuranyl group, a dibenzothiophenyl group, a benzocarbazolyl group, a dibenzosilolyl group, a biphenyl group, and a terphenyl group;

d2 may be an integer selected from 1 and 2;
d3 may be an integer selected from 1 to 3;
d4 may be an integer selected from 1 to 4;
d5 may be an integer selected from 1 to 5;
d6 may be an integer selected from 1 to 6;
d8 may be an integer selected from 1 to 8; and
* and *' may each indicate a binding site to an adjacent atom.

According to another embodiment, $L_1$ to $L_3$ and $L_{11}$ to $L_{13}$ may be each independently selected from groups represented by Formulae 4-1 to 4-35, but embodiments are not limited thereto:

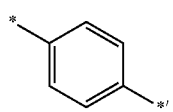

Formula 4-1

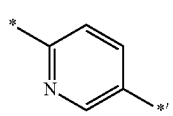

Formula 4-2

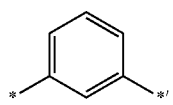

Formula 4-3

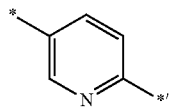

Formula 4-4

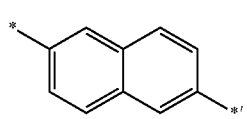

Formula 4-5

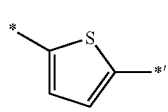

Formula 4-6

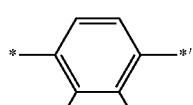

Formula 4-7

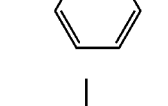

Formula 4-8

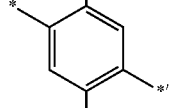

Formula 4-9

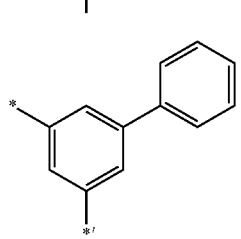

Formula 4-10

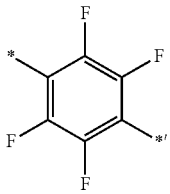

Formula 4-11

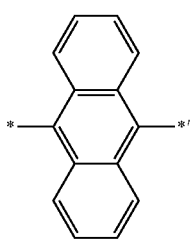

Formula 4-12

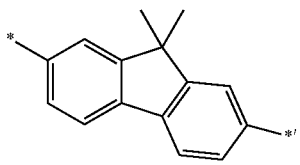

Formula 4-13

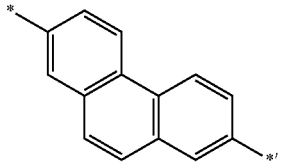

Formula 4-14

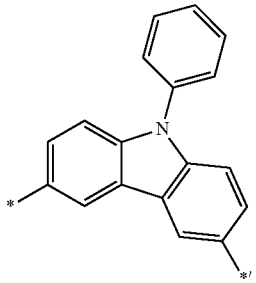

Formula 4-15

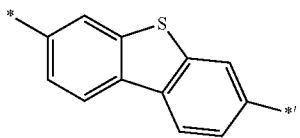

Formula 4-16

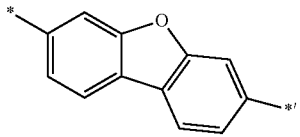

Formula 4-17

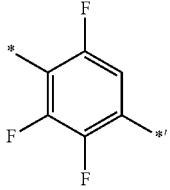

-continued
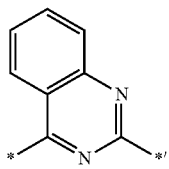
Formula 4-18
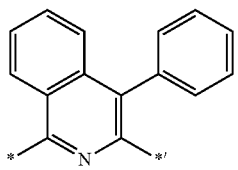
Formula 4-19
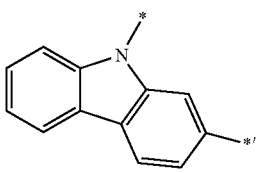
Formula 4-20
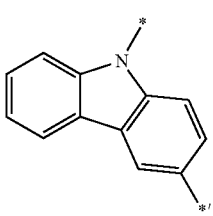
Formula 4-21
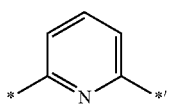
Formula 4-22
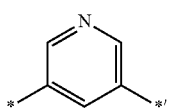
Formula 4-23
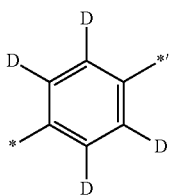
Formula 4-24
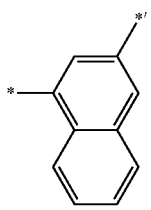
Formula 4-25
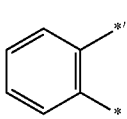
Formula 4-26
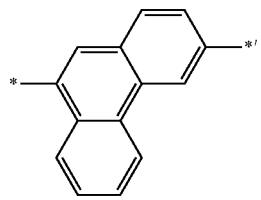
Formula 4-27
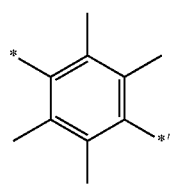
Formula 4-28
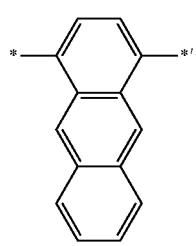
Formula 4-29
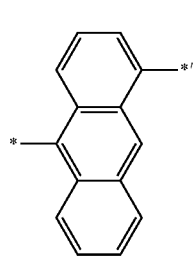
Formula 4-30
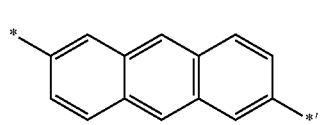
Formula 4-31
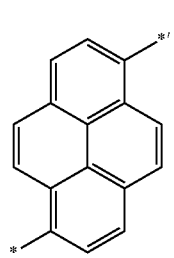
Formula 4-32
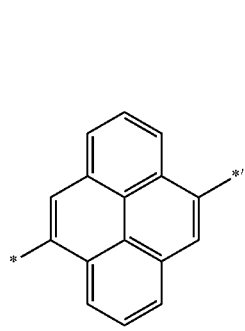
Formula 4-33

-continued

Formula 4-34

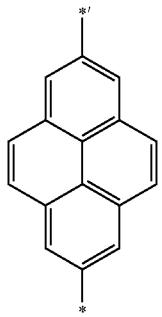

Formula 4-35

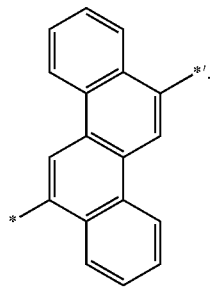

In Formulae 4-1 to 4-35, * and *' each indicate a binding site to an adjacent atom, and "D" may refer to deuterium.

a1 to a3 and a11 to a13 may be each independently an integer selected from 0 to 3. a1 in Formula 1 indicates the number of $L_1$. When a1 is 2 or more, a plurality of $L_1(s)$ may be identical to or different from each other. For example, when a1 is 0, *-$(L_1)_{a1}$-*' may be a single bond. Descriptions of a2, a3 and a11 to a13 may be each independently understood by referring to the description for a1 and the corresponding structures of Formulae 1 and 2.

According to an embodiment, a1 to a3 and a11 to a13 may be each independently 0 or 1, but embodiments are not limited thereto.

In Formulae 1, 2 and A to D, $R_1$ to $R_3$, $R_{11}$ to $R_{13}$, and $R_{21}$ to $R_{29}$ may be each independently selected from groups represented by Formulae A to D, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$).

In some embodiments, $R_1$ to $R_3$, $R_{11}$ to $R_{13}$, and $R_{21}$ to $R_{29}$ may be each independently selected from the group consisting of:

groups represented by Formulae A to D, hydrogen, deuterium, —F, —Cl, —Br, —I, a hydroxyl group, a cyano group, a nitro group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazoiyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a biphenyl group, a terphenyl group, and $—Si(Q_{31})(Q_{32})(Q_{33})$, wherein $Q_{31}$ to $Q_{33}$ may be each independently selected from a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a biphenyl group, and a terphenyl group, but embodiments of the present disclosure are not limited thereto.

According to an embodiment, $R_1$ to $R_3$, $R_{11}$ to $R_{13}$, and $R_{21}$ to $R_{29}$ may be each independently selected from groups represented by Formulae A to D and groups represented by Formulae 5-1 to 5-79, but embodiments are not limited thereto:

Formula 5-1
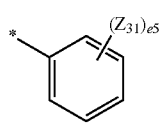

Formula 5-2
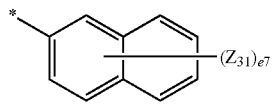

Formula 5-3
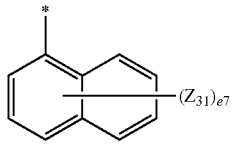

Formula 5-4
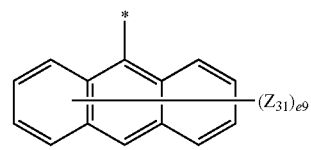

Formula 5-5
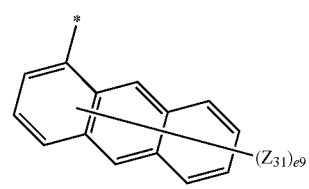

Formula 5-6
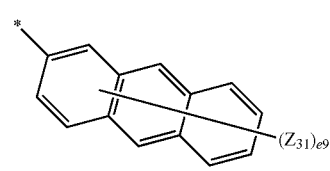

Formula 5-7
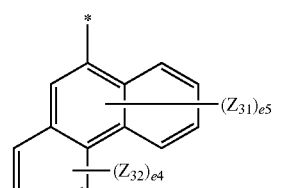

Formula 5-8
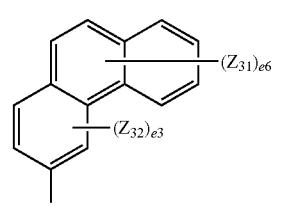

Formula 5-9
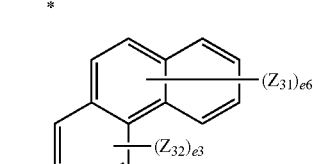

Formula 5-10
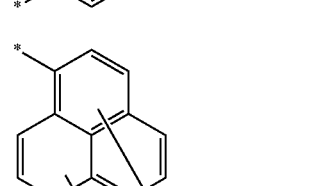

Formula 5-11
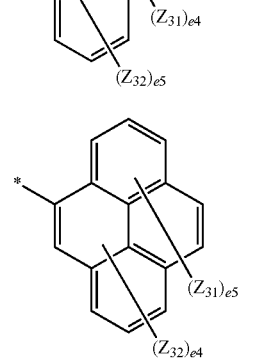

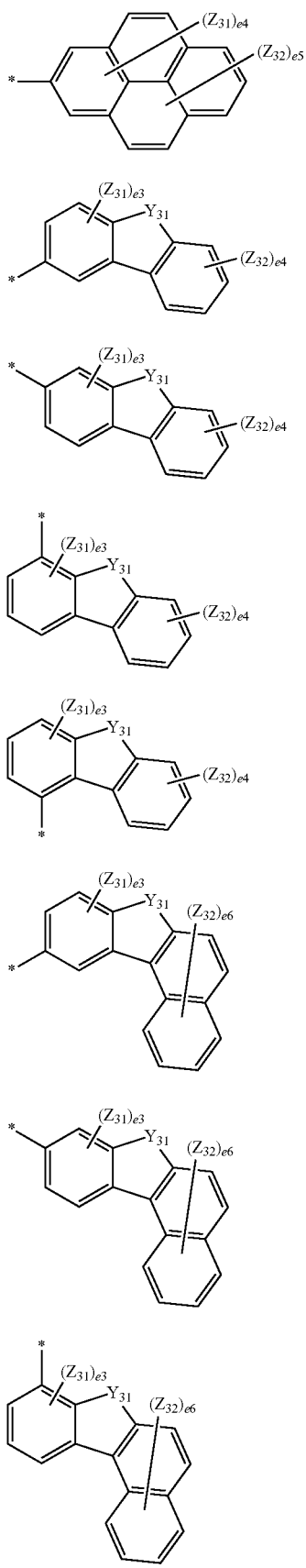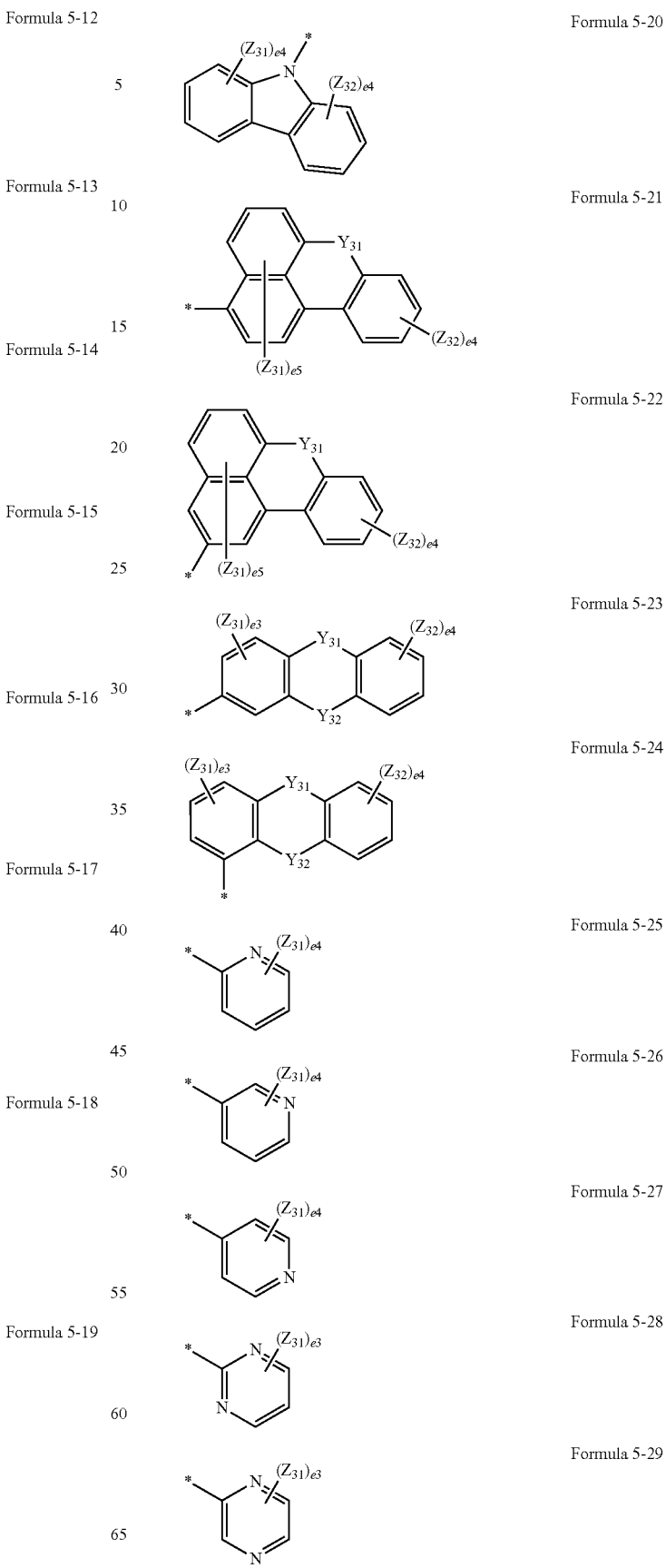

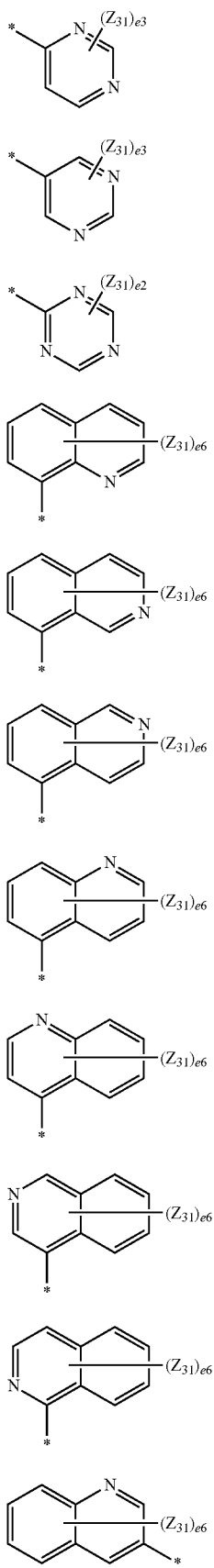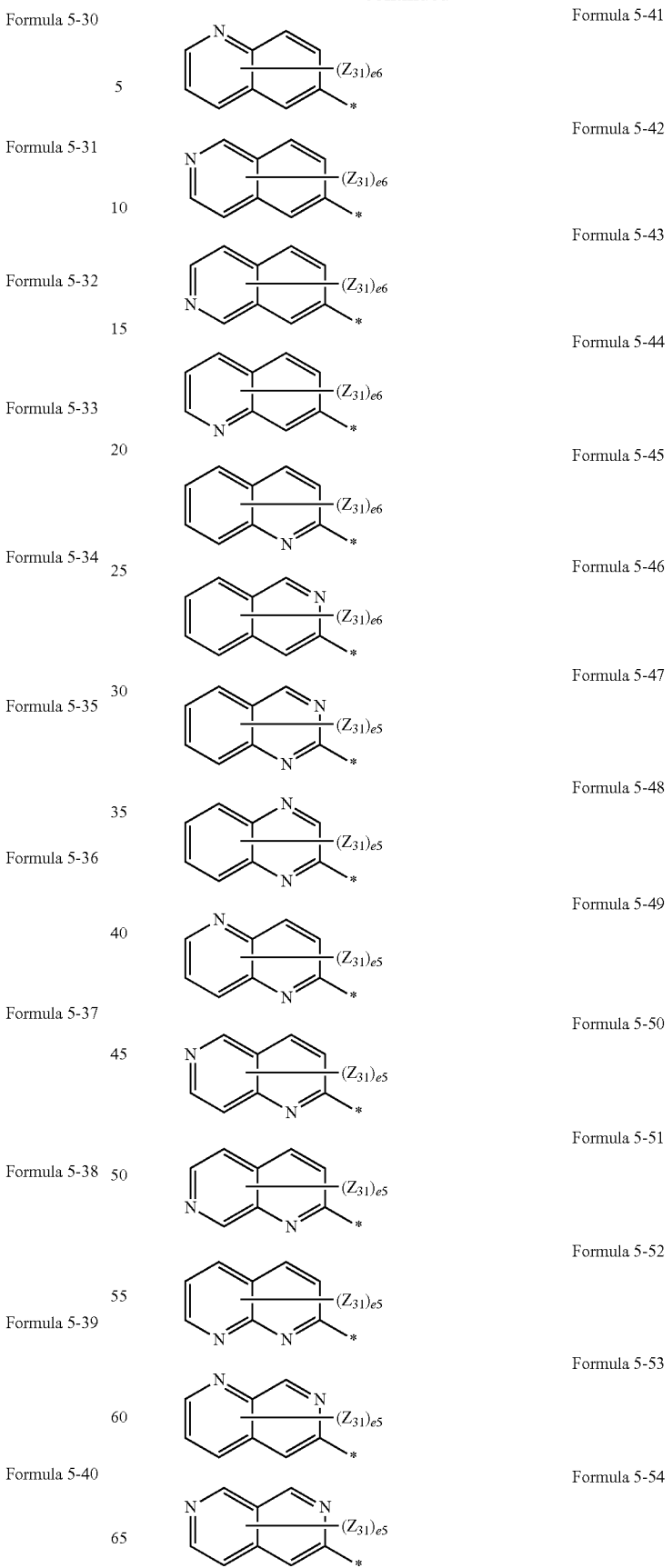

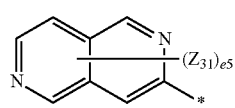 Formula 5-55
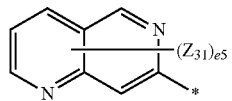 Formula 5-56
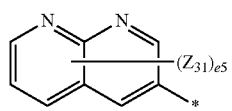 Formula 5-57
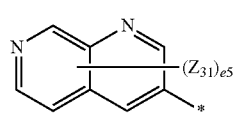 Formula 5-58
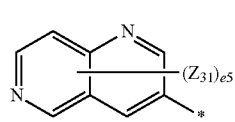 Formula 5-59
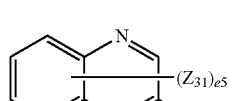 Formula 5-60
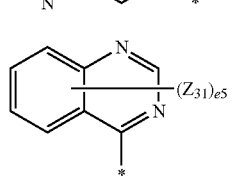 Formula 5-61
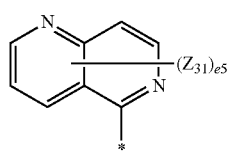 Formula 5-62
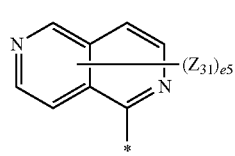 Formula 5-63
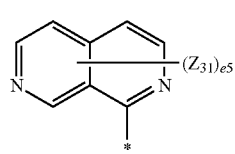 Formula 5-64
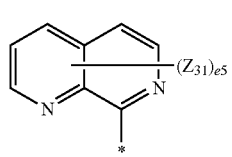 Formula 5-65
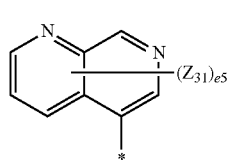 Formula 5-66
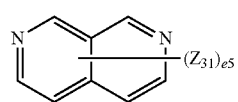 Formula 5-67
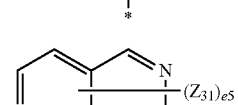 Formula 5-68
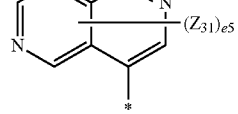 Formula 5-69
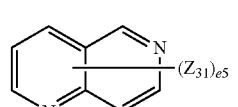 Formula 5-70
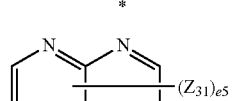 Formula 5-71
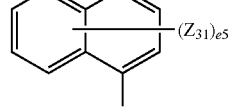 Formula 5-72
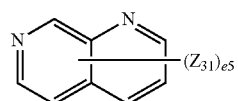 Formula 5-73
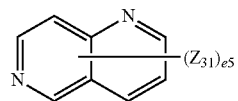 Formula 5-74
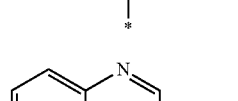 Formula 5-75
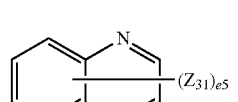 Formula 5-76
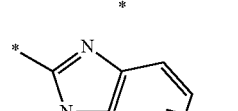 Formula 5-77
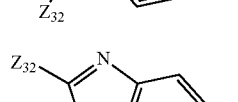

-continued

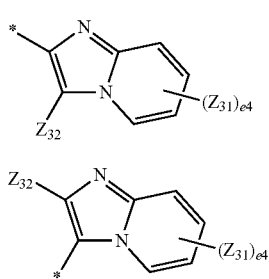

Formula 5-78

Formula 5-79

In Formulae 5-1 to 5-79, $Y_{31}$ and $Y_{32}$ may be each independently selected from O, S, $C(Z_{33})(Z_{34})$, $N(Z_{35})$, and $Si(Z_{36})(Z_{37})$; and $Z_{31}$ to $Z_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and —$Si(Q_{33})(Q_{34})(Q_{35})$, wherein $Q_{33}$ to $Q_{35}$ may be each independently selected from a $C_1$-$C_{10}$ alkyl group, a $C_1$-$C_{10}$ alkoxy group, a phenyl group, a biphenyl group, a terphenyl group, and a naphthyl group;

e2 may be an integer selected from 1 and 2;
e3 may be an integer selected from 1 to 3;
e4 may be an integer selected from 1 to 4;
e5 may be an integer selected from 1 to 5;
e6 may be an integer selected from 1 to 6;
e7 may be an integer selected from 1 to 7;
e9 may be an integer selected from 1 to 9; and
\* indicates a binding site to a neighboring atom.

According to another embodiment, $R_1$ to $R_3$, $R_{11}$ to $R_{13}$, and $R_{21}$ to $R_{29}$ may be each independently selected from groups represented by Formulae A to D and groups represented by Formulae 6-1 to Formula 6-44:

Formula 6-1

Formula 6-2

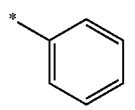

Formula 6-3

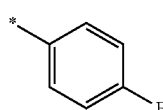

Formula 6-4

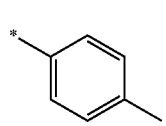

Formula 6-5

Formula 6-6

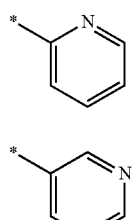

Formula 6-7

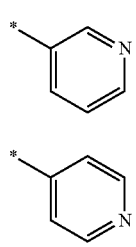

Formula 6-8

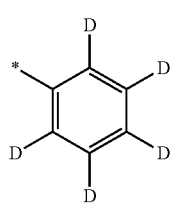

Formula 6-9

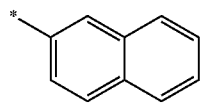

Formula 6-10

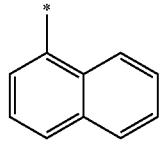

Formula 6-11

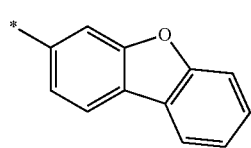

Formula 6-12

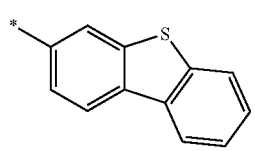

Formula 6-13

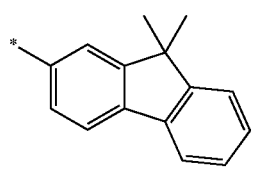

-continued
Formula 6-14
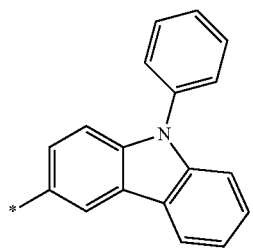
Formula 6-15
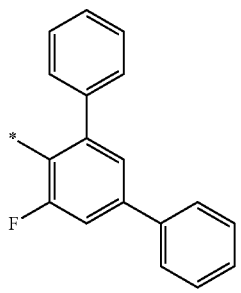
Formula 6-16
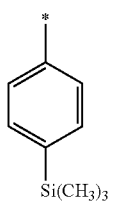
Formula 6-17
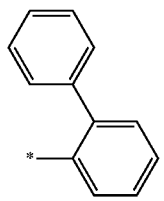
Formula 6-18
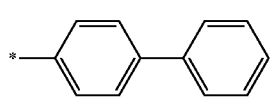
Formula 6-19
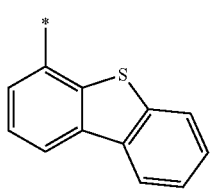
Formula 6-20
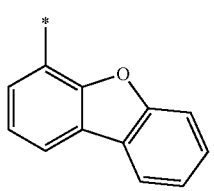
-continued
Formula 6-21
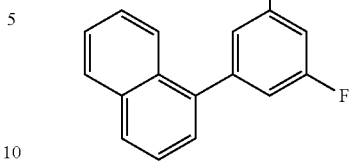
Formula 6-22
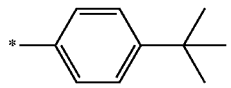
Formula 6-23
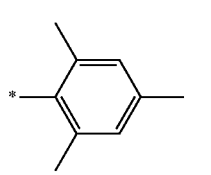
Formula 6-24
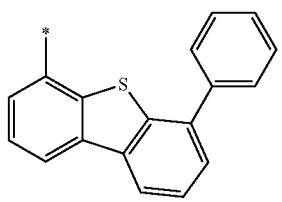
Formula 6-25
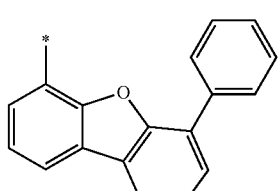
Formula 6-26
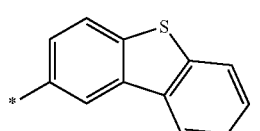
Formula 6-27
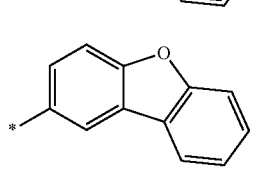
Formula 6-28
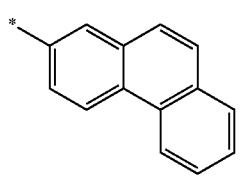
Formula 6-29

-continued

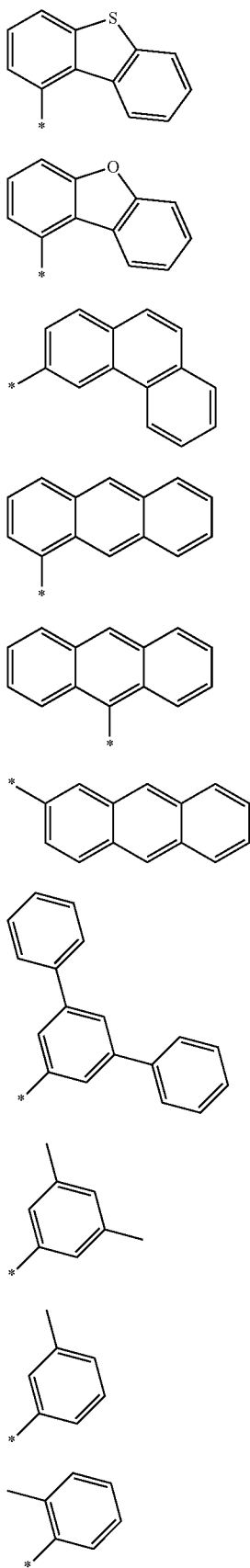

Formula 6-30

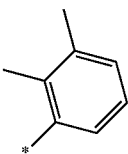

Formula 6-31

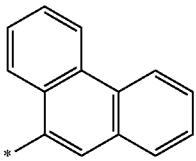

Formula 6-32

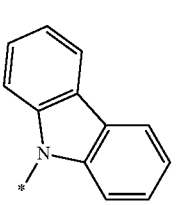

Formula 6-33

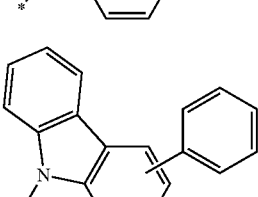

Formula 6-34

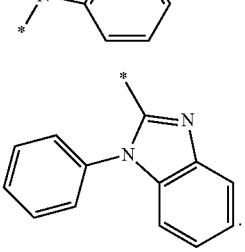

Formula 6-35

Formula 6-36

Formula 6-37

Formula 6-38

Formula 6-39

Formula 6-40

Formula 6-41

Formula 6-42

Formula 6-43

Formula 6-44

In Formulae 6-1 to 6-44, * indicates a binding site to an adjacent atom, and "D" may refer to deuterium.

In Formulae 1 and 2, b1 to b3 and b11 to b13 may be each independently an integer selected from 1 to 5. b1 in Formula 1 indicates the number of $R_1$. When b1 is 2 or more, a plurality of $R_1$(s) may be identical to or different from each other. Descriptions of b2, b3 and b11 to b13 may be each independently understood by referring to the description for b1 and the corresponding structures of Formulae 1 and 2.

According to an embodiment, b1 to b3 and b11 to b13 may be each independently 1 or 2.

When b1 is 2 or more, a plurality of $R_1$(s) may be optionally linked to form a saturated or unsaturated ring; when b2 is 2 or more, a plurality of $R_2$(s) may be optionally linked to form a saturated or unsaturated ring; when b3 is 2 or more, a plurality of $R_3$(s) may be optionally linked to form a saturated or unsaturated ring; when b11 is 2 or more, a plurality of $R_{11}$(s) may be optionally linked to form a saturated or unsaturated ring; when b12 is 2 or more, a plurality of $R_{12}$(s) may be optionally linked to form a saturated or unsaturated ring; and when b13 is 2 or more, a plurality of $R_{13}$(s) may be optionally linked to form a saturated or unsaturated ring.

At least one selected from $R_1$ to $R_3$ may be a group represented by Formula A, and at least one selected from $R_{11}$ to $R_{13}$ may be a group represented by one of Formulae B to D. According to an embodiment, one selected from $R_1$ to $R_3$ may be a group represented by Formula A, and one selected from $R_{11}$ to $R_{13}$ may be a group represented by one of Formulae B to D.

The first compound and the second compound may each be a photocurable monomer, which may include a photocurable functional group represented by Formula A in its molecular structure. For example, since the first compound and the second compound include a photocurable functional group in its molecular structure, when a composition including the first compound and the second compound is exposed to light, the first compound and the second compound may be cross-linked. The cross-linked first and second compounds may form a first copolymer.

The third compound and the fourth compound may each be a thermosetting monomer, which may include a thermosetting functional group represented by one of Formulae B to D in its molecular structure. In some embodiments, since the third compound and the fourth compound include a thermosetting functional group in its molecular structure, when a composition including the third compound and the fourth compound is heat-treated, the third compound and the fourth compound may be cross-linked. The cross-linked third and fourth compounds may form a second copolymer.

In some embodiments, the first compound and the second compound may be each independently represented by one of Formulae 1A to 1E, and the third compound and the fourth compound may be each independently represented by one of Formulae 2A to 2E:

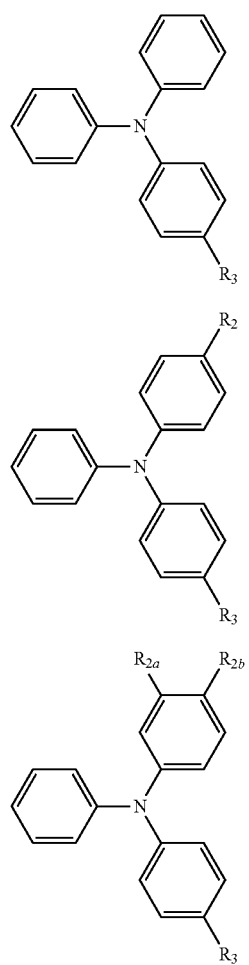

Formula 1A

Formula 1B

Formula 1C

Formula 1D

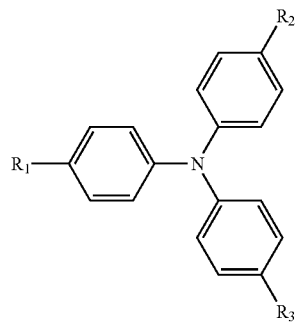

Formula 1E

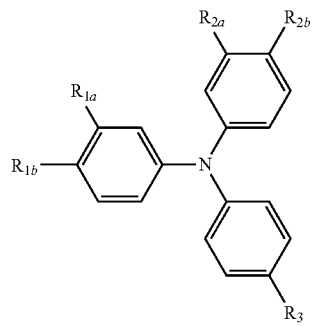

Formula 2A

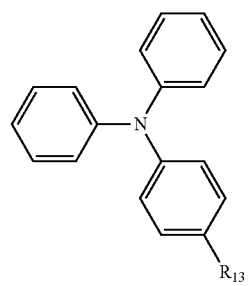

Formula 2B

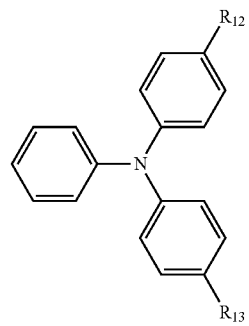

Formula 2C

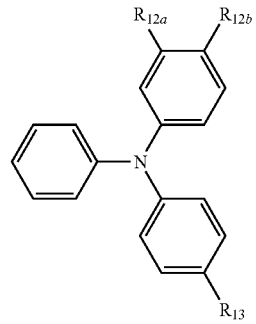

Formula 2D

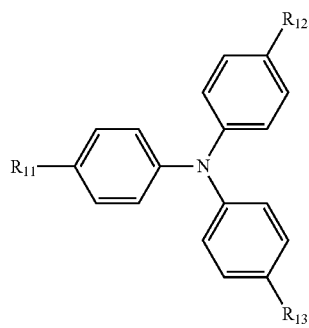

Formula 2E

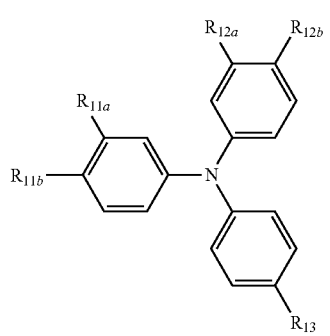

In Formulae 1A to 1E and 2A to 2E, $R_1$ to $R_3$ and $R_{11}$ to $R_{13}$ may be the same as described herein;

descriptions of $R_{1a}$ and $R_{1b}$ may each independently be the same as the description provided herein in connection with $R_1$;

descriptions of $R_{2a}$ and $R_{2b}$ may each independently be the same as the description provided herein in connection with $R_2$;

descriptions of $R_{11a}$ and $R_{11b}$ may each independently be the same as the description provided herein in connection with $R_{11}$; and descriptions of $R_{12a}$ and $R_{12b}$ may each independently be the same as the description provided herein in connection with $R_{12}$.

In some embodiments, the first compound and the second compound may be each independently selected from Compounds HTa-1 to HTa-7, and the third compound and the fourth compound may be each independently selected from Compounds HTb-1 to HTb-7:

HTa-1

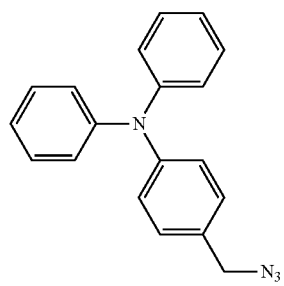

HTa-2

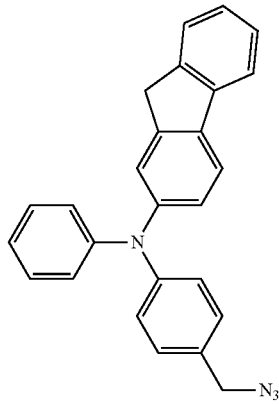

HTa-3

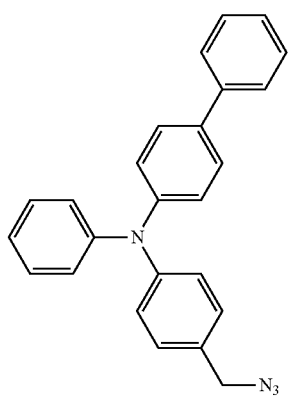

HTa-4

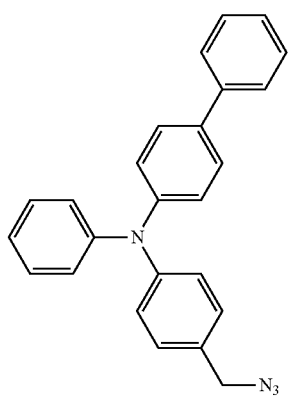

HTa-5

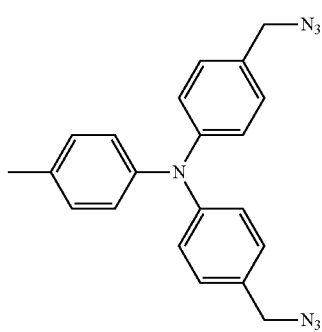

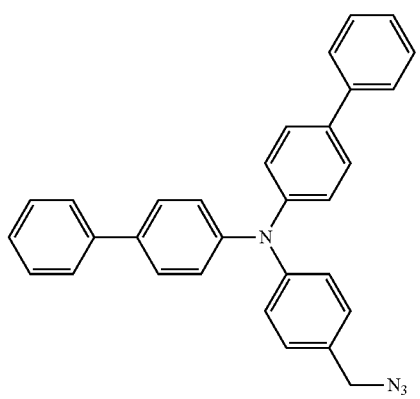

HTa-6
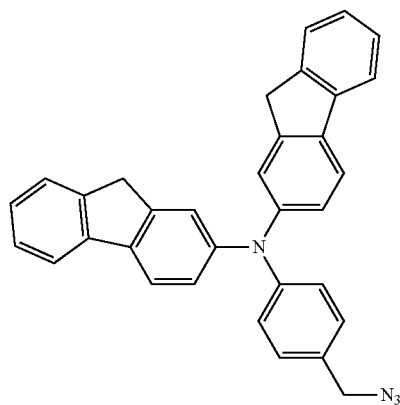
HTa-7
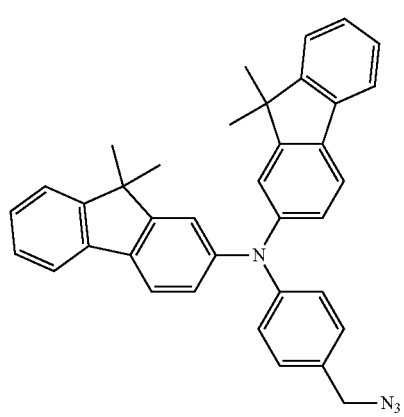
HTb-1
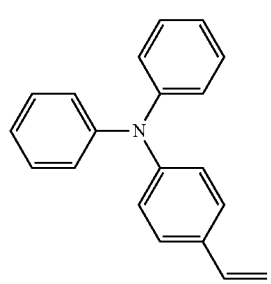
HTb-2
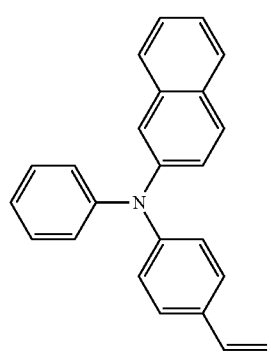
HTb-3
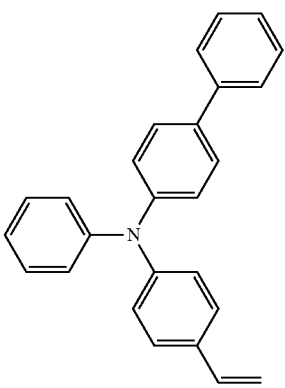
HTb-4
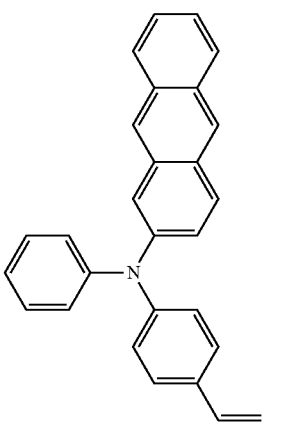
HTb-5
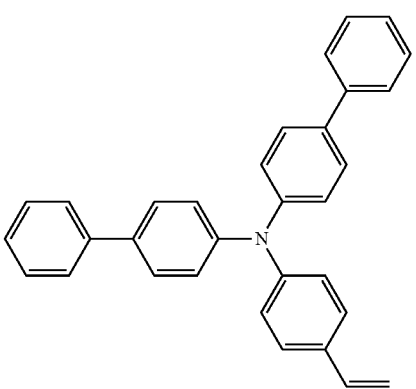
HTb-6
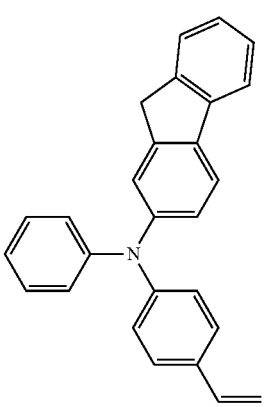

HTb-7

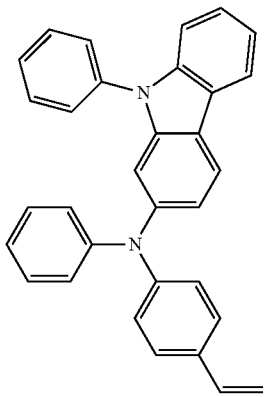

According to an embodiment, the first compound and the second compound may be identical to or different from each other, and the third compound and the fourth compound may be identical to or different from each other.

According to an embodiment, the hole transport region may include a hole transport layer and a hole injection layer between the first electrode and the hole transport layer; and at least one selected from the first copolymer and the second copolymer may be included in the hole transport layer.

According to another embodiment, the hole transport region may include a hole transport layer and a hole injection layer between the first electrode and the hole transport layer; and the hole transport layer may include a first hole transport layer and a second hole transport layer, the second hole transport layer being between the emission layer and the first hole transport layer.

In some embodiments, the first copolymer may be included in the first hole transport layer, and the second copolymer may be included in the second hole transport layer; or the second copolymer may be included in the first hole transport layer, and the first copolymer may be included in the second hole transport layer.

According to an embodiment, the electron auxiliary layer may directly contact the emission layer; the electron transport region may further include an electron transport layer and an electron injection layer between the electron auxiliary layer and the second electrode; and the metal oxide may be included in the electron auxiliary layer.

According to an embodiment, the metal oxide may be selected from zinc oxide (ZnO), zinc-tin oxide (ZTO), gallium-indium-zinc-zirconium oxide (ZTOZr), indium zinc oxide (IZO), and gallium-indium-zinc oxide (GIZO). According to another embodiment, the metal oxide may be zinc oxide (ZnO), but embodiments are not limited thereto.

Hereinafter, an organic light-emitting device according to an embodiment of the present disclosure will be described with reference to the drawing.

The drawing is a schematic cross-sectional view of an organic light-emitting device (OLED) 10 according to an embodiment.

The OLED 10 in the drawing may include a first electrode 110, a hole transport region 130, an emission layer 150, an electron transport region 170, and a second electrode 190, which are sequentially layered in the stated order. The electron transport region 170 may include an electron auxiliary layer. The electron auxiliary layer may directly contact the emission layer 150.

Referring to the drawing, a substrate may be additionally disposed (e.g., positioned) under the first electrode 110 or over the second electrode 190. The substrate may be a glass substrate and/or transparent plastic substrate, each with excellent mechanical strength, thermal stability, transparency, surface smoothness, ease of handling, and/or water resistance.

The first electrode 110 may be formed by depositing or sputtering a material for forming the first electrode 110 over the substrate. When the first electrode 110 is an anode, the material for forming the first electrode 110 may be selected from materials with a high work function, so as to facilitate hole injection. The first electrode 110 may be a reflective electrode, a semi-transmissive electrode, or a transmissive electrode. The material for forming the first electrode 110 may be a transparent and highly conductive material, and non-limiting examples of the material include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode 110, at least one selected from magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including a plurality of layers. In some embodiments, the first electrode 110 may have a triple-layer structure of ITO/Ag/ITO, but embodiments are not limited thereto.

Holes injected from the first electrode 110 may be transported to the emission layer 150 through the hole transport region 130.

The hole transport region 130 may have a single-layer structure, or a multi-layer structure including two or more layers. The hole transport region 130 may include a single material or two or more different materials.

For example, the hole transport region 130 may have a structure of hole injection layer/hole transport layer, a structure of hole injection layer/hole transport layer/electron blocking layer, a structure of hole injection layer/hole transport layer/buffer layer/electron blocking layer, a structure of hole injection layer/electron blocking layer, a structure of hole injection layer/buffer layer/electron blocking layer, a structure of hole transport layer/electron blocking layer, and a structure of hole transport layer/buffer layer/electron blocking layer, wherein the layers of each structure are sequentially stacked from the first electrode 110 in this stated order, but embodiments are not limited thereto. In some embodiments, the hole transport region 130 may include a hole injection layer only or a hole transport layer only.

The hole transport region 130 may include at least one copolymer selected from a first copolymer of a first compound and a second compound and a second copolymer of a third compound and a fourth compound. The first compound, the second compound, the third compound, the fourth compound, the first copolymer, and the second copolymer may be the same as described herein.

The hole transport region 130 may include, in addition to the first copolymer and the second copolymer, at least one selected from polyaniline/dodecylbenzenesulfonic acid (Pani/DBSA), poly(3,4-ethylenedioxythiophene)/poly(4-styrenesulfonate (PEDOT/PSS), polyaniline/camphor sulfonicacid (Pani/CSA), and polyaniline/poly(4-styrenesulfonate) (PANI/PSS).

A thickness of the hole transport region 130 may be in a range of about 100 Angstroms (Å) to about 10,000 Å, for example, about 100 Å to about 1,000 Å. When the hole transport region 130 includes a hole injection layer and a hole transport layer, the thickness of the hole injection layer may be in a range of about 100 Å to about 10,000 Å, and in some embodiments, about 100 Å to about 1,000 Å; a thickness of the hole transport layer may be in a range of about 50 Å to about 2,000 Å, and in some embodiments, about 100 Å to about 1,500 Å. When the thicknesses of the hole transport region 130, the hole injection layer, and the hole transport layer are within any of these ranges, excellent (or suitable) hole transport characteristics may be obtained without a substantial increase in driving voltage.

The hole transport region 130 may further include, in addition to the hole injection layer and the hole transport layer, at least one selected from a buffer layer and an electron blocking layer. Since the buffer layer may compensate for an optical resonance distance according to a wavelength of light emitted from the emission layer, the light-emission efficiency of the resulting organic light-emitting device may be improved. Any of the materials included in the hole transport region may be used as a material included in the buffer layer. In some embodiments, the electron blocking layer may function to prevent or reduce the injection of electrons from the electron transport region 170.

According to an embodiment, the hole transport region 130 may include the hole injection layer and the hole transport layer, wherein the hole injection layer may include at least one selected from polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS); and the hole transport layer may include at least one selected from the first copolymer and the second copolymer, but embodiments of the present disclosure are not limited thereto.

When the hole transport region 130 includes the hole transport layer, the hole transport layer may directly contact the emission layer 150, but embodiments are not limited thereto.

The emission layer 150 may be formed over (e.g., on) the hole transport region 130.

When the organic light-emitting device 10 is a full color organic light-emitting device, the emission layer may be patterned into a red emission layer, a green emission layer, and/or a blue emission layer, according to a sub-pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light.

According to an embodiment, an emission material included in the emission layer 150 may be a polymer emission material or a low-molecular-weight emission material.

The emission layer 150 may include a host and a dopant.

The host may include, for example, TPBi, TBADN, ADN (herein also referred to as "DNA"), CBP, CDBP, TCP, poly(N-vinyl carbazole (PVK):2-4-biphenyl)-5-(4-tert-butylphenyl)-1,3,4-oxadiazole (PBD), and at least one selected from Compounds 101 to 106:

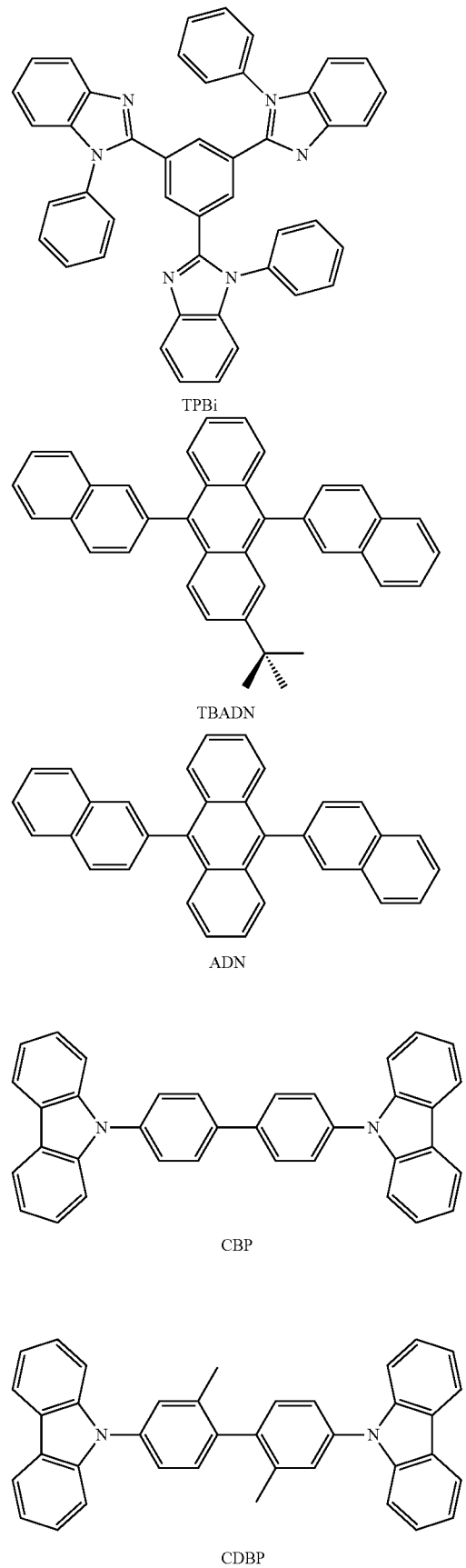

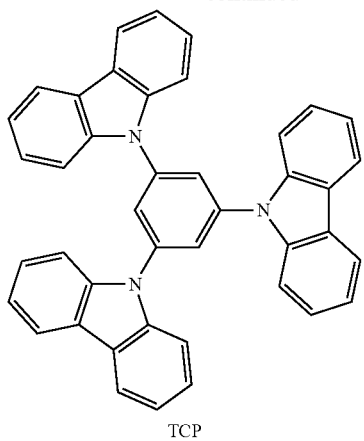

TCP

Compound 101

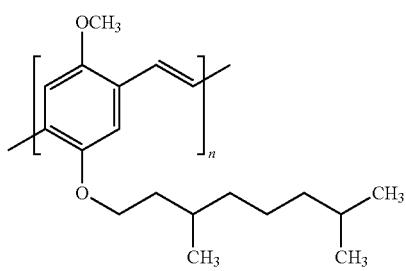

Compound 102

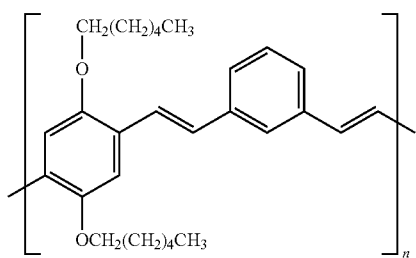

Compound 103

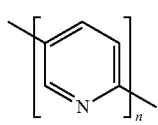

Compound 104

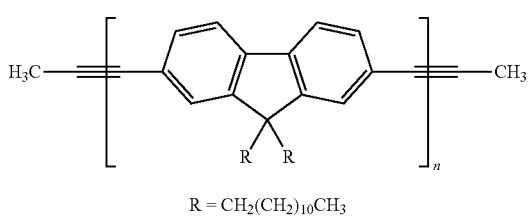

R = CH₂(CH₂)₁₀CH₃

Compound 105

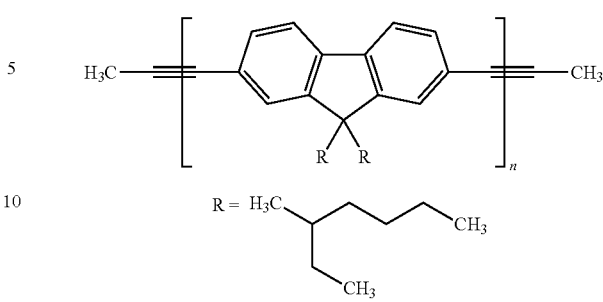

R = 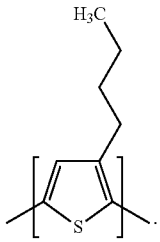

Compound 106

In some embodiments, the host may further include a compound represented by Formula 301:

$$Ar_{301}\text{-}[(L_{301})_{xb1}\text{-}R_{301}]_{xb2}.$$  Formula 301

In Formula 301, $Ar_{301}$ may be selected from the group consisting of:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), wherein $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

description of $L_{301}$ may be the same as the description provided herein in connection with $L_1$;

$R_{301}$ may be selected from the group consisting of:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3; and xb2 may be selected from 1, 2, 3, and 4.

In some embodiments, in Formula 301, $L_{301}$ may be selected from the group consisting of:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from the group consisting of:

a $C_1$-$C_{20}$ alkyl group and a $C_1$-$C_{20}$ alkoxy group, a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but embodiments of the present disclosure are not limited thereto.

In some embodiments, the host may include a compound represented by Formula 301A:

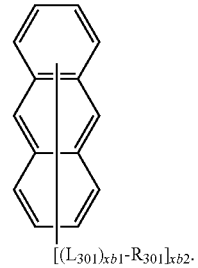

Formula 301A $[(L_{301})_{xb1}$-$R_{301}]_{xb2}$.

Descriptions of substituents of Formula 301A may be the same as those herein in connection therewith.

The compound represented by Formula 301 may include at least one compound selected from Compounds H1 to H42, but embodiments are not limited thereto:

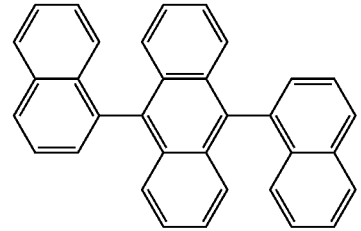

H1

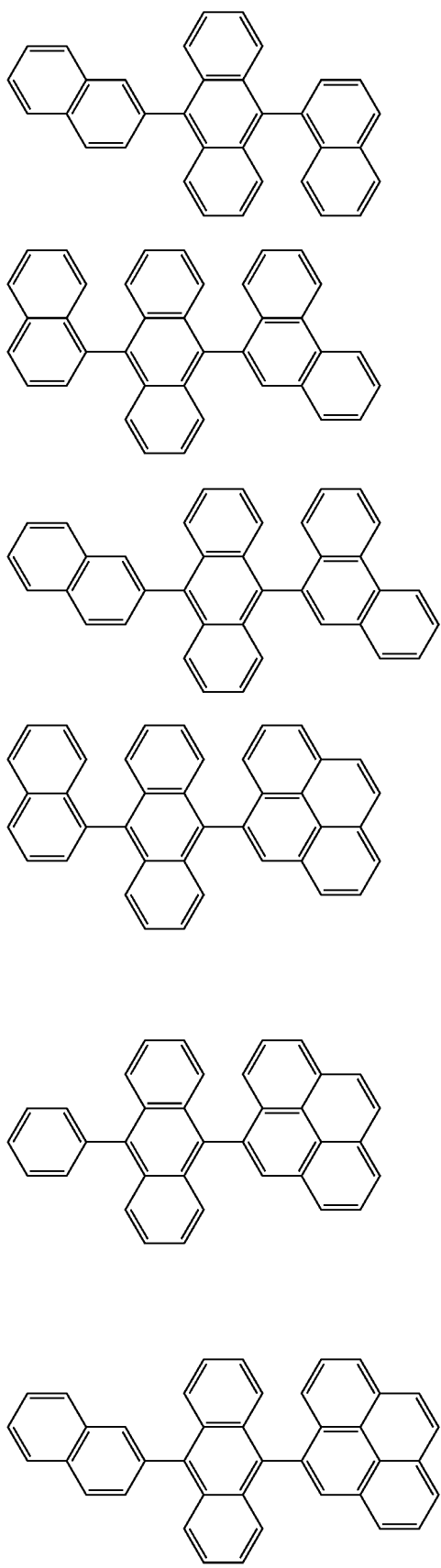
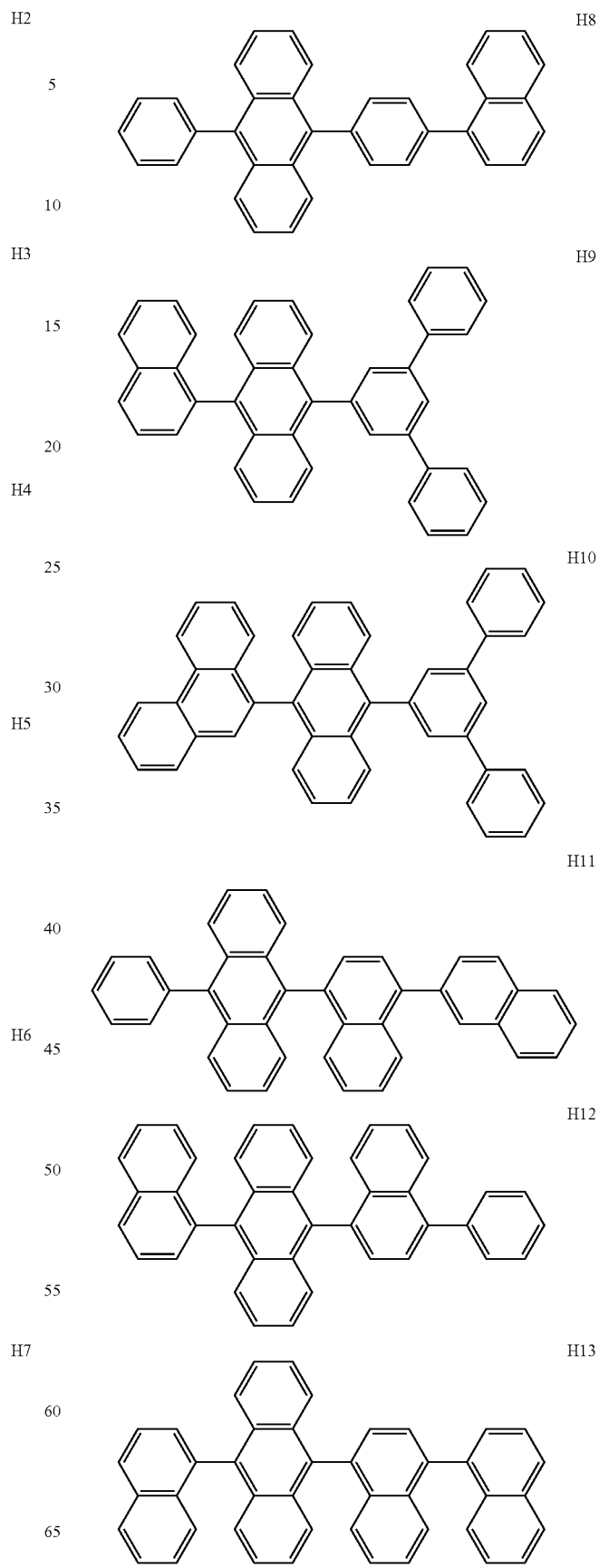

H14
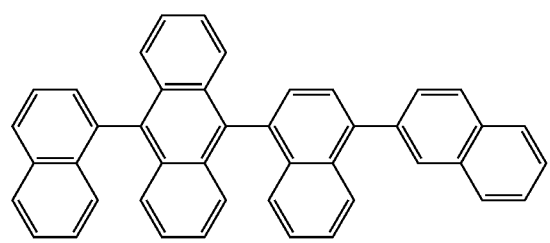
H15
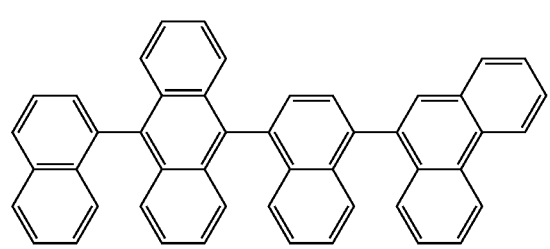
H16
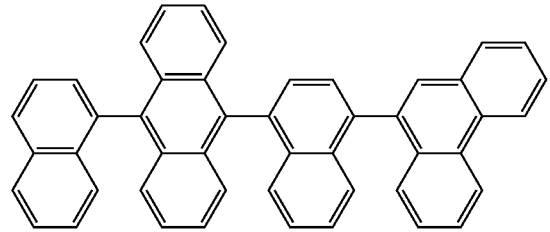
H17
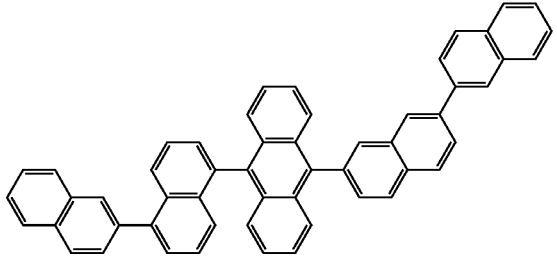
H18
H19
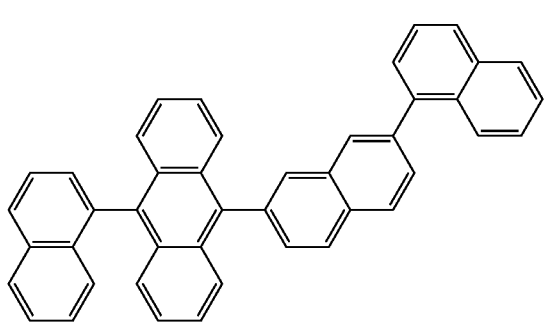
H20
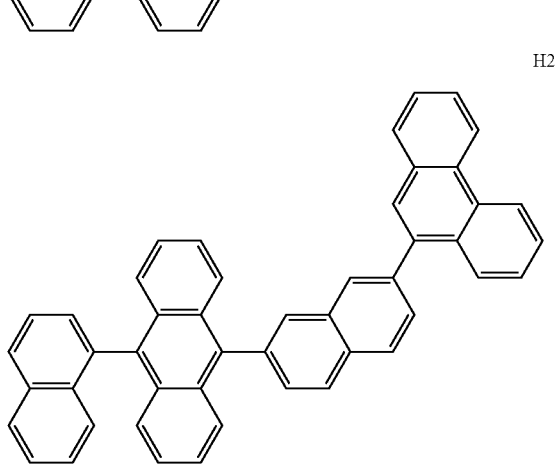
H21
H22
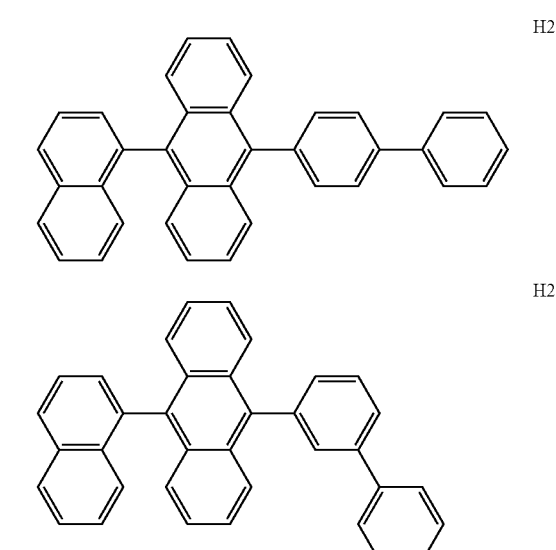
H23
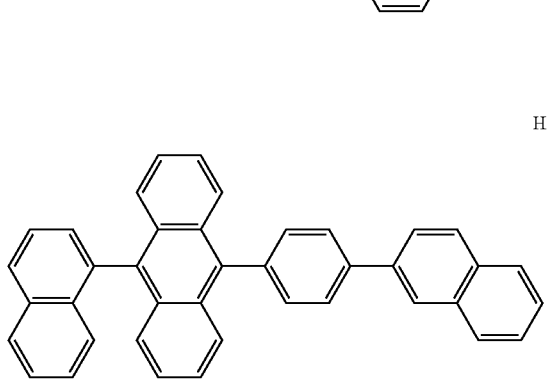

H24
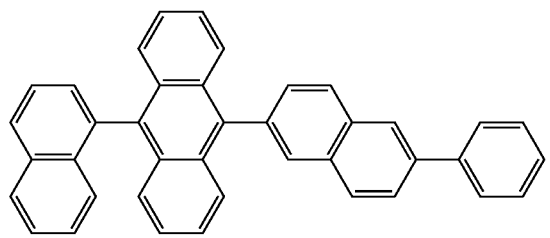
H25
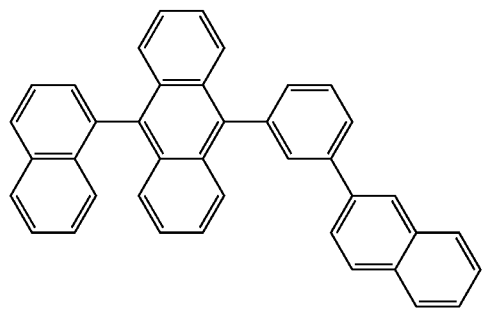
H26
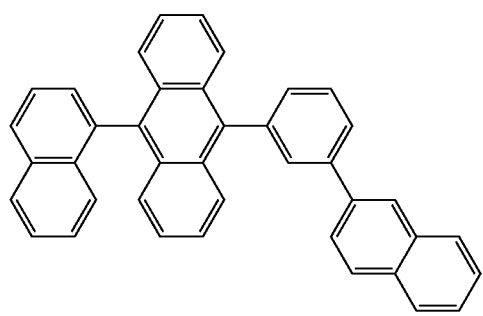
H27
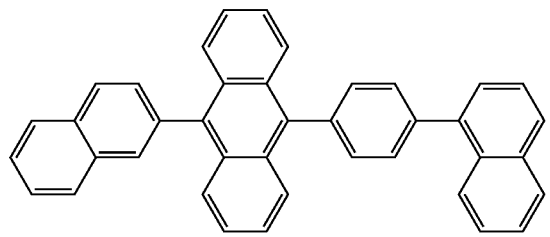
H28
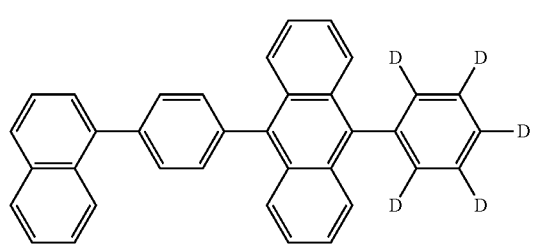
H29
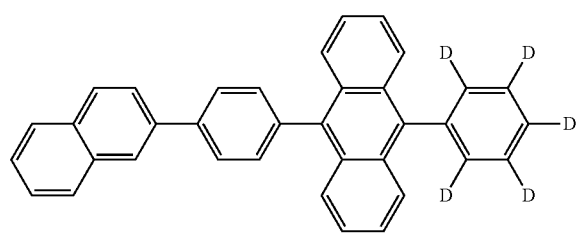
H30
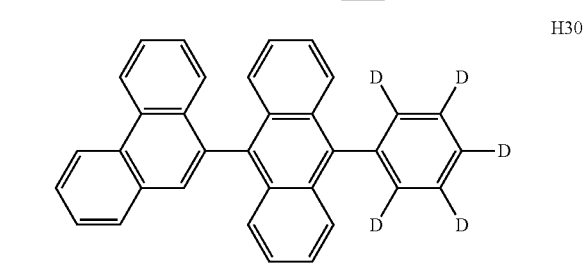
H31
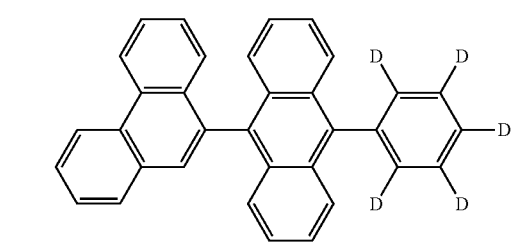
H32
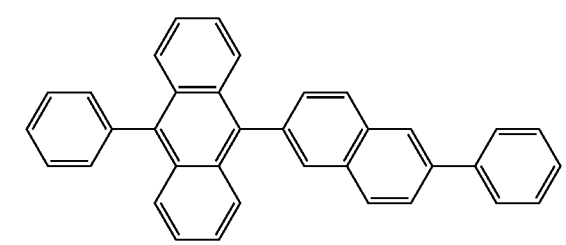
H33
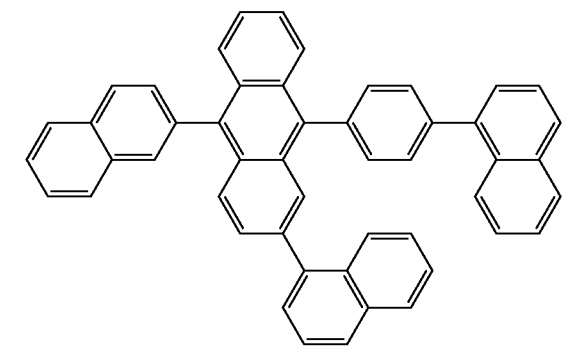

H34
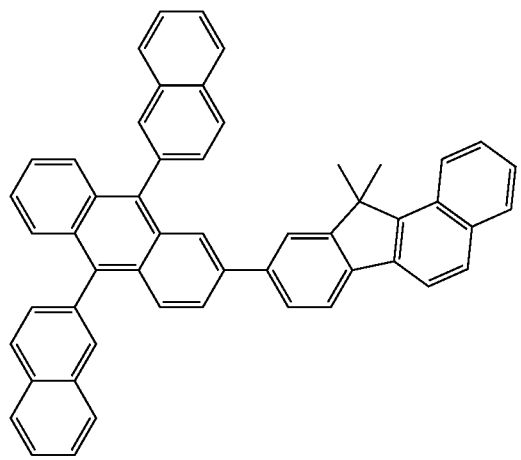
H37
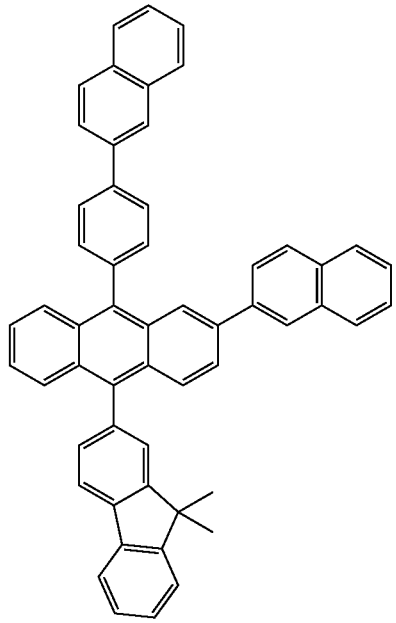
H35
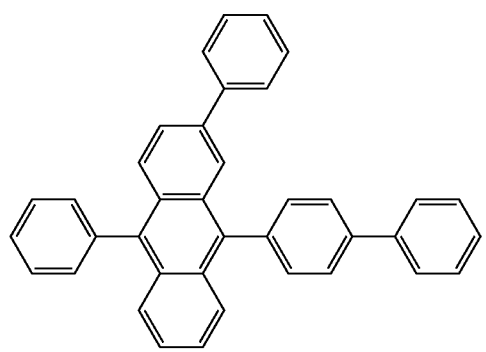
H38
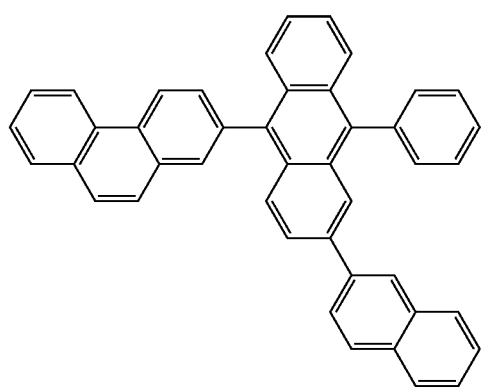
H36
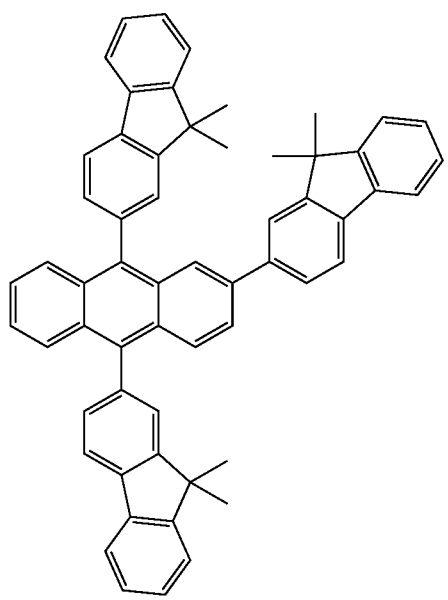
H39
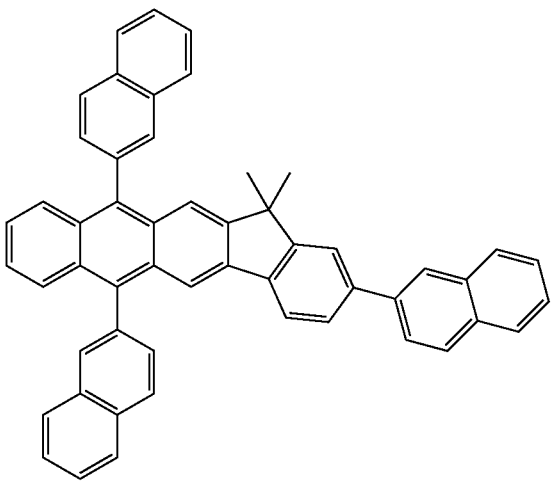

H40
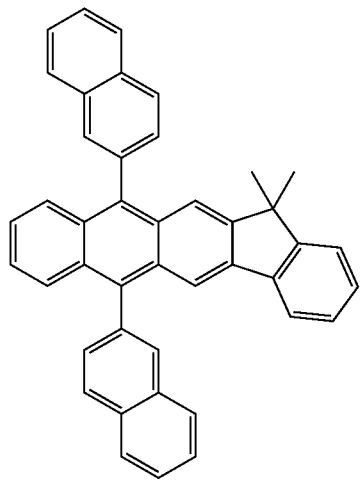
H42
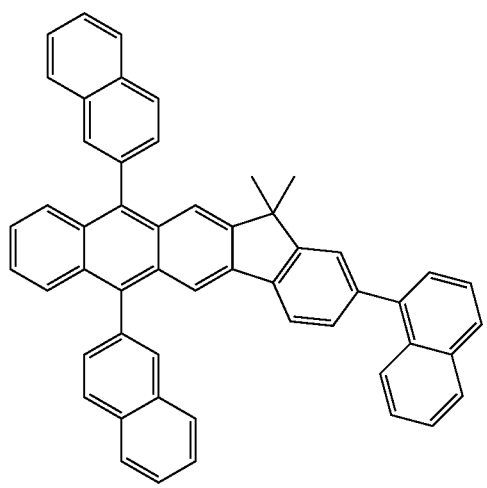
H43
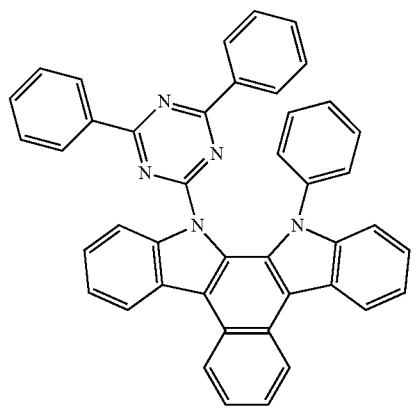
H44
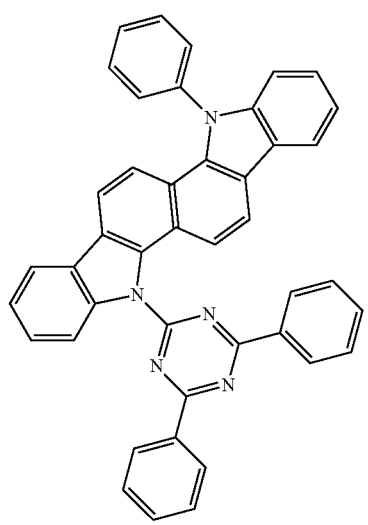
H45
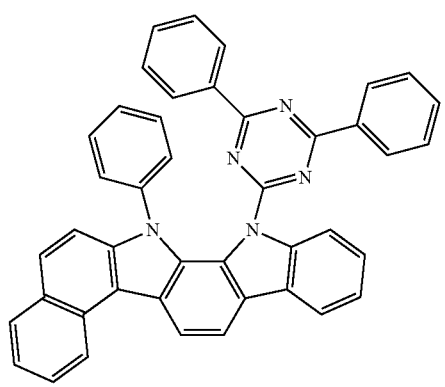
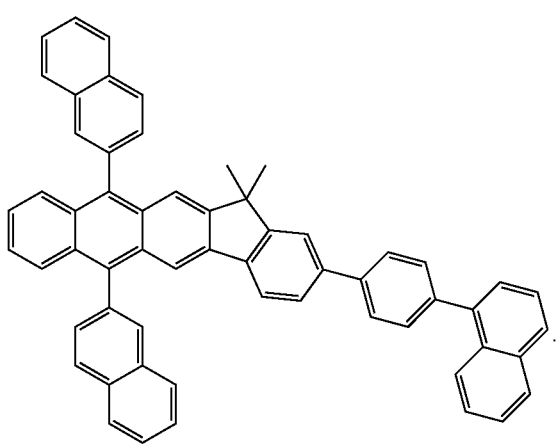
In some embodiments, the host may include at least one selected from Compounds H43 to H49, but embodiments are not limited thereto:

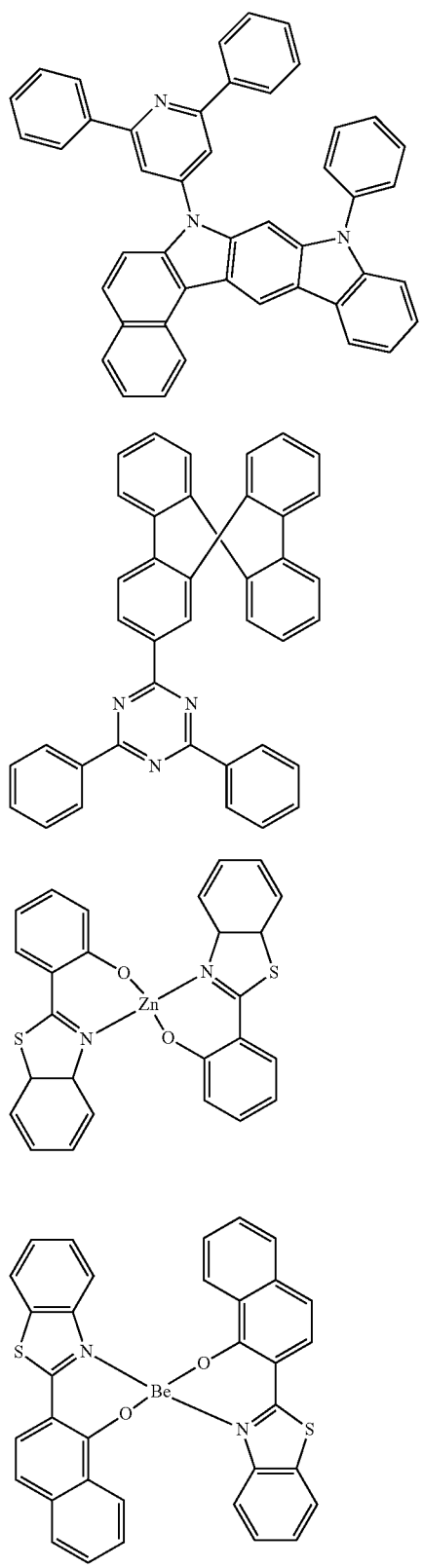
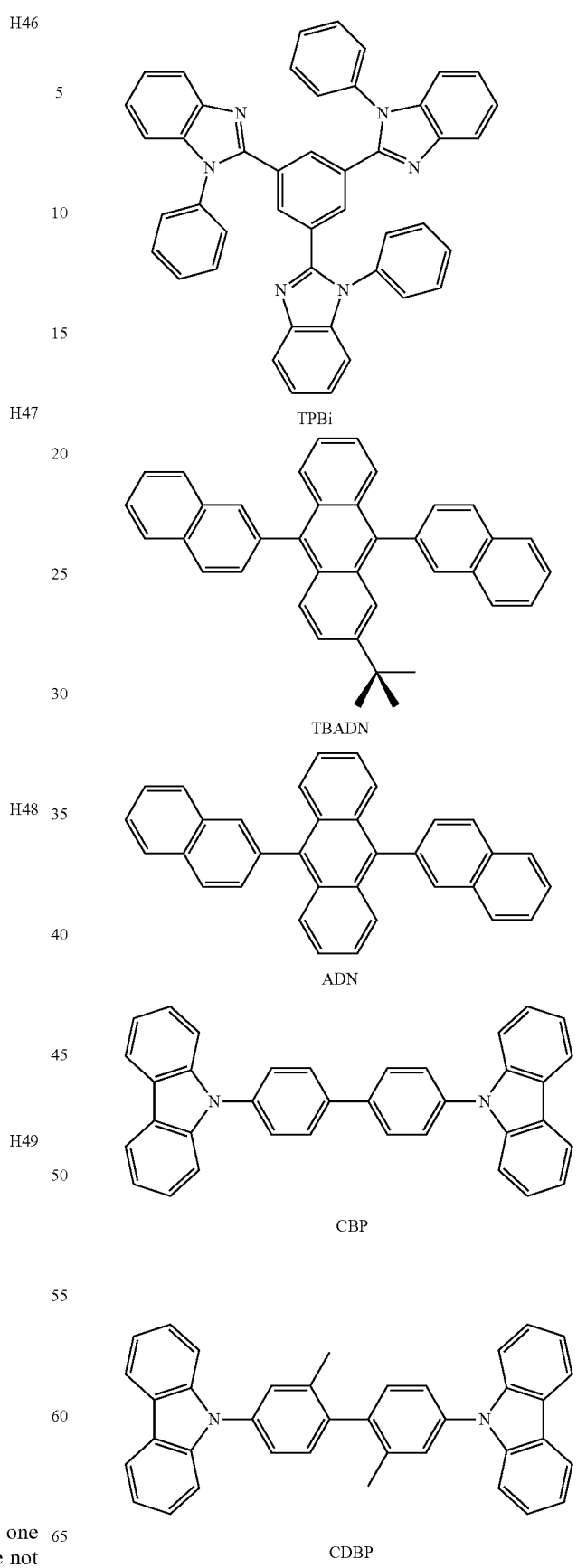
In some embodiments, the host may include at least one selected from compounds below, but embodiments are not limited thereto:

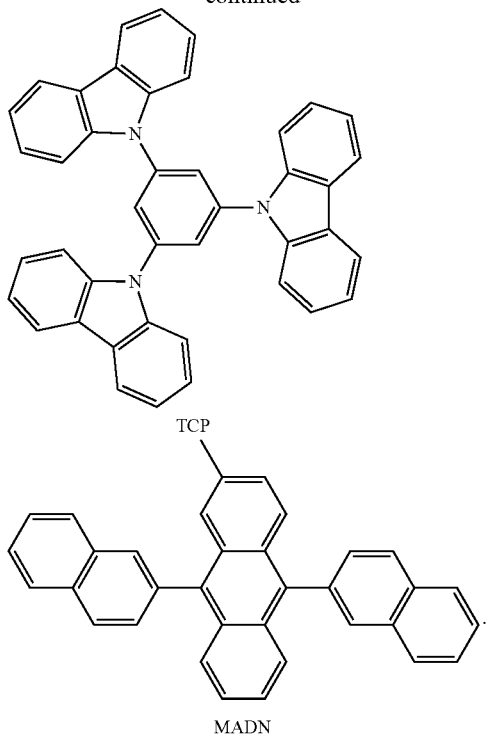

TCP

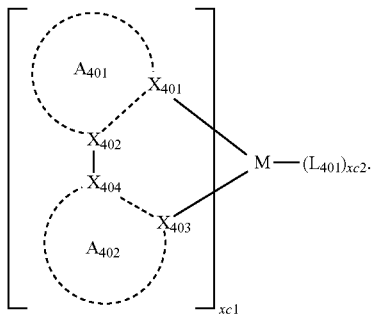

MADN

The dopant may include at least one selected from a fluorescent dopant and a phosphorescent dopant.

The phosphorescent dopant may include an organometallic complex represented by Formula 401:

Formula 401

$$\left[ \begin{array}{c} A_{401} \\ X_{402} \\ X_{404} \\ A_{402} \end{array} \begin{array}{c} X_{401} \\ M \\ X_{403} \end{array} \right]_{xc1} (L_{401})_{xc2}$$

In Formula 401,

M may be selected from iridium (Ir), platinum (Pt), osmium (Os), titanium (Ti), zirconium (Zr), hafnium (Hf), europium (Eu), terbium (Tb), and thulium (Tm), $X_{401}$ to $X_{404}$ may be each independently a nitrogen or a carbon;

$A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, wherein at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$), and —N($Q_{421}$)($Q_{422}$), —Si($Q_{423}$)($Q_{424}$)($Q_{425}$), and —B($Q_{426}$)($Q_{427}$), wherein descriptions of $Q_{401}$ to $Q_{407}$, $Q_{411}$ to $Q_{417}$, and $Q_{421}$ to $Q_{427}$ may each independently be the same as the description provided herein in connection with $Q_1$;

$L_{401}$ may be an organic ligand;

xc1 may be selected from 1, 2, and 3; and xc2 may be selected from 0, 1, 2, and 3.

In some embodiments, $L_{401}$ may be any suitable monovalent, divalent, or trivalent organic ligand. For example, $L_{401}$ may be selected from a halogen ligand (e.g., Cl and/or F), a diketone ligand (e.g., acetylacetonate, 1,3-diphenyl-1,3-propanedionate, 2,2,6,6-tetramethyl-3,5-heptanedionate, and/or hexafluoroacetonate), a carboxylic acid ligand (e.g., picolinate, dimethyl-3-pyrazolecarboxylate, and/or benzoate), a carbon monoxide ligand, an isonitrile ligand, a cyano ligand, and a phosphorous ligand (e.g., phosphine and/or phosphite), but embodiments are not limited thereto.

When $A_{401}$ in Formula 401 has a plurality of substituents, the plurality of substituents of $A_{401}$ may be linked to form a saturated or unsaturated ring.

When $A_{402}$ in Formula 401 has a plurality of substituents, the plurality of substituents of $A_{402}$ may be linked to form a saturated or unsaturated ring.

When xc1 in Formula 401 is two or more, a plurality of ligands

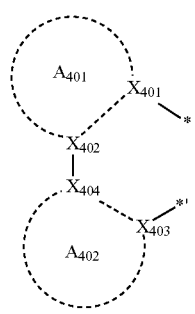

in Formula 401 may be identical to or different from each other. In Formula 401, when xc1 is 2 or more, $A_{401}$ and $A_{402}$ of one ligand may each independently be connected (e.g., coupled) to respective $A_{401}$ and $A_{402}$ of another adjacent ligand, either directly (e.g., via a bond such as a single bond) or via a linking group (e.g., a $C_1$-$C_5$ alkylene group, —N(R')— (where R' is a $C_1$-$C_{10}$ alkyl group or a $C_6$-$C_{20}$ aryl group), and/or —C(=O)—).

The phosphorescent dopant may include at least one selected from Compounds PD1 to PD74, but embodiments are not limited thereto:

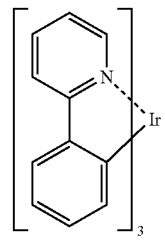

PD1

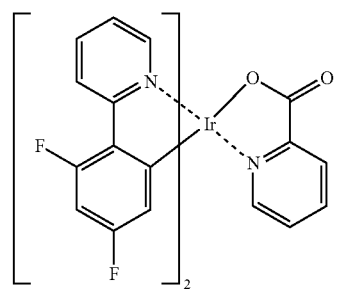

PD2

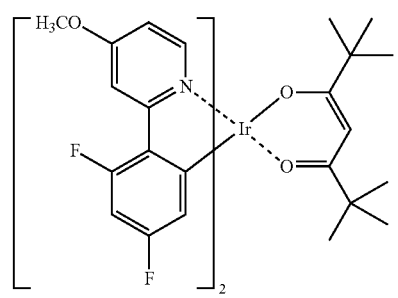

PD3

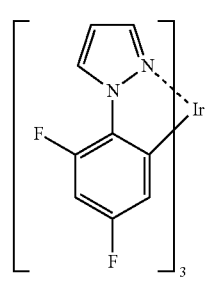

PD4

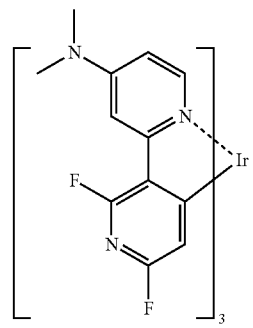

PD5

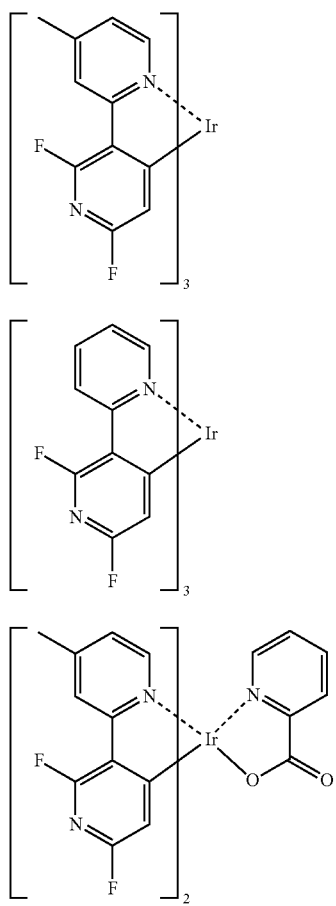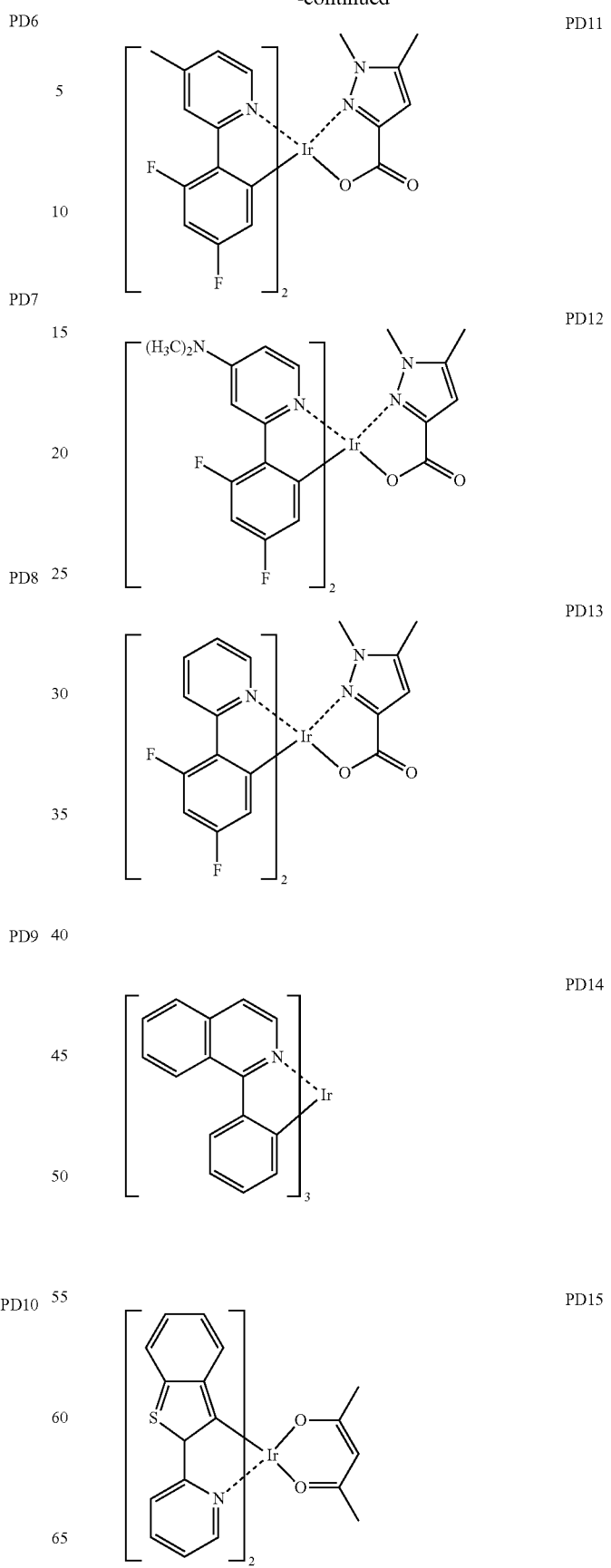

PD16 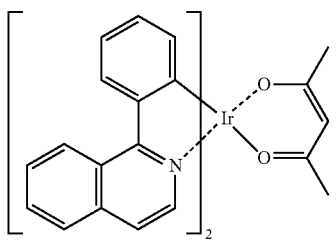
PD17 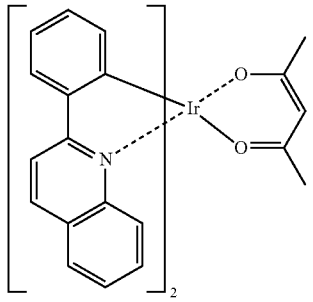
PD18 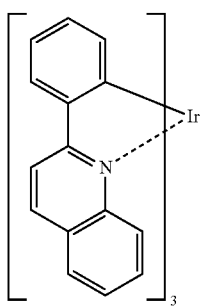
PD19 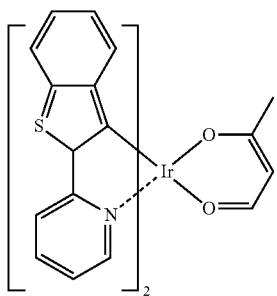
PD20 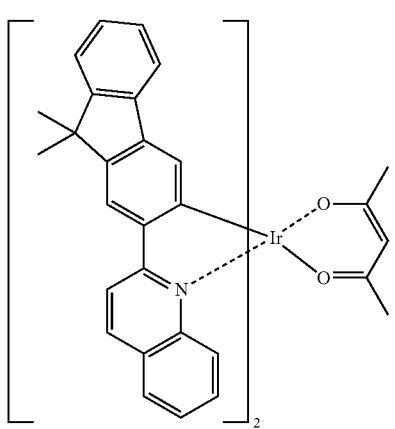
PD21 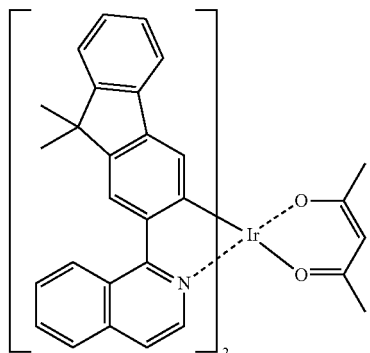
PD22 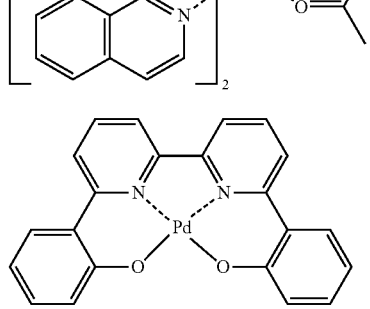
PD23 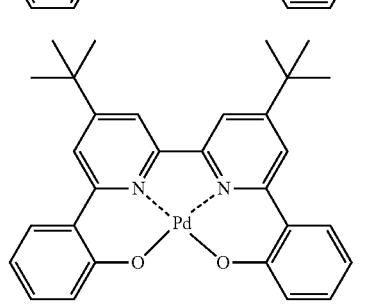
PD24 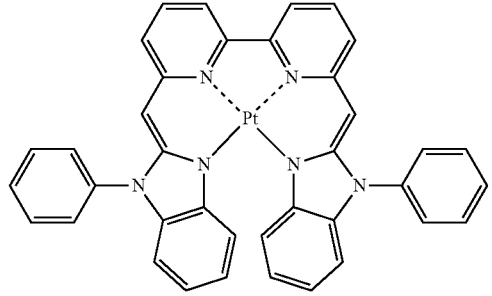
PD25 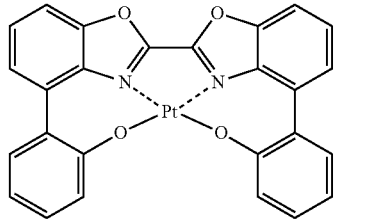
PD26 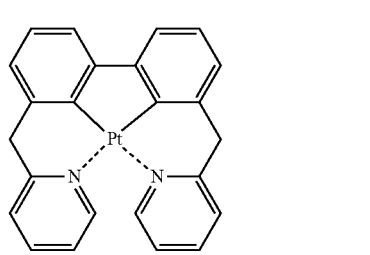

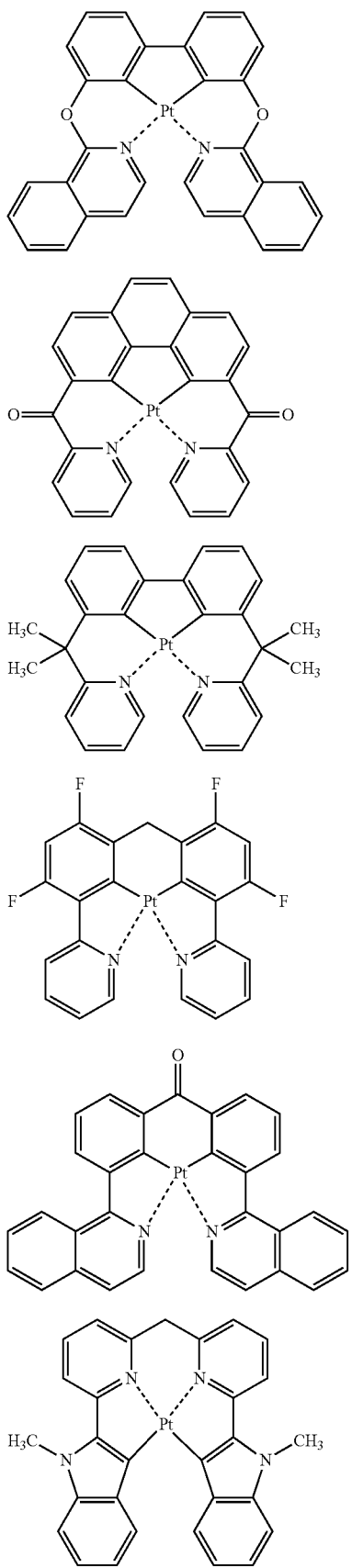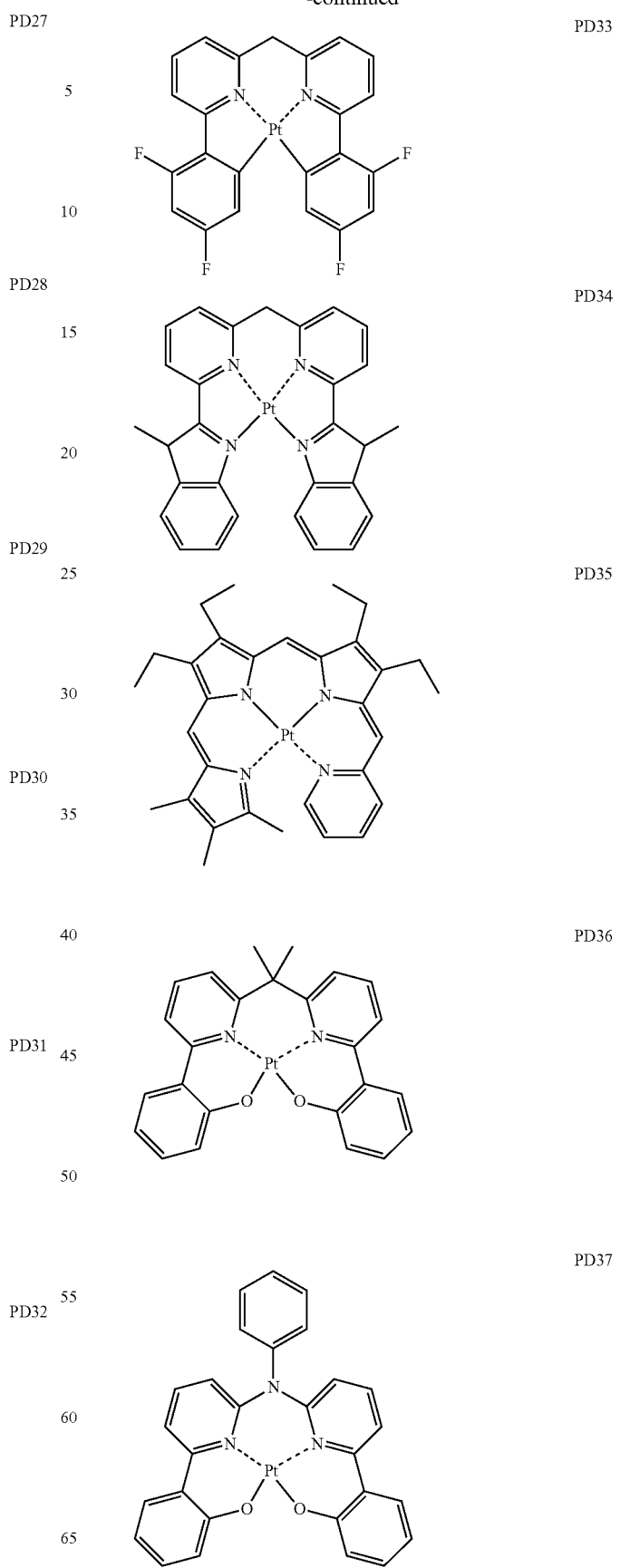

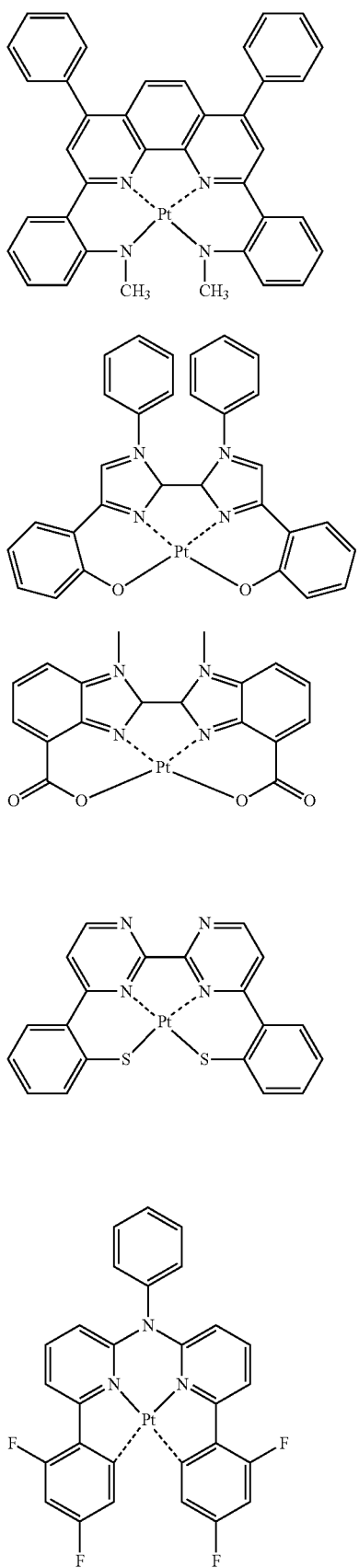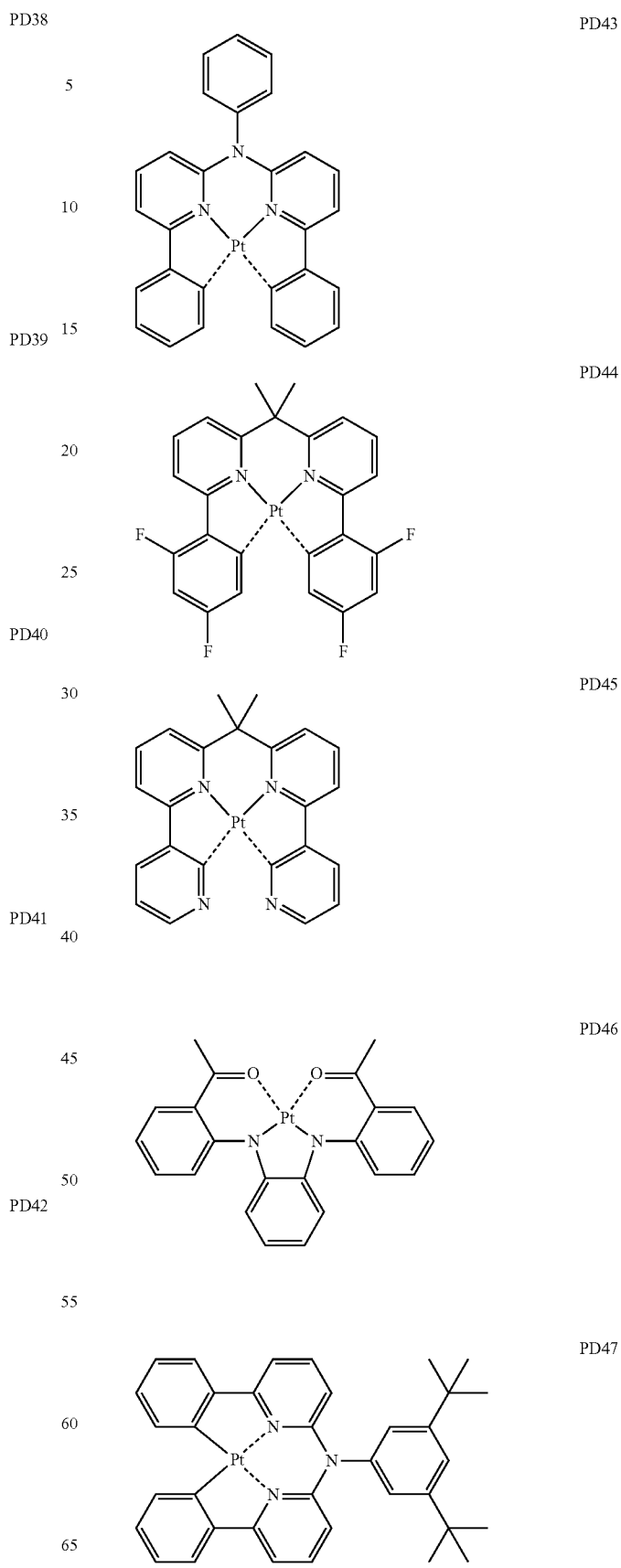

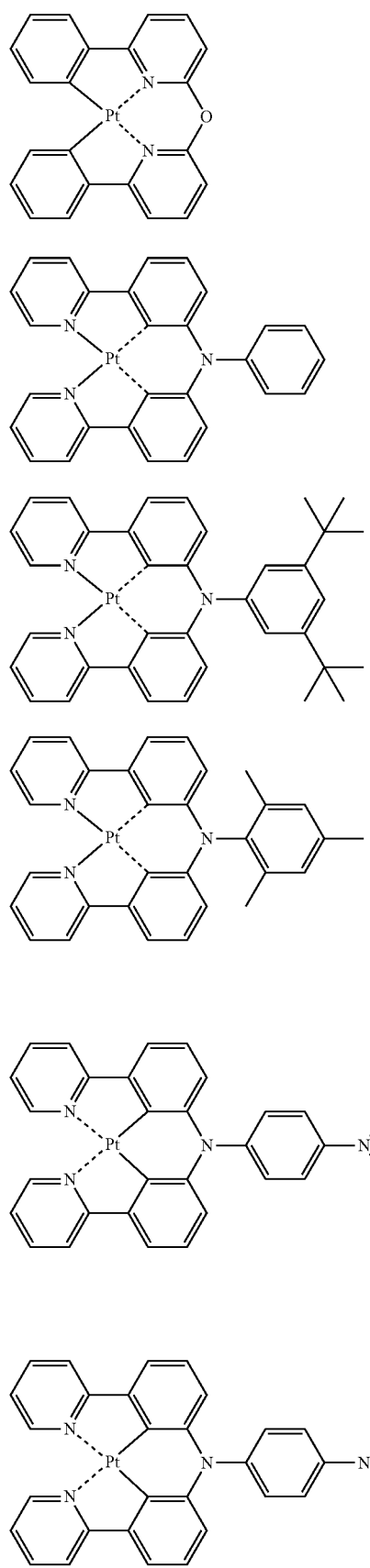
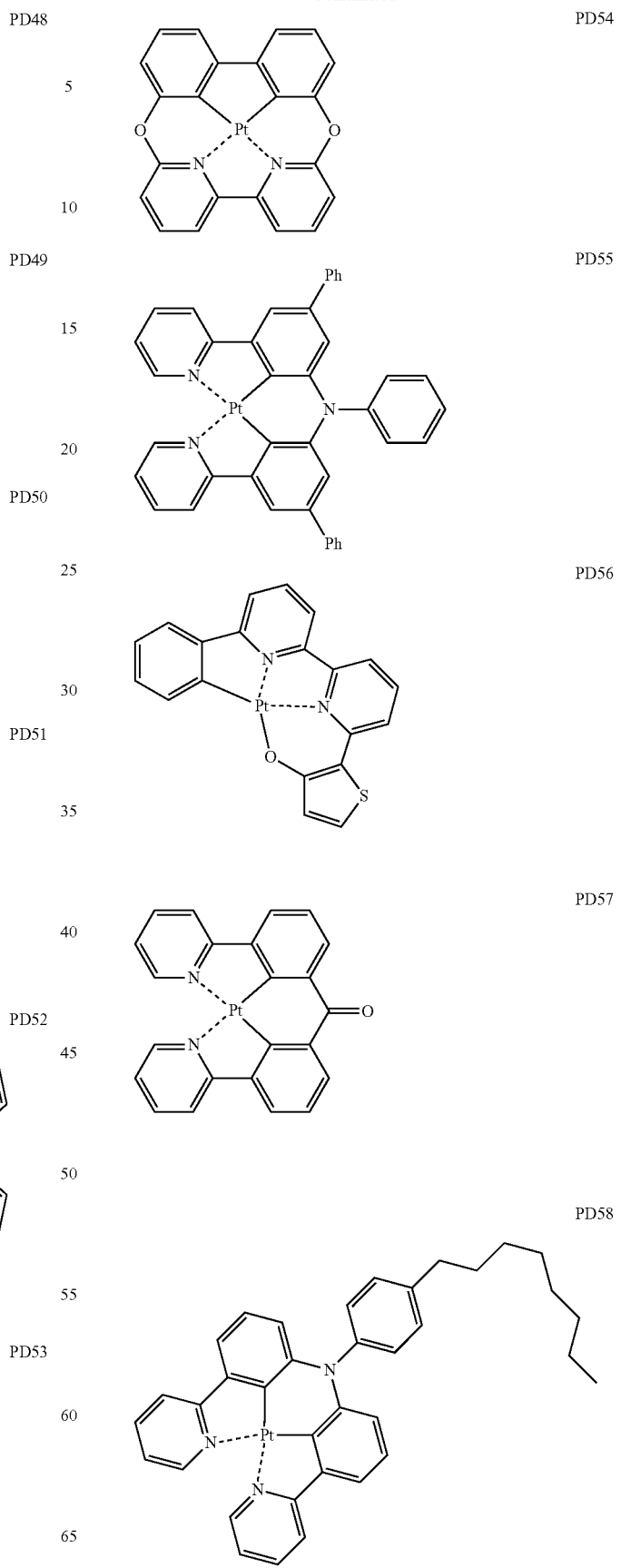

-continued
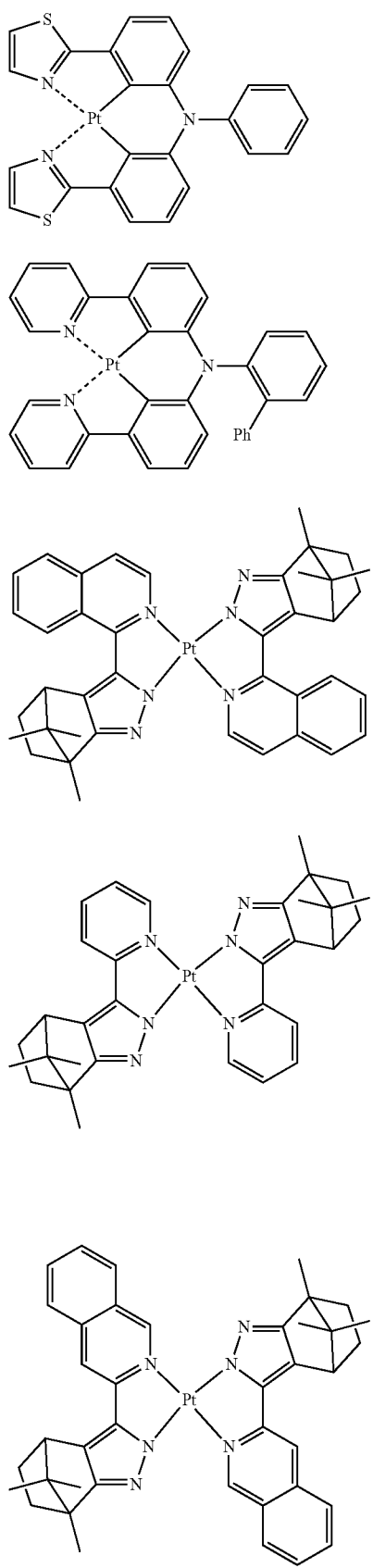
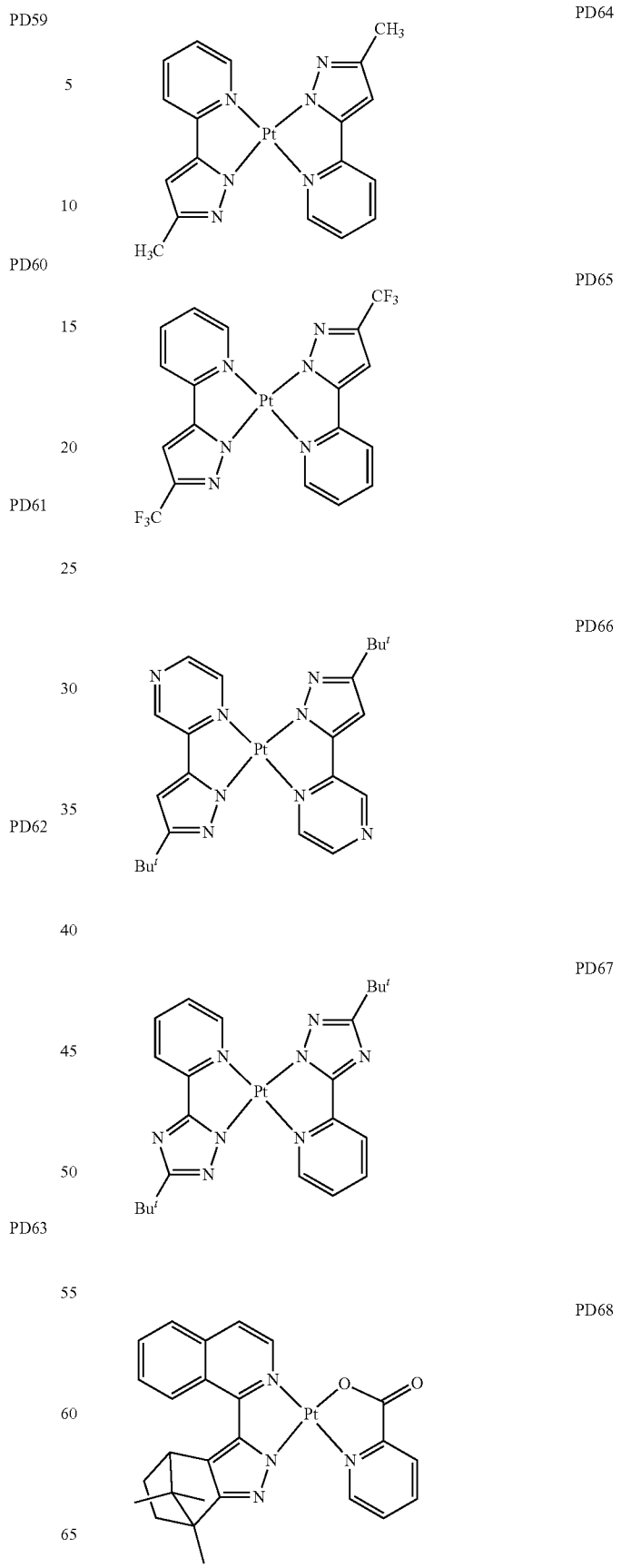

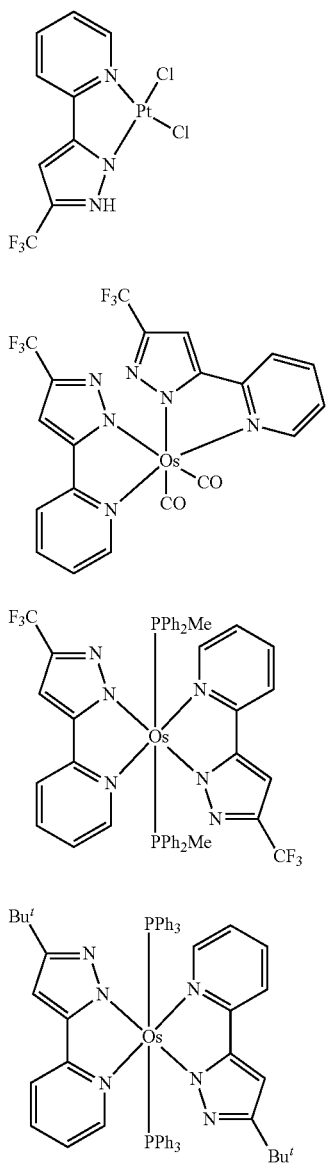
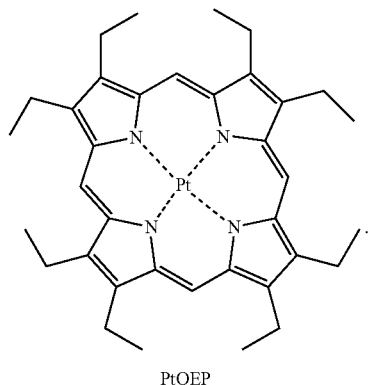
In some embodiments, the phosphorescent dopant may include PtOEP:
PtOEP
The fluorescent dopant may include at least one selected from DPVBi, DPAVBi, TBPe, DCM, DCJTB, Coumarin 6, and C545T:
DPVBi -continued

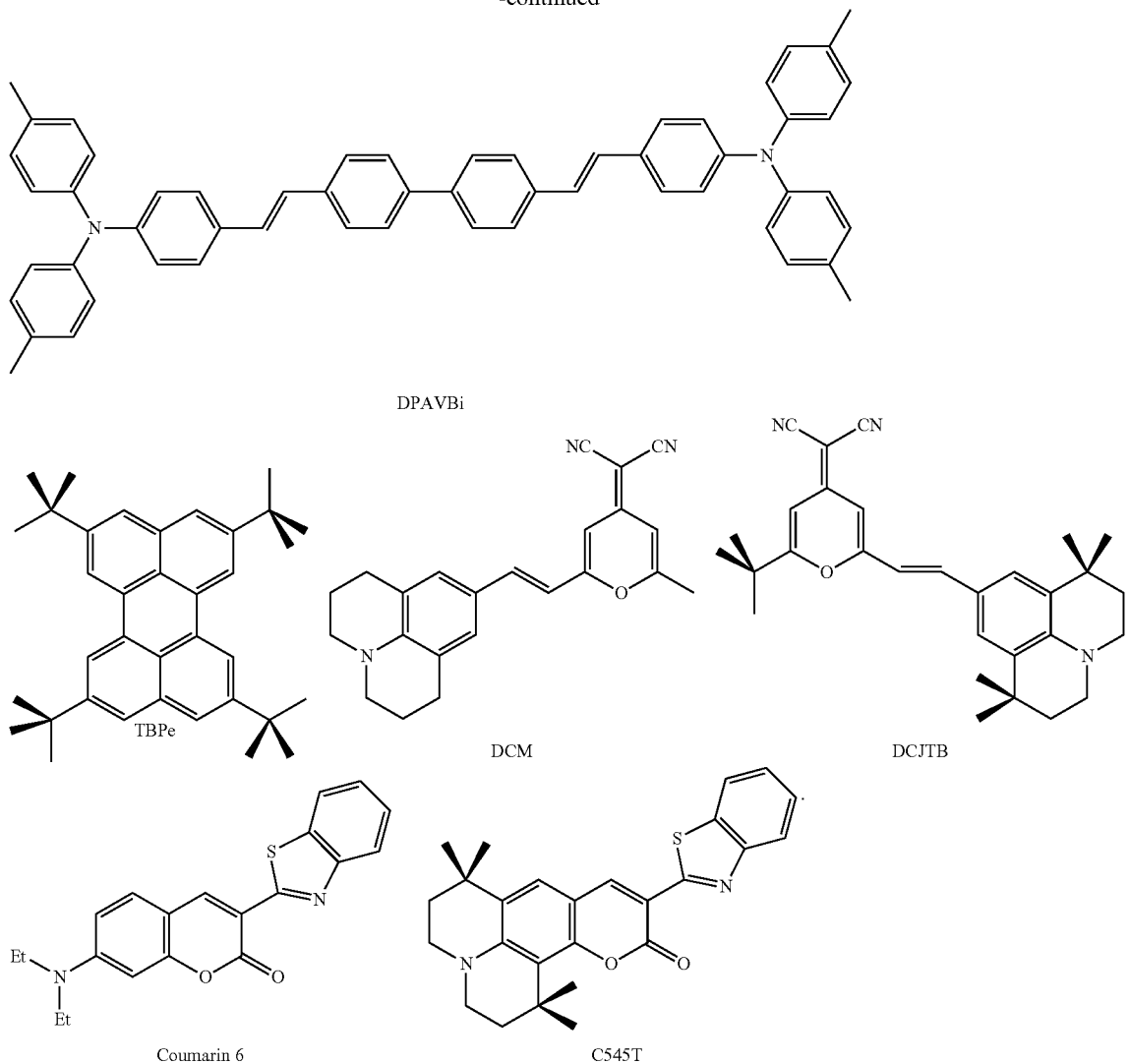

In some embodiments, the fluorescent dopant may include a compound represented by Formula 501:

$$Ar_{501} \left[ (L_{503})_{xd3} - N \begin{array}{c} (L_{501})_{xd1} - R_{501} \\ (L_{502})_{xd2} - R_{502} \end{array} \right]_{xd4}$$

Formula 501

In Formula 501, $Ar_{501}$ may be selected from the group consisting of: a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$), wherein $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group;

descriptions of $L_{501}$ to $L_{503}$ may each independently be the same as the description provided herein in connection with $L_{201}$;

$R_{501}$ and $R_{502}$ may be each independently selected from the group consisting of:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3; and xd4 may be selected from 1, 2, 3, and 4.

The fluorescent dopant may include at least one selected from Compounds FD1 to FD9:

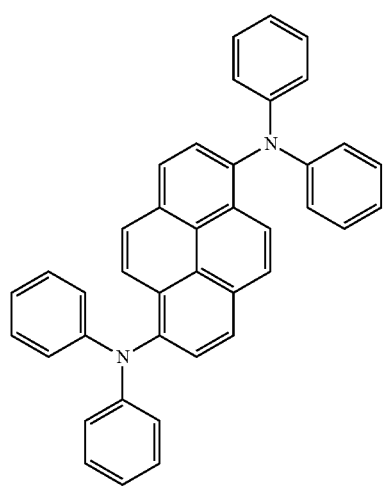

FD1

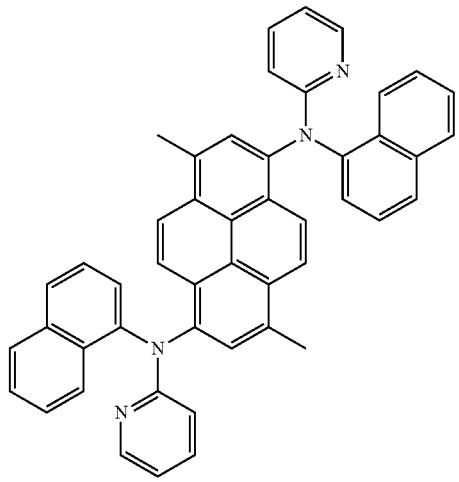

FD2

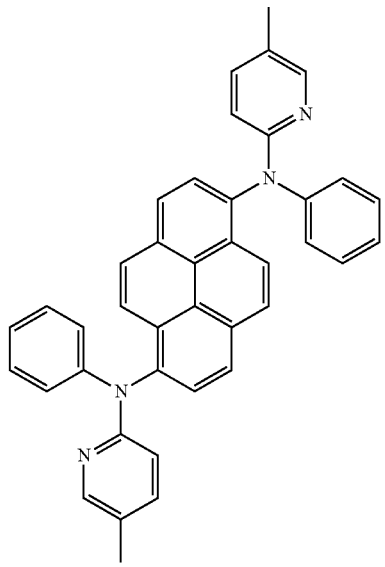

FD3

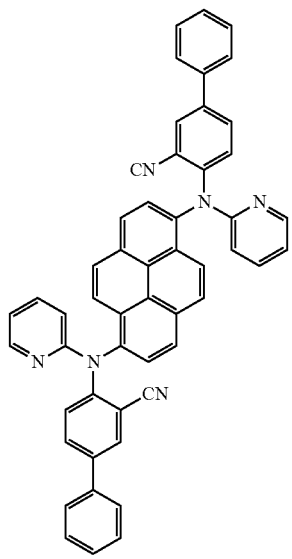

FD4

FD5
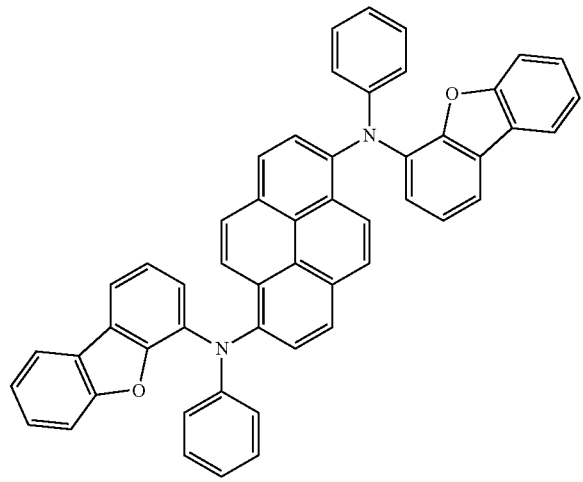

FD6

FD7

FD8
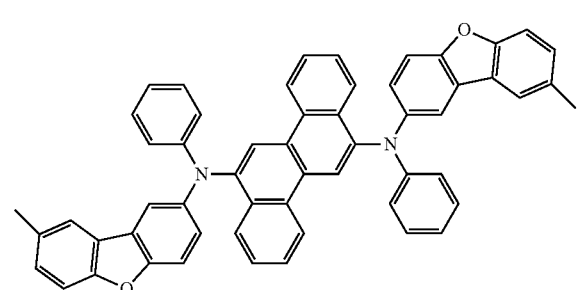

FD9
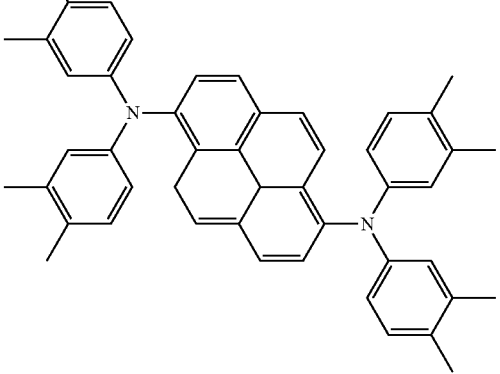

The amount of the dopant in the emission layer may be, for example, in a range of about 0.01 part by weight to about 15 parts by weight based on 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, excellent (or suitable) light-emission characteristics may be achieved without a substantial increase in driving voltage.

The electron transport region 170 may be positioned over (e.g., on) the emission layer 150. The electron transport region 170 may include an electron auxiliary layer. The electron auxiliary layer may include a metal oxide. The electron auxiliary layer may directly contact the emission layer 150. The electron auxiliary layer may serve to facilitate injection of electrons to the emission layer.

The thickness of the electron auxiliary layer may be in a range of about 5 Å to about 10 Å. When the thickness of the electron auxiliary layer is within this range, excellent (or suitable) electron injection balance characteristics may be achieved without a substantial increase in driving voltage.

The electron transport region 170 may include, in addition to the electron auxiliary layer, at least one selected from an electron transport layer and an electron injection layer, but embodiments of the present disclosure are not limited thereto.

In some embodiments, the electron transport region 170 may include an electron transport layer and an electron injection layer disposed (e.g., positioned) between the electron auxiliary layer and the second electrode 190, but embodiments are not limited thereto.

In some embodiments, the electron transport layer may include at least one selected from a compound represented by Formula 601 and a compound represented by Formula 602:

$$Ar_{601}-[(L_{601})_{xe1}-E_{601}]_{xe2}.$$  Formula 601

In Formula 601, $Ar_{601}$ may be selected from the group consisting of:
a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, and
a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), wherein $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

description of $L_{601}$ may be the same as the description provided herein in connection with $L_{201}$;

$E_{601}$ may be selected from the group consisting of:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

xe1 may be selected from 0, 1, 2, and 3; and
xe2 may be selected from 1, 2, 3, and 4.

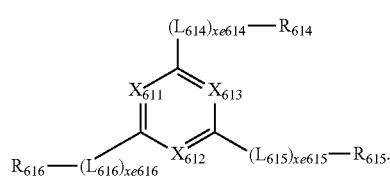

Formula 602

In Formula 602, $X_{611}$ may be N or C-($L_{611}$)$_{xe611}$-$R_{611}$, $X_{612}$ may be N or C-($L_{612}$)$_{xe612}$-$R_{612}$, $X_{613}$ may be N or C-($L_{613}$)$_{xe613}$-$R_{613}$, and at least one selected from $X_{611}$ to $X_{613}$ may be N;

descriptions of $L_{611}$ to $L_{616}$ may be each independently the same as the description provided herein in connection with $L_1$;

$R_{611}$ to $R_{616}$ may be each independently selected from the group consisting of:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may be each independently selected from Compounds ET1 to ET15:

ET1

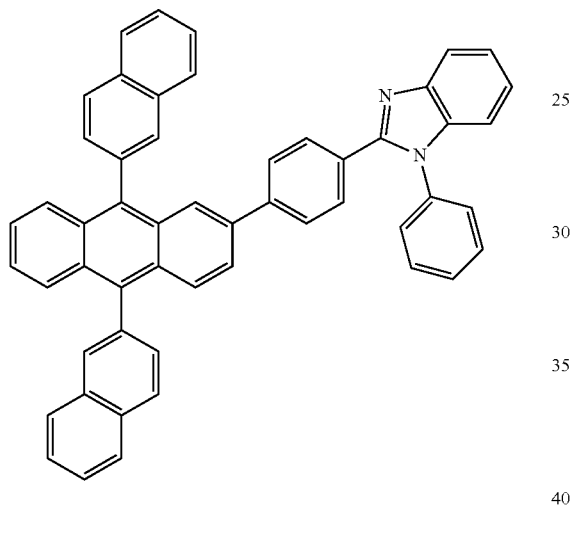

ET2

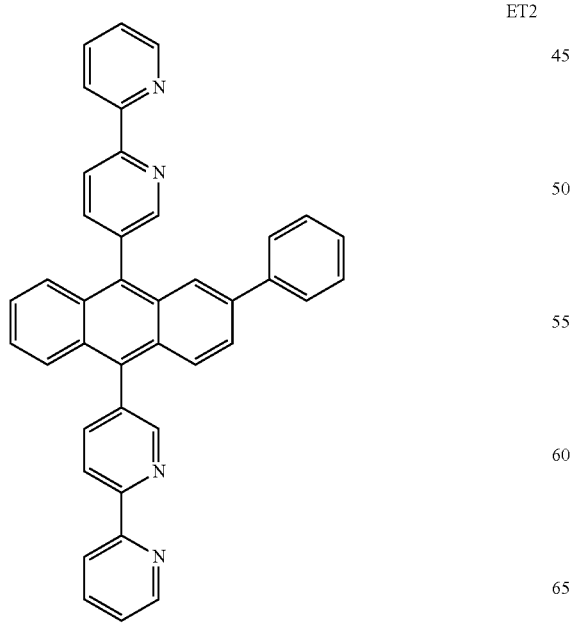

ET3

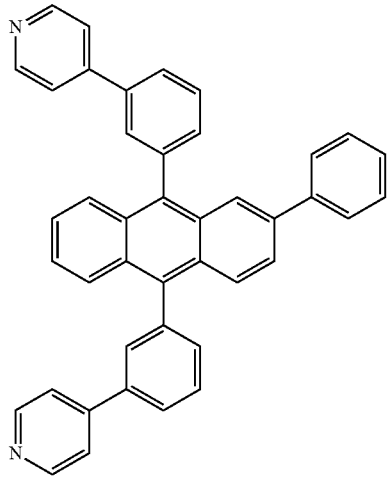

ET4

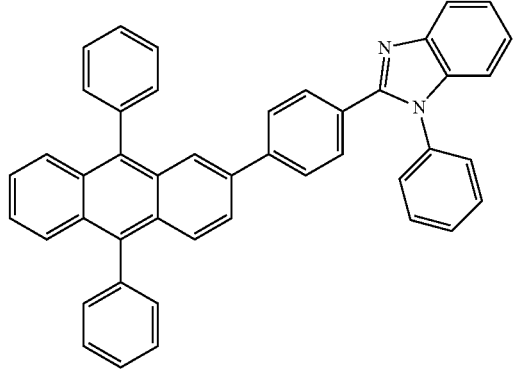

ET5

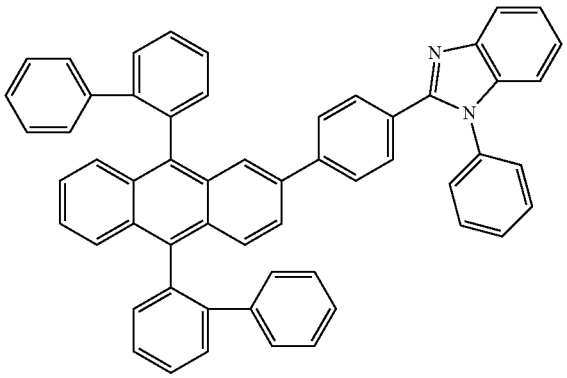

ET6
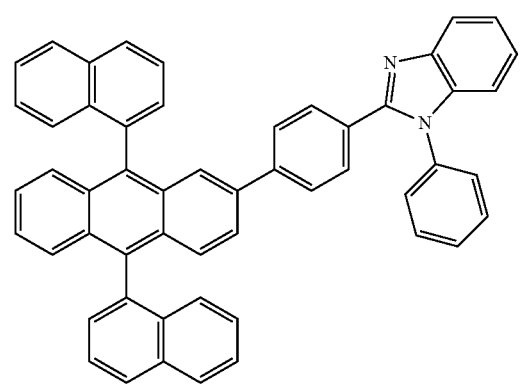
ET9
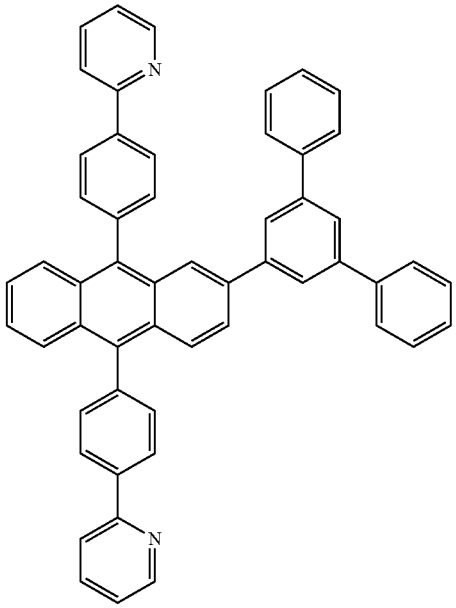
ET7
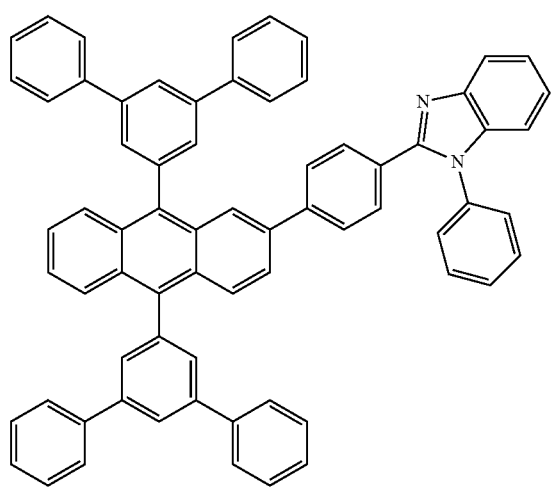
ET8
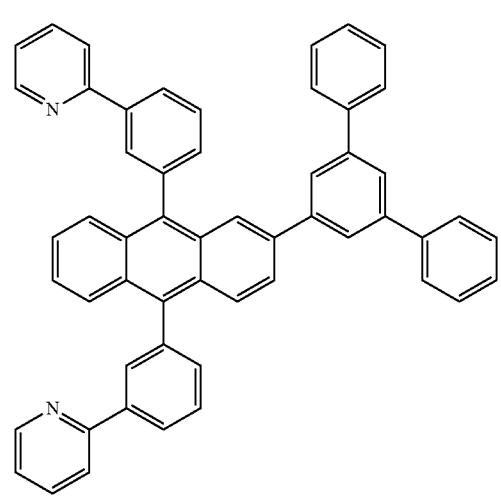
ET10
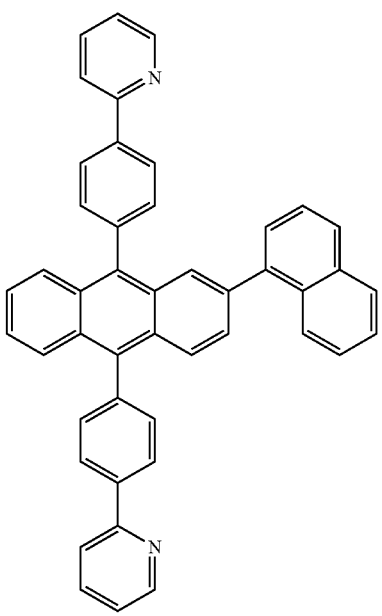

ET11
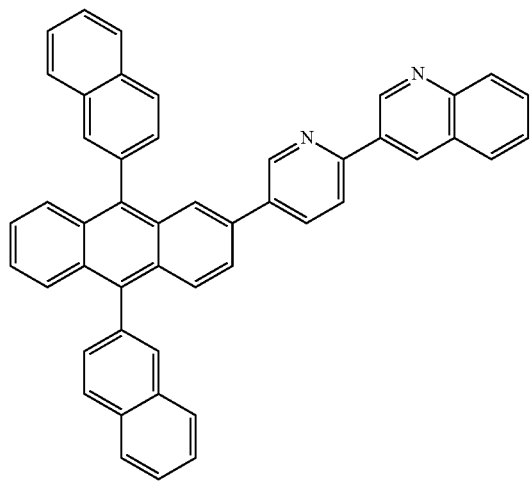
ET14
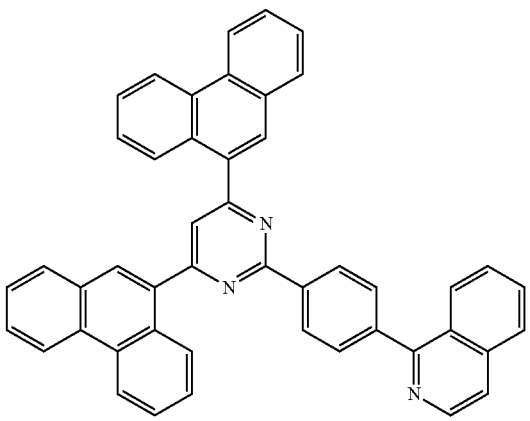
ET12
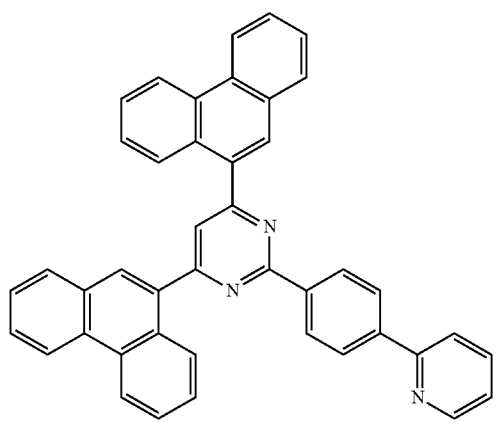
ET15
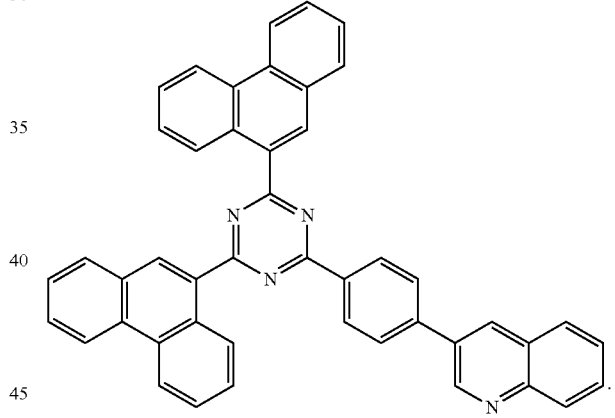
In some embodiments, the electron transport layer may include at least one selected from BCP, Bphen, Alq₃, BAlq, TAZ, and NTAZ:
ET13
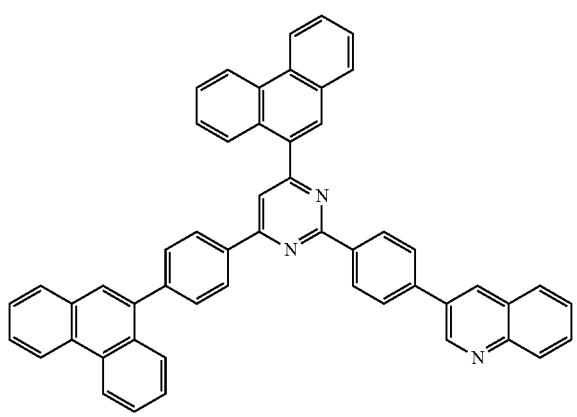
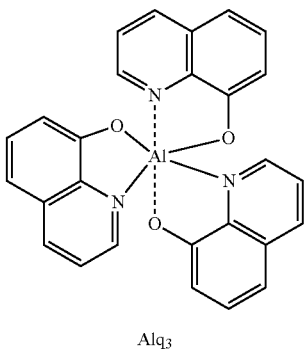
Alq₃

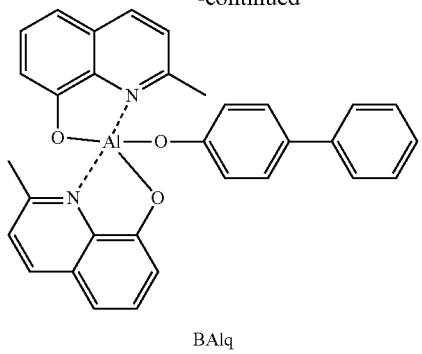

BAlq

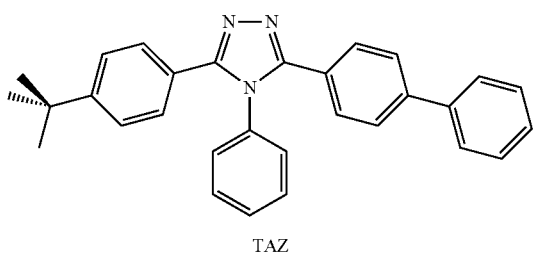

TAZ

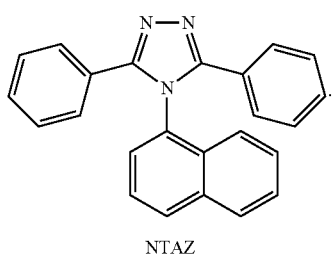

NTAZ

The thickness of the electron transport layer may be in a range of about 100 Å to about 1,000 Å, and in some embodiments, about 150 Å to about 500 Å. When the thickness of the electron transport layer is within any of these ranges, excellent (or suitable) electron transport characteristics may be achieved without a substantial increase in driving voltage.

The electron transport layer may further include a metal-containing material, in addition to the materials described above.

The metal-containing material may include a Li complex. The Li complex may include, for example, Compound ET-D1 (lithium quinolate, LiQ) and/or Compound ET-D2:

ET-D1

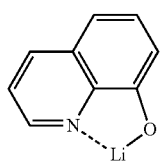

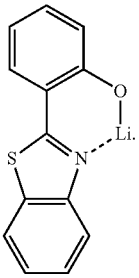

ET-D2

The electron transport region may include an electron injection layer that facilitates electron injection from the second electrode 190.

The electron injection layer may include at least one selected from LiF, NaCl, CsF, $Li_2O$, BaO, and LiQ.

The thickness of the electron injection layer may be in a range of about 1 Å to about 100 Å, and in some embodiments, about 3 Å to about 90 Å. When the thickness of the electron injection layer is within any of these ranges, excellent (or suitable) electron injection characteristics may be achieved without a substantial increase in driving voltage.

The second electrode 190 may be positioned on the electron transport region 170. The second electrode 190 may be a cathode, for example, which is an electron injection electrode. In this regard, a material for forming the second electrode 190 may be a material having a low work function, for example, a metal, an alloy, an electrically conductive compound, or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode or a transmissive electrode.

Hereinafter, a method of manufacturing an organic light-emitting device will be described.

The method of manufacturing an organic light-emitting device may include preparing a substrate; forming a first electrode over (e.g., on) the substrate; forming a hole transport region including at least one copolymer selected from a first copolymer of a first compound and a second compound and a second copolymer of a third compound and a fourth compound over the first electrode, wherein the first compound and the second compound may be each independently selected from compounds represented by Formula 1, and the third compound and the fourth compound may be each independently selected from compounds represented by Formula 2; forming an emission layer over the hole transport region; forming an electron transport region including an electron auxiliary layer including a metal oxide over the emission layer; and forming a second electrode over the electron transport region.

According to an embodiment, the forming of the hole transport region may include providing a first copolymer-forming composition including the first compound and the second compound over the first electrode; and exposing the first copolymer-forming composition to form the first copolymer.

The providing of a first copolymer-forming composition including the first compound and the second compound over the first electrode may include preparing a first copolymer-forming composition including a first compound and a second compound; and coating the first copolymer-forming composition on the first electrode.

According to an embodiment, the first copolymer-forming composition may further include an organic solvent. In some embodiments, the organic solvent may be selected from benzene, toluene, and chlorobenzene, but embodiments of the present disclosure are not limited thereto.

According to an embodiment, the coating of the first copolymer-forming composition on the first electrode may be carried out using a wet process. In some embodiments, the coating of the first copolymer-forming composition on the first electrode may be carried out by spin coating, ink-jet printing, screen printing, dipping coating, doctor-blading, and/or laser-induced thermal imaging (LITI), but embodiments are not limited thereto.

The exposing of the first copolymer-forming composition may be performed by irradiation of light (e.g., by irradiating the first copolymer-forming composition with light) having an intensity in a range of about 1 W to about 500 W and a wavelength in a range of about 250 nm to about 350 nm.

According to an embodiment, the forming of the hole transport region may include providing a second copolymer-forming composition including the third compound and the fourth compound over the first electrode; and heat-treating the second copolymer-forming composition to form the second copolymer.

The providing of a second copolymer-forming composition including the third compound and the fourth compound over the first electrode may include preparing a second copolymer-forming composition including a third compound and a fourth compound; and coating the second copolymer-forming composition on the first electrode.

According to an embodiment, the second copolymer-forming composition may further include an organic solvent. In some embodiments, the organic solvent may be selected from benzene, toluene, and chlorobenzene, but embodiments are not limited thereto.

According to an embodiment, the coating of the second copolymer-forming composition on the first electrode may be carried out using a wet process. In some embodiments, the coating of the first copolymer-forming composition on the first electrode may be carried out by spin coating, ink-jet printing, screen printing, dipping coating, doctor-blading, and/or LITI, but embodiments are not limited thereto.

The heat-treating of the second copolymer-forming composition to form the second copolymer may be carried out in a temperature in a range of about 80° C. to about 220° C., but embodiments are not limited thereto.

According to an embodiment, the hole transport layer may include a first hole transport layer, and a second hole transport layer between the emission layer and the first hole transport layer.

The forming of the hole transport region may include forming the first hole transport layer by providing the first copolymer-forming composition including the first compound and the second compound over the first electrode and exposing the first copolymer-forming composition to form the first copolymer; and forming the second hole transport layer by providing the second copolymer-forming composition including the third compound and the fourth compound over the first hole transport layer and heat-treating the second copolymer-forming composition to form the second copolymer.

In some embodiments, the hole transport layer may include a first hole transport layer, and a second hole transport layer between the emission layer and the first hole transport layer; and the forming of the hole transport region may include forming the first hole transport layer by providing the second copolymer-forming composition including the third compound and the fourth compound over the first electrode and heat-treating the second copolymer-forming composition to form the second copolymer, and forming the second hole transport layer by providing the first copolymer-forming composition including the first compound and the second compound over the first hole transport layer and exposing the first copolymer-forming composition to form the first copolymer.

When the hole transport region includes a hole transport layer, and a hole injection layer between the first electrode and the hole transport layer, the hole injection layer may be formed on the first electrode 110 by using one or more suitable methods, such as vacuum deposition, spin coating, casting, Langmuir-Blodgett (LB) method, ink-jet printing, laser-printing, and/or LITI.

When the hole injection layer is formed by vacuum-deposition, for example, the vacuum-deposition may be performed at a deposition temperature of about 100° C. to about 500° C., at a vacuum degree of about $10^{-8}$ Torr to about $10^{-3}$ Torr, and at a vacuum-deposition rate in a range of about 0.01 Å/sec to about 100 Å/sec, in consideration of a compound for forming the hole injection layer to be deposited, and the structure of the hole injection layer to be formed.

When a hole injection layer is formed by spin coating, for example, the spin coating may be performed at a coating rate of about 2,000 revolutions per minute (rpm) to about 5,000 rpm, and at a temperature of about 80° C. to 200° C., by taking into account a compound for forming the hole injection layer to be deposited and the structure of the hole injection layer to be formed.

An emission layer may be formed over the first electrode 110 or the hole transport region by using one or more suitable methods, such as vacuum deposition, spin coating, casting, an LB method, ink-jet printing, laser printing, and/or LITI. When the emission layer is formed by vacuum deposition and/or spin coating, deposition and coating conditions for the emission layer may be similar to the deposition and coating conditions for the hole injection layer.

The forming of the electron transport region may include forming an electron auxiliary layer by coating an electron auxiliary layer-forming composition including metal oxide nanoparticles over the emission layer.

The coating of the electron auxiliary layer-forming composition including the metal oxide nanoparticles may include preparing the electron auxiliary layer-forming composition including the metal oxide nanoparticles; and coating the electron auxiliary layer-forming composition on the emission layer.

According to an embodiment, the coating of the electron auxiliary layer-form ing composition on the emission layer may be carried out using a wet process. In some embodiments, the coating of the electron auxiliary layer-forming composition on the emission layer may be carried out by spin coating, ink-jet printing, screen printing, dipping coating, doctor-blading, and/or LITI, but embodiments are not limited thereto.

According to an embodiment, the electron transport region may include an electron transport layer and an electron injection layer,
wherein the forming of the electron transport region may include forming the electron transport layer and the electron injection layer by vacuum-deposition.

When the electron transport layer and the electron injection layer are formed by vacuum-deposition, for example, the vacuum-deposition may be performed at a deposition temperature of about 100° C. to about 500° C., at a vacuum degree of about $10^{-8}$ Torr to about $10^{-3}$ Torr, and at a vacuum-deposition rate in a range of about 0.01 Å/sec to about 100 Å/sec, in consideration of compounds for forming the electron transport layer and the electron injection layer to be deposited, and the structure of the electron transport layer and the electron injection layer to be formed.

Hereinbefore the organic light-emitting device 10 and the method of manufacturing the same have been described with reference to the drawing, but embodiments of the present disclosure are not limited thereto.

The term "$C_1$-$C_{60}$ alkyl group" used herein may refer to a linear or branched aliphatic hydrocarbon monovalent group having 1 to 60 carbon atoms, and non-limiting examples thereof are a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein may refer to a divalent group having the same structure as the $C_1$-$C_{60}$ alkyl group.

The term "$C_1$-$C_{60}$ alkoxy group" as used herein may refer to a monovalent group represented by -$OA_{101}$ (where $A_{101}$ is the $C_1$-$C_{60}$ alkyl group). Non-limiting examples thereof may include a methoxy group, an ethoxy group, and an isopropoxy group.

The term "$C_2$-$C_{60}$ alkenyl group" as used herein may refer to a hydrocarbon group having at least one carbon-carbon double bond at one or more positions along the hydrocarbon chain of the $C_2$-$C_{60}$ alkyl group (e.g., in the middle or at either terminus of the $C_2$-$C_{60}$ alkyl group). Non-limiting examples thereof may include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon-carbon triple bond at one or more positions along the hydrocarbon chain of the $C_2$-$C_{60}$ alkyl group (e.g., in the middle or at either terminus of the $C_2$-$C_{60}$ alkyl group. Non-limiting examples thereof may include an ethynyl group and a propynyl group. The term "$C_2$-$C_{60}$ alkynylene group" as used herein may refer to a divalent group having the same structure as the $C_2$-$C_{60}$ alkynyl group.

The term "$C_3$-$C_{10}$ cycloalkyl group" as used herein may refer to a monovalent monocyclic saturated hydrocarbon group including 3 to 10 carbon atoms. Non-limiting examples thereof may include a cyclopropyl group, a cyclobutyl group, a cyclopentyl group, a cyclohexyl group, and a cycloheptyl group. The term "$C_3$-$C_{10}$ cycloalkylene" group as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group including at least one heteroatom selected from N, O, Si, P, and S as a ring-forming atom, and 1 to 10 carbon atoms. Non-limiting examples thereof may include a tetrahydrofuranyl group and a tetrahydrothiophenyl group. The term "$C_1$-$C_{10}$ heterocycloalkylene group" as used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms and at least one double bond in its ring, and is not aromatic. Non-limiting examples thereof may include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group including at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group" as used herein may refer to a divalent group having the same structure as the $C_1$-$C_{10}$ heterocycloalkenyl group.

The term "$C_6$-$C_{60}$ aryl group" as used herein may refer to a monovalent group including a carbocyclic aromatic system having 6 to 60 carbon atoms. The term "$C_6$-$C_{60}$ arylene group" used herein may refer to a divalent group including a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include a plurality of rings, the respective plurality of rings may be fused to each other.

The term "$C_1$-$C_{60}$ heteroaryl group" as used herein may refer to a monovalent group having a carbocyclic aromatic system including at least one heteroatom selected from N, O, Si, P, and S as a ring-forming atom, and 1 to 60 carbon atoms. The term "$C_1$-$C_{60}$ heteroarylene group" as used herein may refer to a divalent group having a carbocyclic aromatic system including at least one heteroatom selected from N, O, P, and S as a ring-forming atom, and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include a plurality of rings, the respective plurality of rings may be fused to each other.

The term "$C_6$-$C_{60}$ aryloxy group" as used herein may refer to a monovalent group represented by -$OA_{102}$ (where $A_{102}$ is the $C_6$-$C_{60}$ aryl group). The term "$C_6$-$C_{60}$ arylthio group" as used herein may refer to a monovalent group represented by -$SA_{103}$ (where $A_{103}$ is the $C_6$-$C_{60}$ aryl group).

The term "monovalent non-aromatic condensed polycyclic group" as used herein may refer to a monovalent group that has two or more rings condensed (e.g., fused) to each other, and has only carbon atoms as ring-forming atoms (e.g., the number of carbon atoms may be in a range of 8 to 60), wherein the molecular structure as a whole is non-aromatic (e.g., does not have overall aromaticity). A non-limiting example of the monovalent non-aromatic condensed polycyclic group may include a fluorenyl group. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group that has two or more rings condensed (e.g., fused) to each other, has at least one heteroatom selected from N, O, Si, P, and S, other than carbon atoms (e.g., the number of carbon atoms may be in a range of 2 to 60), as ring-forming atoms, wherein the molecular structure as a whole is non-aromatic (e.g., does not have overall aromaticity). The monovalent non-aromatic condensed heteropolycyclic group includes a carbazolyl group. The term "divalent non-aromatic condensed heteropolycyclic group" as used herein may refer to a divalent group having the same structure as the monovalent non-aromatic condensed heteropolycyclic group.

In the present specification, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group and —Si($Q_{11}$)($Q_{12}$)($Q_{13}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$), and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

"Ph" used herein may refer to a phenyl group. "Me" may refer to a methyl group. "Et" may refer to an ethyl group. "Ter-Bu" or "Bu$^t$" may refer to a tert-butyl group. "D" may refer to deuterium.

Hereinafter an organic light-emitting device and a method of manufacturing the same according to one or more embodiments of the present disclosure will be described in more detail with reference to Synthesis Examples and Examples. The expression "B was used instead of A" used in describing Examples may refer to a molar equivalent of A being identical to a molar equivalent of B.

EXAMPLES

Example 1

A 15 Ohms per square centimeter ($\Omega/cm^2$) (1,200 Å (Angstroms)) ITO glass substrate (available from Corning Inc.) was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

A PEDOT:PSS (available from Clevios™, P VP AI4083) solution was spin-coated on the resulting ITO anode of the glass substrate to form a hole injection layer having a thickness of about 320 Å. Compound HTa-1, Compound HTa-2, and chlorobenzene were mixed at a weight ratio of about 1:1:98 to prepare a first copolymer-forming composition. The first copolymer-forming composition was spin-coated on the hole injection layer at a coating rate of about 3,000 revolutions per minute (rpm) for about 40 seconds. Then, ultraviolet rays having an intensity of about 2 mW/cm$^2$ and a wavelength of about 254 nm were irradiated thereon for about 5 minutes to form a first copolymer, thereby forming a hole transport layer having a thickness of about 300 Å.

Subsequently, PVK:PBD (as a host), Ir(ppy)$_3$ (as a dopant), and chlorobenzene were mixed at a weight ratio of about 1:1.5:0.25. Then, purification process was carried out using a 0.2 µm PTPE syringe filter to thereby prepare an emission layer-forming composition. The emission layer-forming composition was spin-coated on the hole transport layer at a coating rate of about 2,000 rpm for about 40 seconds, thereby forming an emission layer having a thickness of about 900 Å. Then, heat-treating was performed thereon on a hot plate at about 100° C. for about 30 minutes to remove the residual chlorobenzene.

Subsequently, zinc oxide nanoparticles and 1-butanol were mixed at a weight ratio of about 2:98 to prepare an electron auxiliary layer-forming composition. The electron auxiliary layer-forming composition was spin-coated on the emission layer at a coating rate of about 2,000 rpm for about 40 seconds, thereby forming an electron auxiliary layer having a thickness of about 10 Å.

Alq$_3$ was vacuum-deposited on the electron auxiliary layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 1,000 Å, thereby completing the manufacture of an organic light-emitting device.

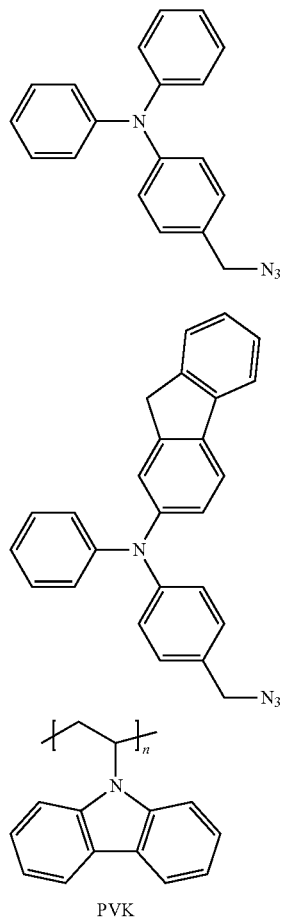

PVK

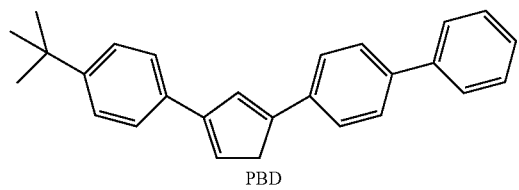

PBD

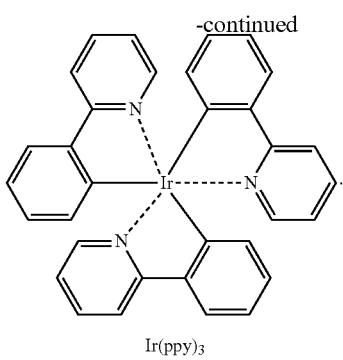

Ir(ppy)$_3$

Example 2

A 15 Ω/cm² (1,200 Å) ITO glass substrate (available from Corning Inc.) was cut to a size of 50 mm×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

A PEDOT:PSS (available from Clevios™, P VP AI4083) solution was spin-coated on the resulting ITO anode of the glass substrate to form a hole injection layer having a thickness of about 320 Å. Then, Compound HTb-1, Compound HTb-3, and chlorobenzene were mixed at a weight ratio of about 1:0.5:98.5 to prepare a second copolymer-forming composition. The second copolymer-forming composition was spin-coated on the hole injection layer at a coating rate of about 3,000 rpm for about 40 seconds. Then, heat-treating was performed thereon in a nitrogen atmosphere at a temperature in a range of about 200° C. to about 250° C. for about 3 hours to 4 hours to form a second copolymer, thereby forming a hole transport layer having a thickness of about 300 Å.

Subsequently, PVK, PBD (as a host), Ir(ppy)$_3$ (as a dopant), and chlorobenzene were mixed at a weight ratio of about 2:1:97. Then, purification process was carried out using a 0.2 μm PTPE syringe filter to thereby prepare an emission layer-forming composition. The emission layer-forming composition was spin-coated on the hole transport layer at a coating rate of about 2,000 rpm for about 40 seconds, thereby forming an emission layer having a thickness of about 900 Å. Then, heat-treating was performed thereon on a hot plate at about 100° C. for about 30 minutes to remove the residual chlorobenzene.

Subsequently, zinc oxide nanoparticles and 1-butanol were mixed at a weight ratio of about 2:98 to prepare an electron auxiliary layer-forming composition. The electron auxiliary layer-forming composition was spin-coated on the emission layer at a coating rate of about 2,000 rpm for about 40 seconds, thereby forming an electron auxiliary layer having a thickness of about 10 Å.

Alq$_3$ was vacuum-deposited on the electron auxiliary layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 1,000 Å, thereby completing the manufacture of an organic light-emitting device.

HTb-1

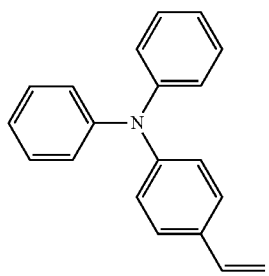

HTb-3

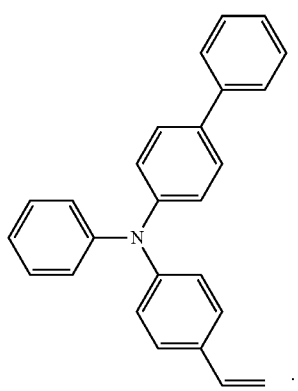

Comparative Example 1

An organic light-emitting device was manufactured in the same (or substantially the same) manner as in Example 1, except that Copolymer A was used as a hole transport layer material instead of the first copolymer, and an electron auxiliary layer was not formed.

Copolymer A

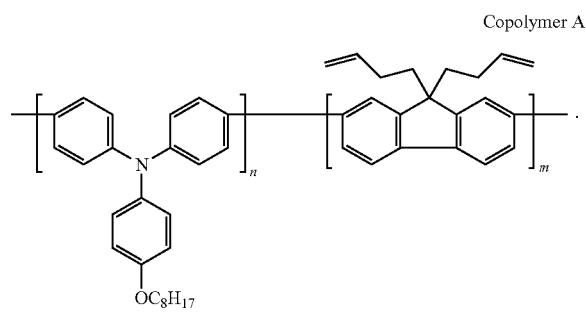

(n:m=83:17, $M_n$=45,000, $M_w$=81,000).

Evaluation Example 1

The driving voltage, current density, efficiency, and color-coordination of the organic light-emitting devices manufactured in Example 1 and 2 and Comparative Example 1 were measured by using a Keithley 236 source-measure unit (SMU) and a PR650 luminance meter. The results thereof are shown in Table 1.

TABLE 1

| | Hole transport layer | Driving voltage (V) | Current density (mA/cm$^2$) | Efficiency (cd/A) | Color-coordinate CIEx | CIEy |
|---|---|---|---|---|---|---|
| Example 1 | First copolymer | 6.8 | 10.2 | 85 | 0.254 | 0.705 |
| Example 2 | Second copolymer | 7.0 | 12.1 | 72 | 0.265 | 0.696 |
| Comparative Example 1 | Copolymer A | 7.5 | 13.6 | 66 | 0.199 | 0.726 |

Example 3

A 15 Ω/cm$^2$ (1,200 Å) ITO glass substrate (available from Corning Inc.) was cut to a size of 50 mm×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

A PEDOT:PSS (available from Clevios™, P VP AI4083) solution was spin-coated on the resulting ITO anode of the glass substrate to form a hole injection layer having a thickness of about 320 Å. Compound HTa-1, Compound HTa-2, and chlorobenzene were mixed at a weight ratio of about 1:1:98 to prepare a first copolymer-forming composition. The first copolymer-forming composition was spin-coated on the hole injection layer at a coating rate of about 3,000 rpm for about 40 seconds. Then, ultraviolet rays having an intensity of about 2 mW/cm$^2$ and a wavelength of about 254 nm were irradiated thereon for about 5 minutes to form a first copolymer, thereby forming a first hole transport layer having a thickness of about 300 Å.

Then, Compound HTb-1, Compound HTb-3, and chlorobenzene were mixed at a weight ratio of about 2:1:97 to prepare a second copolymer-forming composition. The second copolymer-forming composition was spin-coated on the first hole transport layer at a coating rate of about 3,000 rpm for about 40 seconds. Then, heat-treating was performed thereon in a nitrogen atmosphere at a temperature in a range of about 200° C. to about 250° C. for about 3 hours to 4 hours to form a second copolymer, thereby forming a second hole transport layer having a thickness of about 300 Å.

Subsequently, PVK, PBD (as a host), Ir(ppy)$_3$ (as a dopant), and chlorobenzene were mixed at a weight ratio of about 1:0.5:98.5. Then, purification process was carried out using a 0.2 μm PTPE syringe filter to thereby prepare an emission layer-forming composition. The emission layer-forming composition was spin-coated on the hole transport layer at a coating rate of about 2,000 rpm for about 40 seconds, thereby forming an emission layer having a thickness of about 900 Å. Then, heat-treating was performed thereon on a hot plate at about 100° C. for about 30 minutes to remove the residual chlorobenzene.

Subsequently, zinc oxide nanoparticles and 1-butanol were mixed at a weight ratio of about 2:98 to prepare an electron auxiliary layer-forming composition. The electron auxiliary layer-forming composition was spin-coated on the emission layer at a coating rate of about 2,000 rpm for about 40 seconds, thereby forming an electron auxiliary layer having a thickness of about 10 Å.

Alq$_3$ was vacuum-deposited on the electron auxiliary layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 1,000 Å, thereby completing the manufacture of an organic light-emitting device.

Example 4

A 15 Ω/cm² (1,200 Å) ITO glass substrate (available from Corning Inc.) was cut to a size of 50 mm×50 mm×0.7 mm, sonicated in isopropyl alcohol and pure water, for 5 minutes in each solvent, cleaned with ultraviolet rays for 30 minutes, and then ozone, and was mounted on a vacuum deposition apparatus.

A PEDOT:PSS (available from Clevios™, P VP AI4083) solution was spin-coated on the resulting ITO anode of the glass substrate to form a hole injection layer having a thickness of about 320 Å. Then, Compound HTb-1, Compound HTb-3, and chlorobenzene were mixed at a weight ratio of about 2:1:97 to prepare a second copolymer-forming composition. The second copolymer-forming composition was spin-coated on the hole injection layer at a coating rate of about 3,000 rpm for about 40 seconds. Then, heat-treating was performed thereon in a nitrogen atmosphere at a temperature in a range of about 200° C. to about 250° C. for about 3 hours to 4 hours to form a second copolymer, thereby forming a first hole transport layer having a thickness of about 300 Å.

Compound HTa-1, Compound HTa-2, and chlorobenzene were mixed at a weight ratio of about 1:1:98 to prepare a first copolymer-forming composition. The first copolymer-forming composition was spin-coated on the first hole transport layer at a coating rate of about 3,000 rpm for about 40 seconds. Then, ultraviolet rays having an intensity of about 2 mW/cm² and a wavelength of about 254 nm were irradiated thereon for about 5 minutes to form a first copolymer, thereby forming a second hole transport layer having a thickness of about 300 Å.

Subsequently, PVK:PBD (as a host), Ir(ppy)$_3$ (as a dopant), and chlorobenzene were mixed at a weight ratio of about 1:2:97. Then, purification process was carried out using a 0.2 μm PTPE syringe filter to thereby prepare an emission layer-forming composition. The emission layer-forming composition was spin-coated on the hole transport layer at a coating rate of about 2,000 rpm for about 40 seconds, thereby forming an emission layer having a thickness of about 900 Å. Then, heat-treating was performed thereon on a hot plate at about 100° C. for about 30 minutes to remove the residual chlorobenzene.

Subsequently, zinc oxide nanoparticles and 1-butanol were mixed at a weight ratio of about 2:98 to prepare an electron auxiliary layer-forming composition. The electron auxiliary layer-forming composition was spin-coated on the emission layer at a coating rate of about 2,000 rpm for about 40 seconds, thereby forming an electron auxiliary layer having a thickness of about 10 Å.

Alq$_3$ was vacuum-deposited on the electron auxiliary layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 1,000 Å, thereby completing the manufacture of an organic light-emitting device.

Evaluation Example 2

The driving voltage, current density, efficiency, and color-coordination of the organic light-emitting devices manufactured in Examples 3 and 4 were measured by using a Keithley 236 SMU and a PR650 luminance meter. The results thereof are shown in Table 2.

TABLE 2

| | Hole transport layer | | Driving | Current | | Color-coordinate | |
|---|---|---|---|---|---|---|---|
| | First hole transport layer | Second hole transport layer | voltage (V) | density (mA/cm²) | Efficiency (cd/A) | CIEx | CIEy |
| Example 3 | First copolymer | Second copolymer | 6.8 | 14.1 | 72 | 0.287 | 0.688 |
| Example 4 | Second copolymer | First copolymer | 6.6 | 12.4 | 82 | 0.301 | 0.703 |

Referring to the results shown in Tables 1 and 2, it was found that the organic light-emitting devices prepared in Examples 1 to 4 exhibited low driving voltage and high efficiency, as compared with the organic light-emitting device prepared in Comparative Example 1.

As described above, according to an embodiment, an organic light-emitting device may have high efficiency and long lifespan.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" or "over" another element, it can be directly on the other element or intervening elements may also be present. In contrast, when an element is referred to as being "directly on" or "directly contacting" another element, there are no intervening elements present.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the drawing, it will be understood by those of ordinary skill in the art that various changes in form and details may be made therein without departing from the spirit and scope of the present disclosure as defined by the following claims and equivalents thereof.

What is claimed is:
1. An organic light-emitting device comprising:
a first electrode;
a second electrode facing the first electrode;
an emission layer between the first electrode and the second electrode;
a hole transport region between the first electrode and the emission layer; and
an electron transport region between the emission layer and the second electrode, the electron transport region comprising an electron auxiliary layer which comprises a metal oxide,
wherein the hole transport region comprises at least one copolymer selected from i) a first copolymer of a first compound and a second compound and ii) a second copolymer of a third compound and a fourth compound,
wherein
the first compound and the second compound are each independently selected from Compounds HTa-1 to HTa-7, and/or
the third compound and the fourth compound are each independently selected from Compounds HTb-1 to HTb-7,
wherein the third compound and the fourth compound having different molecular formulae from each other, and
wherein Compounds HTa-1 to HTa-7 and Compounds HTb-1 to HTb-7 are represented by the following formulae:

HTa-1

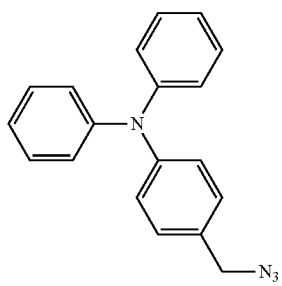

HTa-2

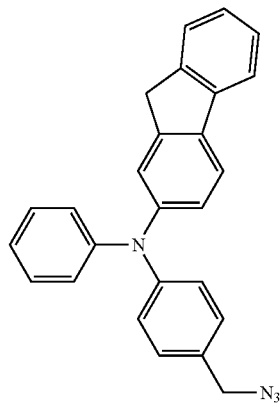

HTa-3

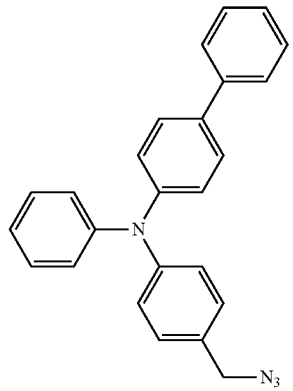

HTa-4

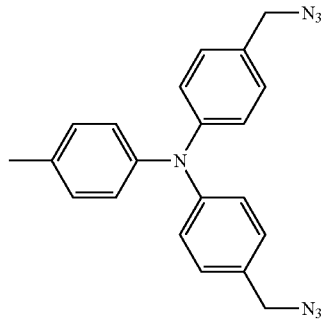

HTa-5

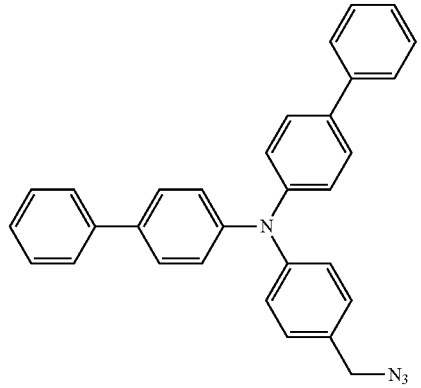

HTa-6
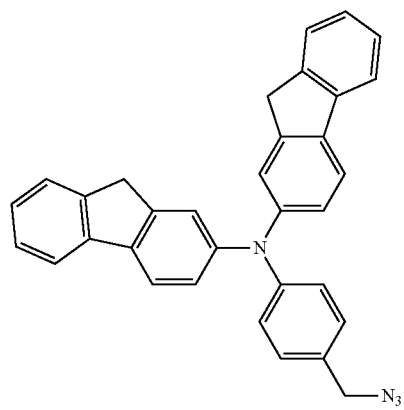
HTa-7
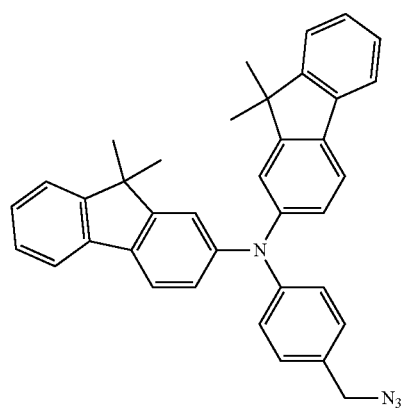
HTb-1
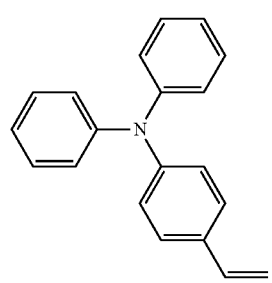
HTb-2
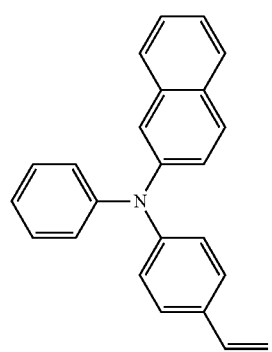
HTb-3
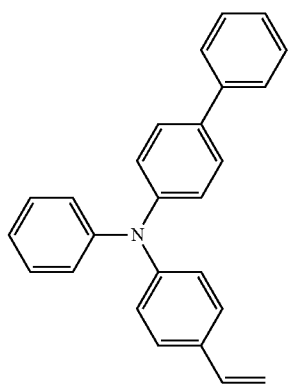
HTb-4
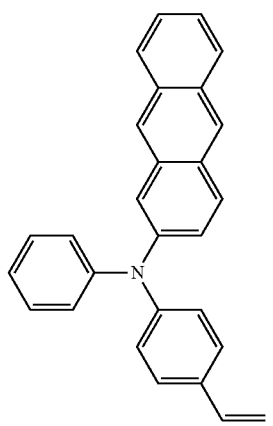
HTb-5
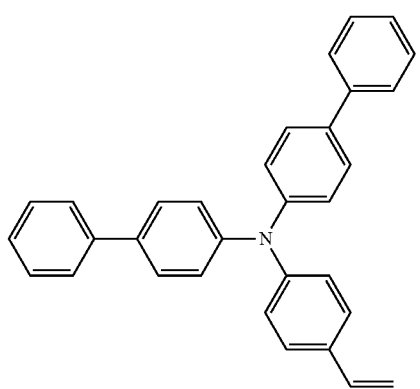
HTb-6
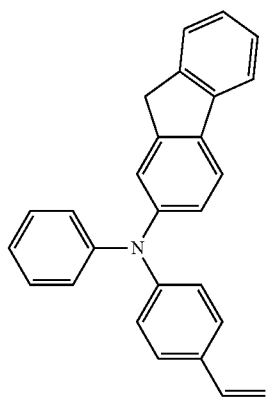

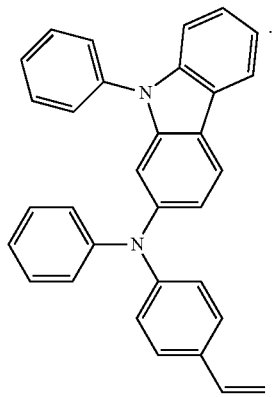

HTb-7

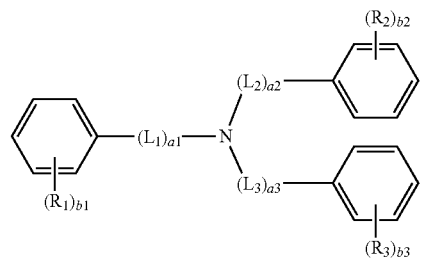

Formula 1

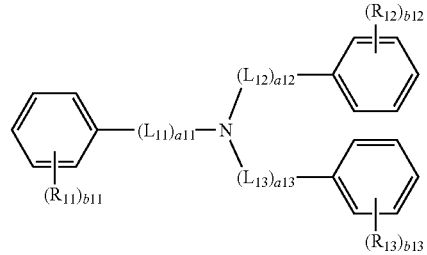

Formula 2

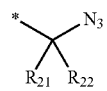

Formula A

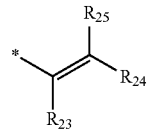

Formula B

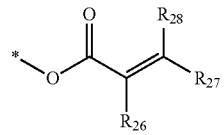

Formula C

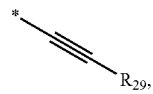

Formula D

2. The organic light-emitting device of claim 1, wherein the hole transport region comprises a hole transport layer, and a hole injection layer between the first electrode and the hole transport layer, and the hole transport layer comprises at least one selected from the first copolymer and the second copolymer.

3. The organic light-emitting device of claim 1, wherein the hole transport region comprises a hole transport layer, and a hole injection layer between the first electrode and the hole transport layer, and the hole transport layer comprises a first hole transport layer, and a second hole transport layer between the emission layer and the first hole transport layer.

4. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, the electron transport region comprising an electron auxiliary layer which comprises a metal oxide, wherein the hole transport region comprises a hole transport layer, and a hole injection layer between the first electrode and the hole transport layer, and the hole transport layer comprises a first hole transport layer, and a second hole transport layer between the emission layer and the first hole transport layer, and wherein the first hole transport layer comprises a first copolymer of a first compound and a second compound, and the second hole transport layer comprises a second copolymer of a third compound and a fourth compound, or the second copolymer is comprised in the first hole transport layer, and the first copolymer is comprised in the second hole transport layer, wherein the first compound and the second compound are each independently selected from compounds represented by Formula 1, and the third compound and the fourth compound are each independently selected from compounds represented by Formula 2 wherein, in Formulae 1, 2, and A to D:

$L_1$ to $L_3$ and $L_{11}$ to $L_{13}$ are each independently selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 to a3 and a11 to a13 are each independently an integer selected from 0 to 3;

$R_1$ to $R_3$, $R_{11}$ to $R_{13}$, and $R_{21}$ to $R_{29}$ are each independently selected from groups represented by Formulae A to D, hydrogen, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

b1 to b3 and b11 to b13 are each independently an integer selected from 1 to 5, wherein when b1 is 2 or more, a plurality of $R_1$(s) are optionally linked to form a saturated or unsaturated ring, when b2 is 2 or more, a plurality of $R_2$(s) are optionally linked to form a saturated or unsaturated ring, when b3 is 2 or more, a plurality of $R_3$(s) are optionally linked to form a saturated or unsaturated ring, when b11 is 2 or more, a plurality of $R_{11}$(s) are optionally linked to form a saturated or unsaturated ring, when b12 is 2 or more, a plurality of $R_{12}$(s) are optionally linked to form a saturated or unsaturated ring, and when b13 is 2 or more, a plurality of $R_{13}$(s) are optionally linked to form a saturated or unsaturated ring;

at least one selected from $R_1$ to $R_3$ is a group represented by Formula A, at least one selected from $R_{11}$ to $R_{13}$ is a group represented by one of Formulae B to D; and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, or substituted monovalent non-aromatic condensed heteropolycyclic group, if present, is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), —B($Q_{16}$)($Q_{17}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$), and —Si($Q_{31}$)($Q_{32}$)($Q_{33}$), —N($Q_{34}$)($Q_{35}$) and —B($Q_{36}$)($Q_{37}$), wherein $Q_1$ to $Q_3$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

5. The organic light-emitting device of claim 1, wherein the metal oxide is selected from zinc oxide (ZnO), zinc-tin oxide (ZTO), gallium-indium-zinc-zirconium oxide (ZTOZr), indium zinc oxide (IZO), and gallium-indium-zinc oxide (GIZO).

6. The organic light-emitting device of claim 1, wherein the electron auxiliary layer directly contacts the emission layer, and the electron transport region further comprises an electron transport layer and an electron injection layer, the electron transport layer and the electron injection layer being between the electron auxiliary layer and the second electrode.

7. A method of manufacturing an organic light-emitting device, the method comprising:

preparing a substrate;

forming a first electrode over the substrate;

forming a hole transport region over the first electrode, the hole transport region comprising at least one copolymer selected from i) a first copolymer of a first compound and a second compound and ii) a second copolymer of a third compound and a fourth compound;

forming an emission layer over the hole transport region;

forming an electron transport region over the emission layer, the electron transport region comprising an electron auxiliary layer comprising a metal oxide; and forming a second electrode over the electron transport region, wherein the first compound and the second compound are each independently selected from Compounds HTa-1 to HTa 7 , and/or the third compound and the fourth compound are each independently selected from Compounds HTb-1 to HTb 7 , the third compound and the fourth compound having different molecular formulae from each other, and wherein Compounds HTa-1 to HTa-7 and Compounds HTb-1 to HTb-7 are represented by the following formulae:

HTa-1
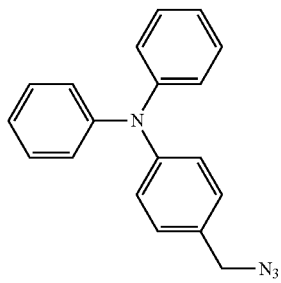

HTa-2
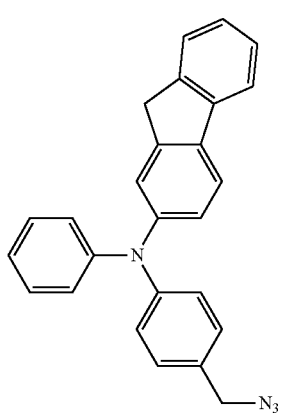

HTa-3
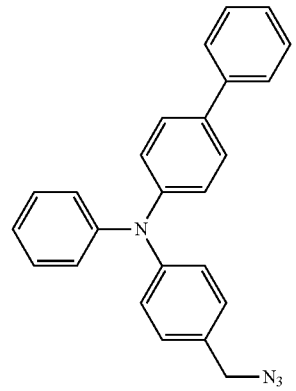

HTa-4
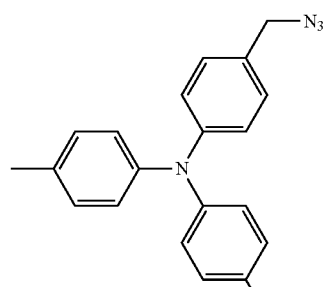

HTa-5
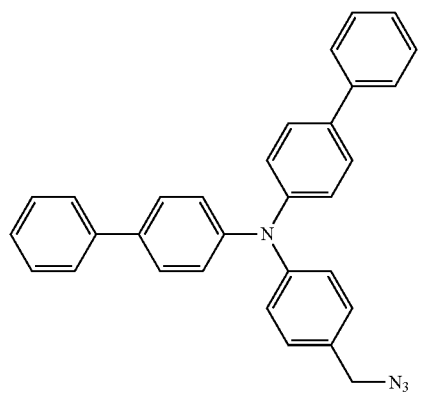

HTa-6
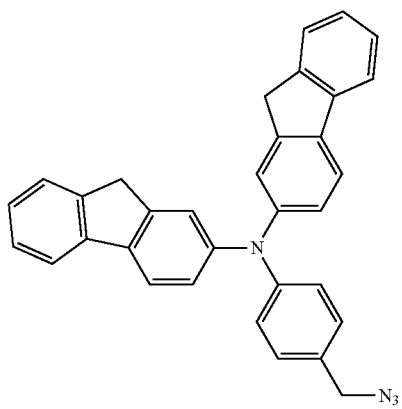

HTa-7
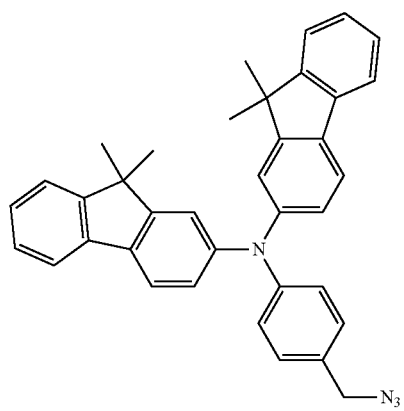
HTb-1
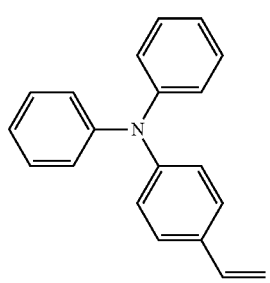
HTb-2
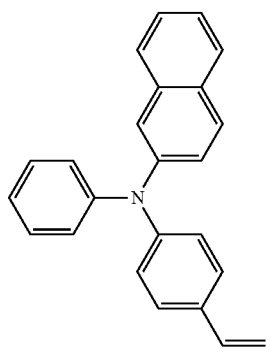
HTb-3
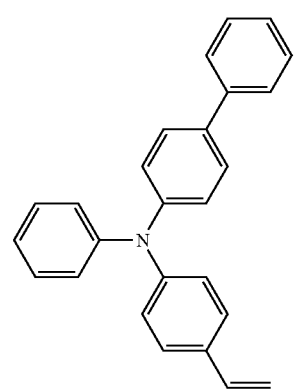
HTb-4
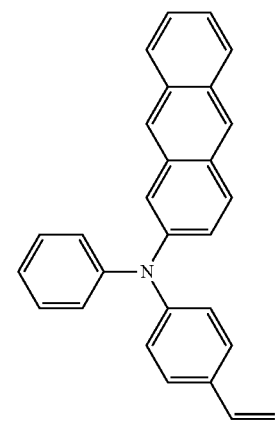
HTb-5
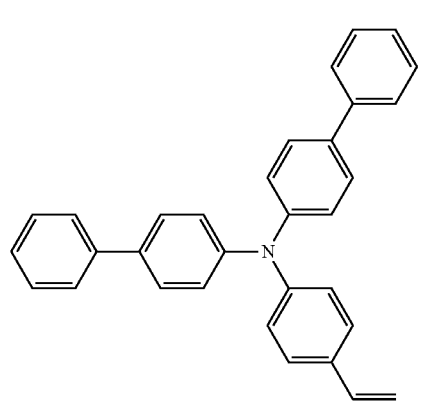
HTb-6
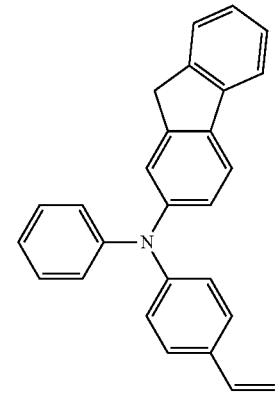
HTb-7

8. The method of claim 7, wherein the forming of the hole transport region comprises:
providing a first copolymer-forming composition over the first electrode, the first copolymer-forming composition comprising the first compound and the second compound; and
exposing the first copolymer-forming composition to irradiation of light to form the first copolymer.

9. The method of claim 8, wherein the exposing of the first copolymer-forming composition is performed by irradiation of light having an intensity in a range of about 1 W to about 500 W and a wavelength in a range of about 250 nm to about 350 nm.

10. The method of claim 7, wherein the forming of the hole transport region comprises:
providing a second copolymer-forming composition over the first electrode, the second copolymer-forming composition comprising the third compound and the fourth compound; and
heat-treating the second copolymer-forming composition to form the second copolymer.

11. The method of claim 10, wherein the heat-treating of the second copolymer-forming composition is carried out at a temperature in a range of about 80° C. to about 220° C.

12. The method of claim 7, wherein the forming of the hole transport region comprises:
forming a first hole transport layer by providing a first copolymer-forming composition over the first electrode, the first copolymer-forming composition comprising the first compound and the second compound, and exposing the first copolymer-forming composition to form the first copolymer; and
forming a second hole transport layer between the emission layer and the first hole transport layer by providing a second copolymer-forming composition over the first hole transport layer, the second copolymer-forming composition comprising the third compound and the fourth compound, and heat-treating the second copolymer-forming composition to form the second copolymer.

13. The method of claim 7, wherein the forming of the hole transport region comprises:
forming a first hole transport layer by providing a second copolymer-forming composition over the first electrode, the second copolymer-forming composition comprising the third compound and the fourth compound, and heat-treating the second copolymer-forming composition to form the second copolymer; and
forming a second hole transport layer by providing a first copolymer-forming composition over the first hole transport layer, the first copolymer-forming composition comprising the first compound and the second compound, and exposing the first copolymer-forming composition to form the first copolymer.

14. The method of claim 7, wherein the forming of the electron transport region comprises forming an electron auxiliary layer by:
coating an electron auxiliary layer-forming composition comprising metal oxide nanoparticles over the emission layer.

15. The method of claim 7, wherein the forming of the electron transport region comprises forming an electron transport layer and an electron injection layer by vacuum-deposition.

* * * * *